(12) United States Patent
Choi et al.

(10) Patent No.: US 11,094,612 B2
(45) Date of Patent: Aug. 17, 2021

(54) SEMICONDUCTOR DEVICES INCLUDING THROUGH-SILICON-VIAS AND METHODS OF MANUFACTURING THE SAME AND SEMICONDUCTOR PACKAGES INCLUDING THE SEMICONDUCTOR DEVICES

(71) Applicant: Samsung Electronics Co., Ltd., Suwon-si (KR)

(72) Inventors: Ju-Il Choi, Seongnam-si (KR); Kwang-Jin Moon, Hwaseong-si (KR); Byung-Lyul Park, Seoul (KR); Jin-Ho An, Seoul (KR); Atsushi Fujisaki, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 531 days.

(21) Appl. No.: 15/936,019

(22) Filed: Mar. 26, 2018

(65) Prior Publication Data
US 2018/0218966 A1 Aug. 2, 2018

Related U.S. Application Data

(63) Continuation of application No. 14/858,572, filed on Sep. 18, 2015, now abandoned.

(30) Foreign Application Priority Data

Sep. 22, 2014 (KR) .................. 10-2014-0126143

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76898* (2013.01); *H01L 24/03* (2013.01);
(Continued)

(58) Field of Classification Search
CPC . H01L 21/76898; H01L 23/481; H01L 24/05; H01L 24/13; H01L 24/16;
(Continued)

(56) References Cited

U.S. PATENT DOCUMENTS

| 7,524,774 B2 | 4/2009 | Sasaki et al. |
| 7,651,961 B2 | 1/2010 | Clark |

(Continued)

FOREIGN PATENT DOCUMENTS

| JP | 2000-332005 | 11/2000 |
| JP | 2005-252031 | 9/2005 |

(Continued)

OTHER PUBLICATIONS

Communication dated Feb. 1, 2021, issued by the Korean Intellectual Property Office in Korean Patent Application No. 10-2014-0126143.

*Primary Examiner* — Marcos D. Pizarro
(74) *Attorney, Agent, or Firm* — Sughrue Mion, PLLC

(57) ABSTRACT

A semiconductor device can include a substrate that has a surface. A via structure can extend through the substrate toward the surface of the substrate, where the via structure includes an upper surface. A pad structure can be on the surface of the substrate, where the pad structure can include a lower surface having at least one protrusion that is configured to protrude toward the upper surface of the via structure.

15 Claims, 74 Drawing Sheets

(51) Int. Cl.
  *H01L 21/768* (2006.01)
  *H01L 23/532* (2006.01)
  *H01L 25/065* (2006.01)
  *H01L 25/18* (2006.01)

(52) U.S. Cl.
  CPC .............. *H01L 24/05* (2013.01); *H01L 24/14* (2013.01); *H01L 23/5329* (2013.01); *H01L 23/53223* (2013.01); *H01L 23/53238* (2013.01); *H01L 23/53266* (2013.01); *H01L 24/11* (2013.01); *H01L 24/13* (2013.01); *H01L 24/16* (2013.01); *H01L 25/0657* (2013.01); *H01L 25/18* (2013.01); *H01L 2224/03618* (2013.01); *H01L 2224/0401* (2013.01); *H01L 2224/05018* (2013.01); *H01L 2224/05025* (2013.01); *H01L 2224/05027* (2013.01); *H01L 2224/0557* (2013.01); *H01L 2224/05155* (2013.01); *H01L 2224/05546* (2013.01); *H01L 2224/05557* (2013.01); *H01L 2224/05558* (2013.01); *H01L 2224/05559* (2013.01); *H01L 2224/05564* (2013.01); *H01L 2224/05567* (2013.01); *H01L 2224/05568* (2013.01); *H01L 2224/05572* (2013.01); *H01L 2224/05611* (2013.01); *H01L 2224/05624* (2013.01); *H01L 2224/05647* (2013.01); *H01L 2224/05655* (2013.01); *H01L 2224/05684* (2013.01); *H01L 2224/06181* (2013.01); *H01L 2224/13023* (2013.01); *H01L 2224/13139* (2013.01); *H01L 2224/13147* (2013.01); *H01L 2224/16013* (2013.01); *H01L 2224/16111* (2013.01); *H01L 2224/16112* (2013.01); *H01L 2224/16113* (2013.01); *H01L 2224/16145* (2013.01); *H01L 2224/16146* (2013.01); *H01L 2224/16147* (2013.01); *H01L 2224/16148* (2013.01); *H01L 2224/16227* (2013.01); *H01L 2224/32145* (2013.01); *H01L 2224/73204* (2013.01); *H01L 2225/06513* (2013.01); *H01L 2225/06517* (2013.01); *H01L 2225/06541* (2013.01); *H01L 2924/15311* (2013.01)

(58) Field of Classification Search
  CPC . H01L 2224/05018; H01L 2224/05027; H01L 2224/05558; H01L 2224/05568; H01L 2224/0557; H01L 2224/05572; H01L 2224/16111; H01L 2224/16112; H01L 2224/16113; H01L 2225/06541
  See application file for complete search history.

(56) References Cited

U.S. PATENT DOCUMENTS

| | | | |
|---|---|---|---|
| 7,778,009 | B2 | 8/2010 | Shioga et al. |
| 7,786,584 | B2 * | 8/2010 | Barth ................ H01L 21/76898 257/758 |
| 8,390,120 | B2 * | 3/2013 | Moon ................. H01L 25/0657 257/744 |
| 8,466,062 | B2 | 6/2013 | Lu et al. |
| 8,492,878 | B2 | 7/2013 | Farooq et al. |
| 8,524,589 | B2 | 9/2013 | Rogers |
| 8,592,991 | B2 | 11/2013 | Lee et al. |
| 2005/0196973 | A1 | 9/2005 | Suzuki et al. |
| 2012/0133048 | A1 * | 5/2012 | Lee ....................... H01L 23/481 257/774 |
| 2012/0228780 | A1 | 9/2012 | Kim et al. |
| 2013/0207241 | A1 | 8/2013 | Lee ................... H01L 21/76898 257/621 |
| 2013/0264720 | A1 | 10/2013 | Chun et al. |
| 2014/0027900 | A1 | 1/2014 | Chiu et al. |
| 2014/0084375 | A1 | 3/2014 | Lee et al. |
| 2015/0282307 | A1 | 10/2015 | Shimizu ................. H01L 24/13 174/264 |

FOREIGN PATENT DOCUMENTS

| | | |
|---|---|---|
| JP | 2007-005696 | 1/2007 |
| JP | 2007-227874 A | 9/2007 |
| JP | 2014-041591 | 3/2014 |
| KR | 10-2012-0116542 A | 10/2012 |
| KR | 10-2013-0054005 A | 5/2013 |

* cited by examiner

SEMICONDUCTOR DEVICES INCLUDING THROUGH-SILICON-VIAS AND METHODS OF MANUFACTURING THE SAME AND SEMICONDUCTOR PACKAGES INCLUDING THE SEMICONDUCTOR DEVICES

CROSS-REFERENCE TO RELATED APPLICATION

This is a continuation application of U.S. patent application Ser. No. 14/858,572; filed Sep. 18, 2015 with the United States Patent and Trademark Office which claims priority under 35 USC § 119 to Korean Patent Application No. 10-2014-0126143, filed on Sep. 22, 2014 in the Korean Intellectual Property Office (KIPO), the contents of which are herein incorporated by reference in their entireties.

FIELD

Example embodiments relate to a semiconductor device and a method of manufacturing the same, and a semiconductor package including the semiconductor device.

BACKGROUND

As semiconductor devices have been highly integrated, a three-dimensional packaging technology in which a plurality of chips may be stacked on each other has been developed. A through silicon via (TSV) technology is a packaging technology in which a via hole may be formed through a silicon substrate and a via electrode may be formed in the via hole.

In order to electrically connect a chip having a TSV therein to another chip, a conductive bump may be formed to contact the TSV, and a rear portion of a silicon substrate in which the TSV is formed may be removed and a CMP process may be performed to expose the TSV. However, the CMP process may be expensive, and the TSV may be damaged during the CMP process. Thus, a semiconductor device including the TSV and a semiconductor package including the semiconductor device may have a poor reliability.

SUMMARY

Embodiments according to the inventive concept can provide semiconductor devices including through silicon vias and methods of forming the devices and packages including the same. Pursuant to these embodiments, a semiconductor device can include a substrate that has a surface. A via structure can extend through the substrate toward the surface of the substrate, where the via structure includes an upper surface. A pad structure can be on the surface of the substrate, where the pad structure can include a lower surface having at least one protrusion that is configured to protrude toward the upper surface of the via structure.

In some embodiments, a semiconductor device can include a via structure through a substrate, where a portion of the via structure is exposed above a top surface of the substrate and the via structure has a top surface of which a central portion is concave and includes a via electrode including a conductive pattern, and a barrier layer pattern surrounding a sidewall of the conductive pattern and an insulation layer pattern surrounding a sidewall of the via electrode. A top surface of the conductive pattern can be lower than that of the insulation layer pattern and is flat. A protection layer pattern structure can be on the top surface of the substrate, where the protection layer pattern structure surrounding a sidewall of the portion of the via structure that is exposed and including a photosensitive organic material. A pad structure can contact a top surface of the portion of the via structure that is exposed, and the pad structure has a flat top surface.

In some embodiments, a semiconductor device can include a via structure through a substrate, where a portion of the via structure can be exposed above a top surface of the substrate. A protection layer pattern structure can be on the top surface of the substrate, where the protection layer pattern structure can surround a sidewall of the portion of the via structure that is exposed and having a top surface higher than that of the via structure. A pad structure can contact the portion of the via structure that is exposed and contact the protection layer pattern structure, and the pad structure has a flat top surface.

In some embodiments, a semiconductor device can include a via structure through a portion of a substrate and a protection layer pattern structure on a top surface of the substrate, where the protection layer pattern structure does not vertically overlap the via structure. A pad structure can be through a portion of the substrate, where the pad structure contacts respective top surfaces of the via structure and the protection layer pattern structure and has a flat top surface.

In some embodiments, a semiconductor package can include a first semiconductor chip that includes a via structure through a substrate, where a portion of the via structure is exposed above a top surface of the substrate, and the via structure has a top surface of which a central portion is concave and includes a via electrode including a conductive pattern and a barrier layer pattern that surrounds a sidewall of the conductive pattern and an insulation layer pattern that surrounds a sidewall of the via electrode, wherein a top surface of the conductive pattern is lower than that of the insulation layer pattern and is flat. A protection layer pattern structure can be on the top surface of the substrate, where the protection layer pattern structure surrounding a sidewall of the portion of the via structure that is exposed and including a photosensitive organic material. A pad structure can contact the portion of the via structure that is exposed, where the pad structure has a flat top surface and a second semiconductor chip can be electrically connected to the first semiconductor chip via the pad structure.

BRIEF DESCRIPTION OF THE DRAWINGS

Example embodiments will be more clearly understood from the following detailed description taken in conjunction with the accompanying drawings. FIGS. 1 to 51 represent non-limiting, example embodiments as described herein.

FIGS. 7 to 25 are cross-sectional views illustrating a method of manufacturing a semiconductor device in accordance with example embodiments;

FIGS. 29 to 31 are cross-sectional views illustrating a method of manufacturing a semiconductor device in accordance with example embodiments;

FIGS. 35 to 37 are cross-sectional views illustrating a method of manufacturing a semiconductor device in accordance with example embodiments;

FIGS. 44 to 48 are cross-sectional views illustrating a method of manufacturing a semiconductor device in accordance with example embodiments; and FIGS. 49 to 51 are cross-sectional views illustrating semiconductor packages in accordance with example embodiments.

DESCRIPTION OF EMBODIMENTS

Figure 1A:
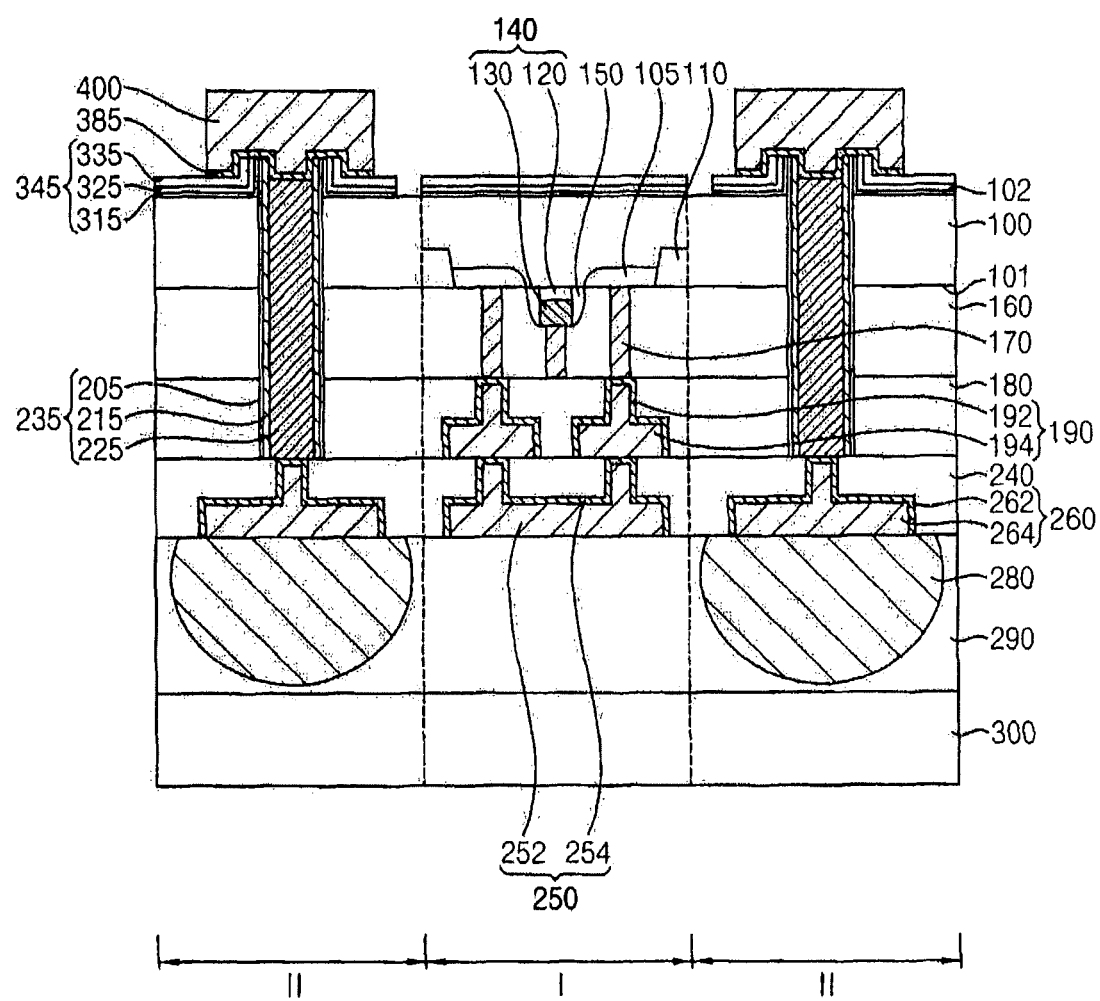
FIGS. 1A, 2A, 3A, 4A, 5A and 6A are cross-sectional views illustrating semiconductor devices in accordance with example embodiments.

Various example embodiments are described hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "interlocking" refers to both a single as well as a pair of structures that are configured to mate with one another via corresponding protrusions and recesses. For example, as shown in FIG. 1A herein, the via structure that includes elements 205, 215, and 225 can be shaped so that an upper surface of the via structure 235 is higher around the edges than at a central portion so that a recess is provided over the element 225. Correspondingly, the pad 400 includes a lower surface that is configured to interlock with the upper surface of the via structure 235 by providing a pair of recesses that interlock with the raised portions of the via structure 235 provided by the elements 205 and 215 being raised relative to the element 225. In some embodiments according to the invention, the protrusions and recesses that correspond to one another in the pad and the via structure are interdigitated with one another.

FIGS. 1A, 2A, 3A, 4A, 5A and 6A are cross-sectional views illustrating semiconductor devices in accordance with example embodiments.

Referring to FIG. 1A, the semiconductor device may include a via structure 235 through a substrate 100, a protection layer pattern structure 345, and a pad structure. The semiconductor device may further include first, second and third insulating interlayers 160, 180 and 240, circuit elements, first, second and third wirings 190, 250 and 260, a contact plug 170, and a first conductive bump 280.

The substrate 100 may include silicon, germanium, silicon-germanium, or III-V compounds, e.g., GaP, GaAs, GaSb, etc. In some embodiments, the substrate 100 may be a silicon-on-insulator (SOI) substrate, or a germanium-on-insulator (GOI) substrate.

The substrate 100 may have a first surface 101 and a second surface 102 opposite thereto. The substrate 100 may include a first region I and a second region II, and hereinafter, not only the first and second regions I and II of the substrate 100 but also spaces extended from the first and second regions I and II of the substrate 100 upwardly or downwardly may be defined altogether as the first and second regions I and II, respectively. In example embodiments, the first region I may be a circuit region in which the circuit elements may be formed, and the second region II may be a via region in which the via structure 235 may be formed. In FIG. 1A, one first region I and two second regions II are shown, however, a plurality of second regions II and a plurality of first regions I between the second regions II may be formed in the semiconductor device. That is, the semiconductor device may include a plurality of via structures 235, and a region in which each via structure 235 is formed may be defined as the second region II.

The first region I may include a cell region in which memory cells may be formed, a peripheral circuit region in which peripheral circuits for driving the memory cells may be formed, and a logic region in which logic devices may be formed.

An isolation layer 110 including an insulating material, e.g., silicon oxide may be formed at a portion of the substrate 100 adjacent to the first surface 101, and circuit elements, e.g., a transistor may be formed on the first surface 101 of the substrate 100. The transistor may include a gate structure 140 having a gate insulation layer pattern 120 and a gate electrode 130 sequentially stacked on the first surface 101 of the substrate 100, and an impurity region 105 at a portion of the substrate 100 adjacent to the gate structure 140. A gate spacer 150 may be formed on a sidewall of the gate structure 140.

The gate insulation layer pattern 120 may include an oxide, e.g., silicon oxide or a metal oxide, the gate electrode 130 may include, e.g., doped polysilicon, a metal, a metal nitride and/or a metal silicide, and the gate spacer 150 may include a nitride, e.g., silicon nitride.

In example embodiments, a plurality of transistors may be formed on the first surface 101 of the substrate 100 in the first region I. The circuit elements may not be limited to the transistors, but various types of circuit elements, e.g., diodes, resistors, inductors, capacitors, etc., may be formed in the first region I.

The first, second and third insulating interlayers 160, 180 and 240 may be sequentially formed on the first surface 101 of the substrate 100.

The first insulating interlayer 160 may cover the circuit elements, and the contact plug 170 contacting the impurity region 105 may be formed through the first insulating interlayer 160. Alternatively, the contact plug 170 may be formed through the first insulating interlayer 160 to contact the gate structure 140. The first insulating interlayer 160 may include an oxide, e.g., silicon oxide, and the contact plug 170 may include, e.g., a metal, a metal nitride, a metal silicide, doped polysilicon, etc.

The second insulating interlayer 180 may contain the first wiring 190 therethrough, which may contact the first contact 170. The second insulating interlayer 180 may include a low-k dielectric material, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

In example embodiments, the first wiring 190 may include a first conductive pattern 194 and a first barrier pattern 192 partially covering the first conductive pattern 194. The first conductive pattern 194 may include a metal, e.g., copper, aluminum, tungsten, titanium, tantalum, etc., and the first barrier pattern 192 may include a metal nitride, e.g., titanium nitride, tantalum nitride, tungsten nitride, copper nitride, aluminum nitride, etc. In example embodiments, the first wiring 190 may be formed by a dual damascene process, and thus upper and lower portions of the first wiring 190 may have different widths. Alternatively, the first wiring 190 may be formed by a single damascene process, and thus the first wiring 190 may have a substantially constant width regardless of the height thereof. Hereinafter, for the convenience of explanations, only the first wiring 190 formed by the dual damascene process will be illustrated.

The via structure 235 may be formed through the first and second insulating interlayers 160 and 180 and the substrate 100, and a portion of the via structure 235 may be exposed over the second surface 102 of the substrate 100. The via structure 235 may have a top surface of which a central portion may be concave.

In example embodiments, the via structure 235 may include a via electrode and an insulation layer pattern 205 surrounding a sidewall of the via electrode. The via electrode may include a second conductive pattern 225 and a second barrier layer pattern 215 surrounding a sidewall of the second conductive pattern 225. The second conductive pattern 225 may include a metal, e.g., copper, aluminum, tungsten, etc., or doped polysilicon, and the second barrier pattern 215 may include a metal nitride, e.g., titanium nitride, tantalum nitride, tungsten nitride, copper nitride, aluminum nitride, etc. The insulation layer pattern 205 may include an oxide, e.g., silicon oxide, or a nitride, e.g., silicon nitride.

Figure 3A:
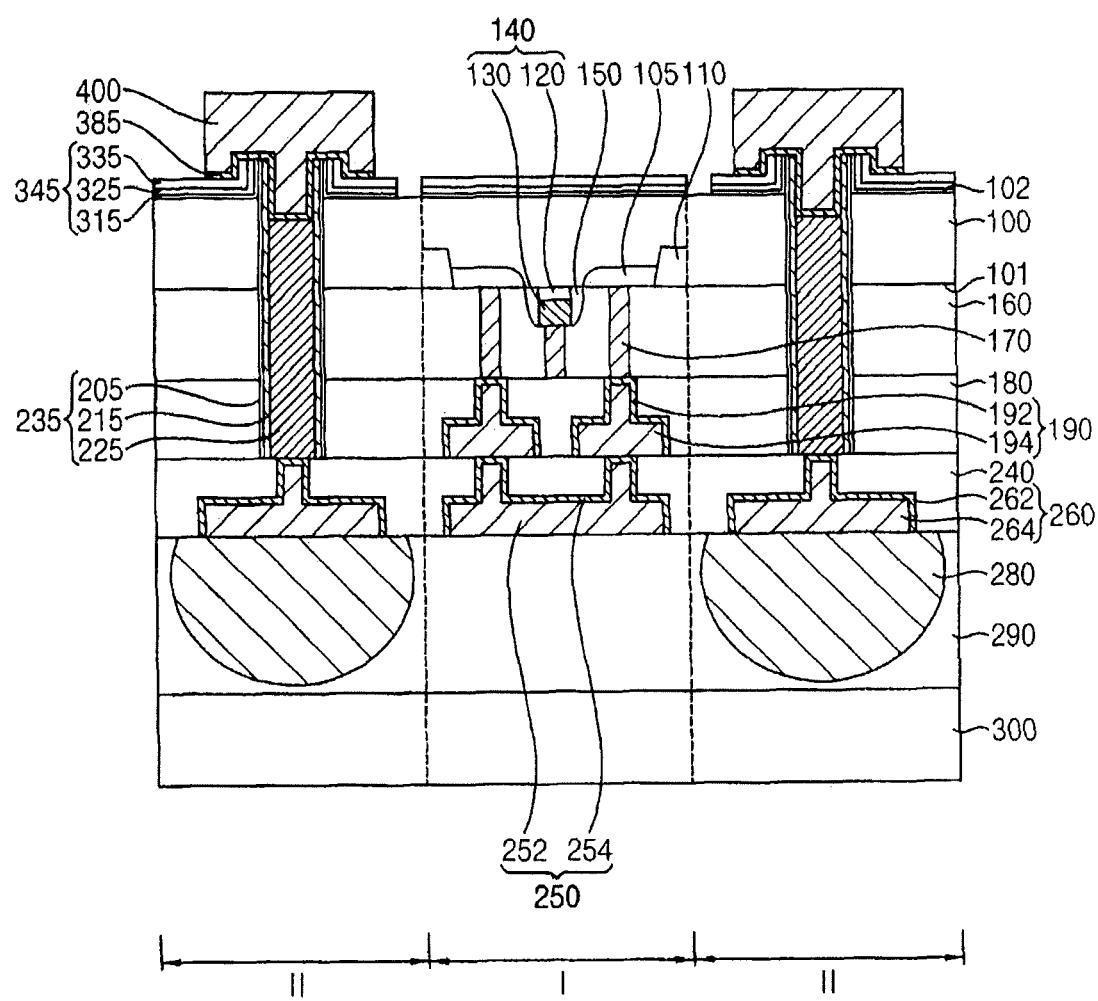

In example embodiments, a top surface of the second conductive pattern 225 may be lower than top surfaces of the second barrier layer pattern 215 and the insulation layer pattern 205, and the top surface of the second barrier layer pattern 215 may be substantially coplanar with the top surface of the insulation layer pattern 205. Referring to FIG. 3A, the top surface of the second conductive pattern 225 may be lower than the second surface 102 of the substrate 100.

The protection layer pattern structure 345 may be formed on the second surface 102 of the substrate 100, to cover a sidewall of the exposed portion of the via structure 235. A top surface of a portion of the protection layer pattern structure 345 surrounding a sidewall of the via structure 235 may be higher than a top surface of other portions of the protection layer pattern structure 345. Thus, the whole top surfaces of the via structure 235 together with the protection layer pattern structure 345 may not be flat (i.e., non-planar).

In example embodiments, the protection layer pattern structure 345 may include a first oxide layer pattern 315, a nitride layer pattern 325 and a second oxide layer pattern 335 sequentially stacked on the second surface 102 of the substrate 100.

Figure 2A:
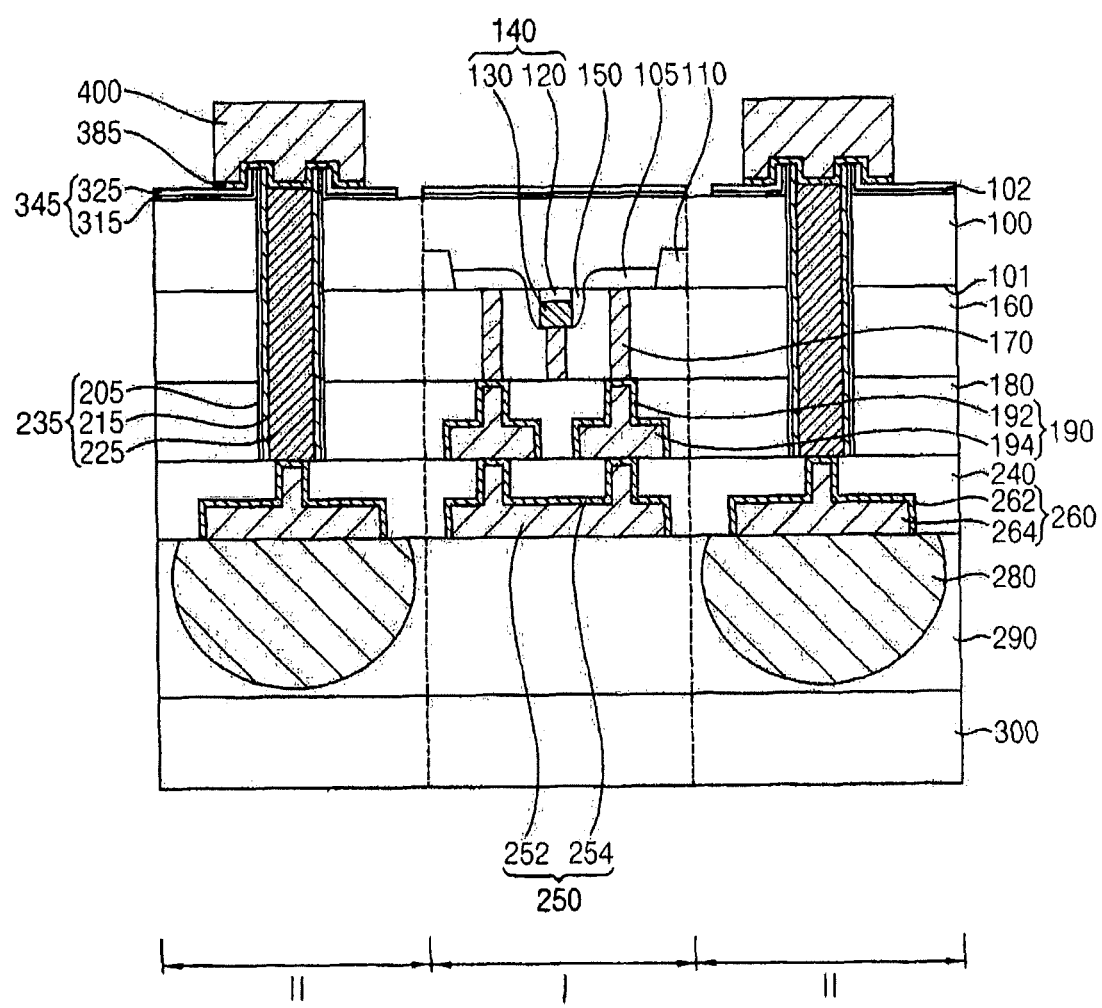
Figure 2B:
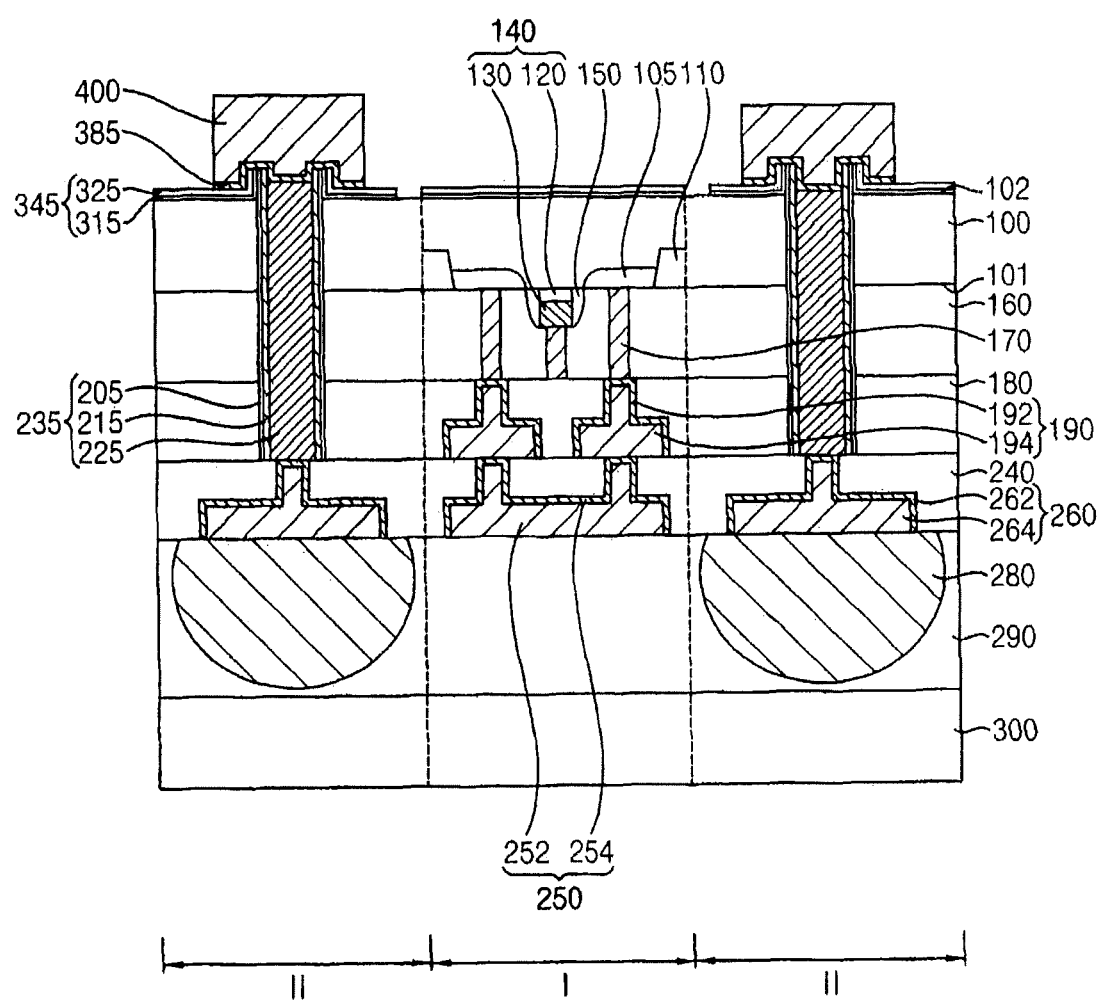

Referring to FIG. 2A, the protection layer pattern structure 345 may include only the first oxide layer pattern 315 and the nitride layer pattern 325 sequentially stacked on the second surface 102 of the substrate 100.

The pad structure may contact the top surface of the exposed portion of the via structure 235, and may have a flat or even top surface. Thus, the pad structure may have a bottom surface of which a central portion may be convex (i.e., protruding) according to the shape of the top surface of the via structure 235 (i.e., the bottom surface may have a contour that conforms to the non-planar top surface of the protection layer pattern structure 345 and the via structure 235). In example embodiments, the pad structure may contact not only the top surface of the exposed portion of the via structure 235 but also the top surface of the protection layer pattern structure 345, and the bottom surface of the pad structure may not be flat according to the variation of heights of the top surfaces of the via structure 235 and the protection layer pattern structure 345.

In example embodiments, the pad structure may include a seed pattern 385 and a pad 400 sequentially stacked. The seed pattern 385 may include, e.g., copper, and the pad 400 may include, e.g., nickel, copper, tungsten, aluminum, tin-silver alloy, etc.

The pad structure may have the uneven bottom surface, however, may have the flat top surface, and thus, when a conductive bump (not shown) is formed on the top surface of the pad structure so that a chip including the semiconductor device may be electrically connected to another chip, the connection between the pad structure and the conductive bump may be good. Thus, a semiconductor package including the semiconductor device may have good electrical characteristics.

The third insulating interlayer 240 may contain the second and third wirings 250 and 260 therethrough, which may contact the first wiring 190 and the via structure 235, respectively. The second and third wirings 250 and 260 may be formed in the first and second regions I and II, respectively. The third insulating interlayer 240 may include a low-k dielectric material, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

The second and third wirings 250 and 260 may be formed by a dual damascene process or a single damascene process as the first wiring 190, and may be electrically connected to each other according to the circuit layout. In example embodiments, the second wiring 250 may include a third conductive pattern 254 and a third barrier layer pattern 252 partially covering the third conductive pattern 254, and the third wiring 260 may include a fourth conductive pattern 264 and a fourth barrier layer pattern 262 partially covering the fourth conductive pattern 264.

The first conductive bump 280 may contact the third wiring 260, and may include a metal, e.g., silver, copper, etc., or an alloy, e.g., solder.

When the semiconductor device may be formed, the first conductive bump 280 may be contained by an adhesion layer 290, and the adhesion layer 290 may adhere to a handling substrate 300. The handling substrate 300 may be, e.g., a glass substrate.

As illustrated above, the via structure 235 of the semiconductor device may have the top surface of which the central portion may be concave, and the top surface of the protection layer pattern structure 345 covering the sidewall of the via structure 235 may have a height varying according to the position thereof. Thus, the bottom surface of the pad structure on the top surfaces of the via structure 235 and the protection layer pattern structure 345 may not be flat; however, the top surface of the pad structure may be flat. Accordingly, the connection between the top surface of the pad structure and the conductive bump 280 on another may be good, and the semiconductor package including the semiconductor device may have good electrical characteristics.

As will be illustrated with reference to FIGS. 7 to 25 later, no chemical mechanical polishing (CMP) process may be performed on the via structure 235, and thus the via structure 235 may not be damaged but still have good physical characteristics.

Figure 4A:
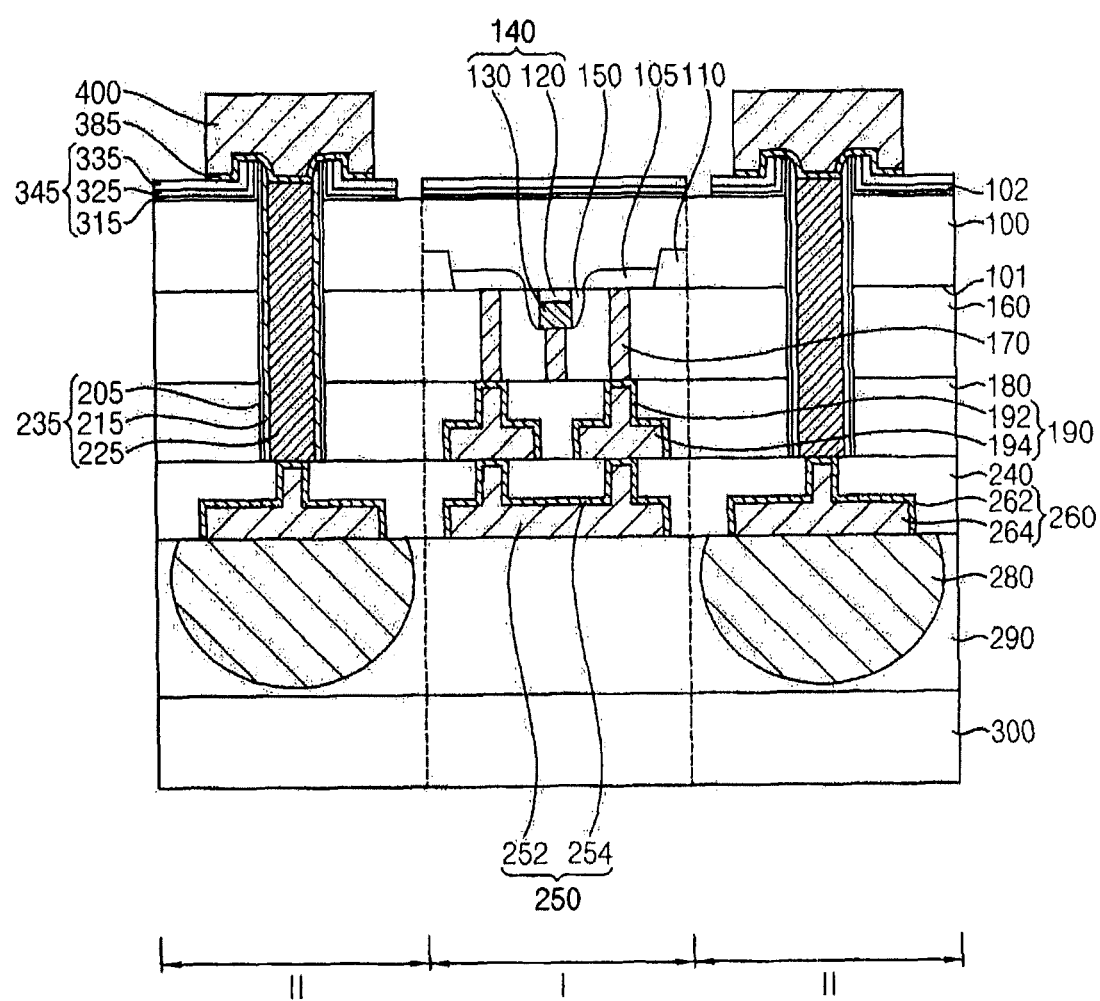
Figure 4B:
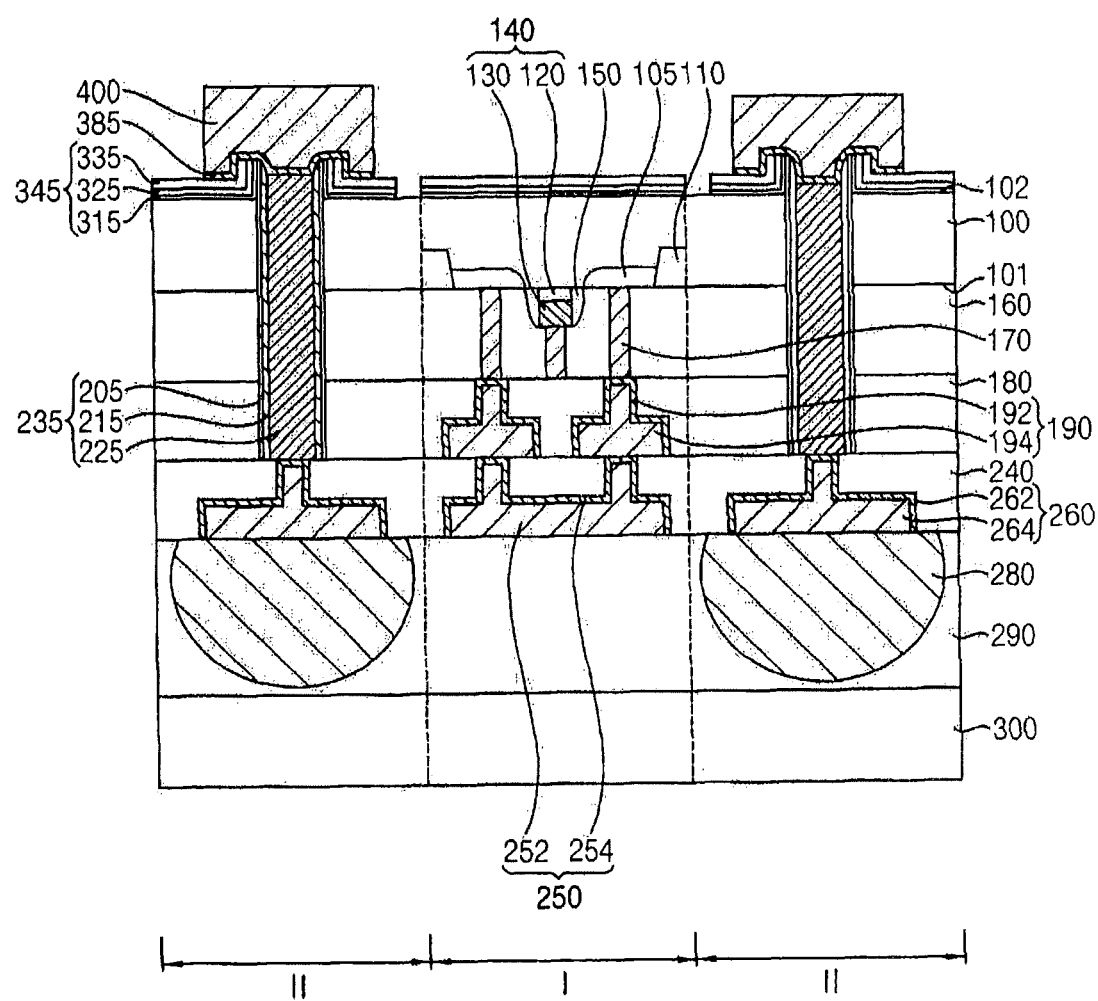
Figure 5A:
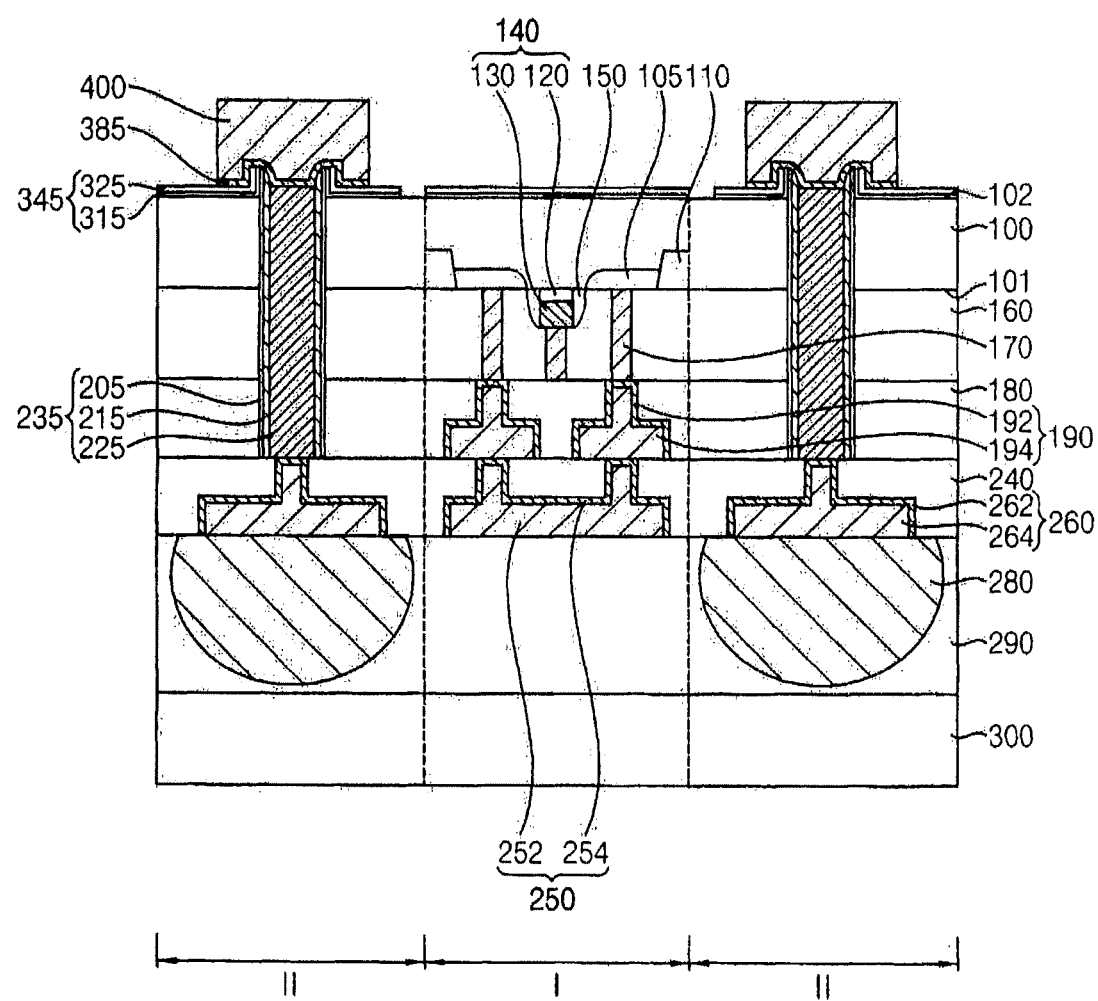
Figure 5B:
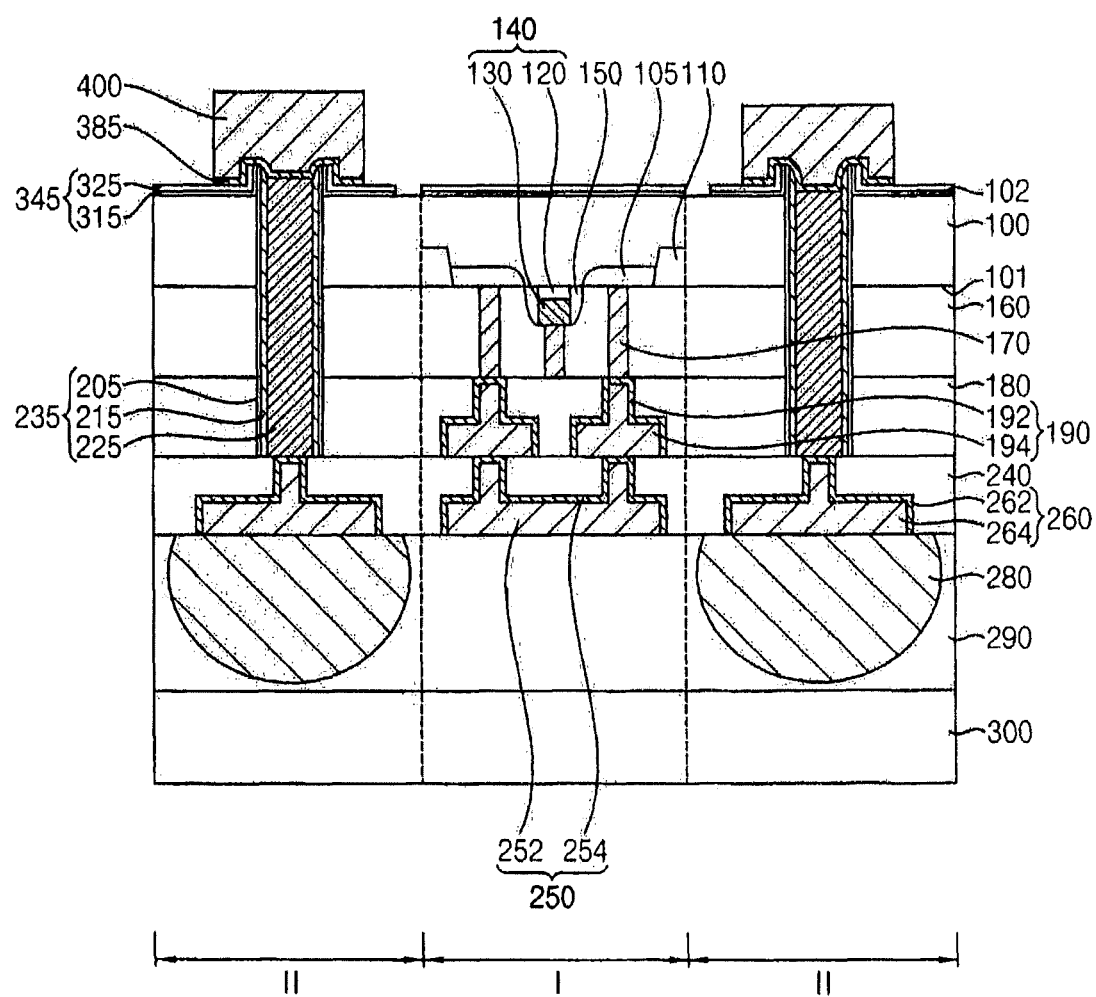
Figure 6A:
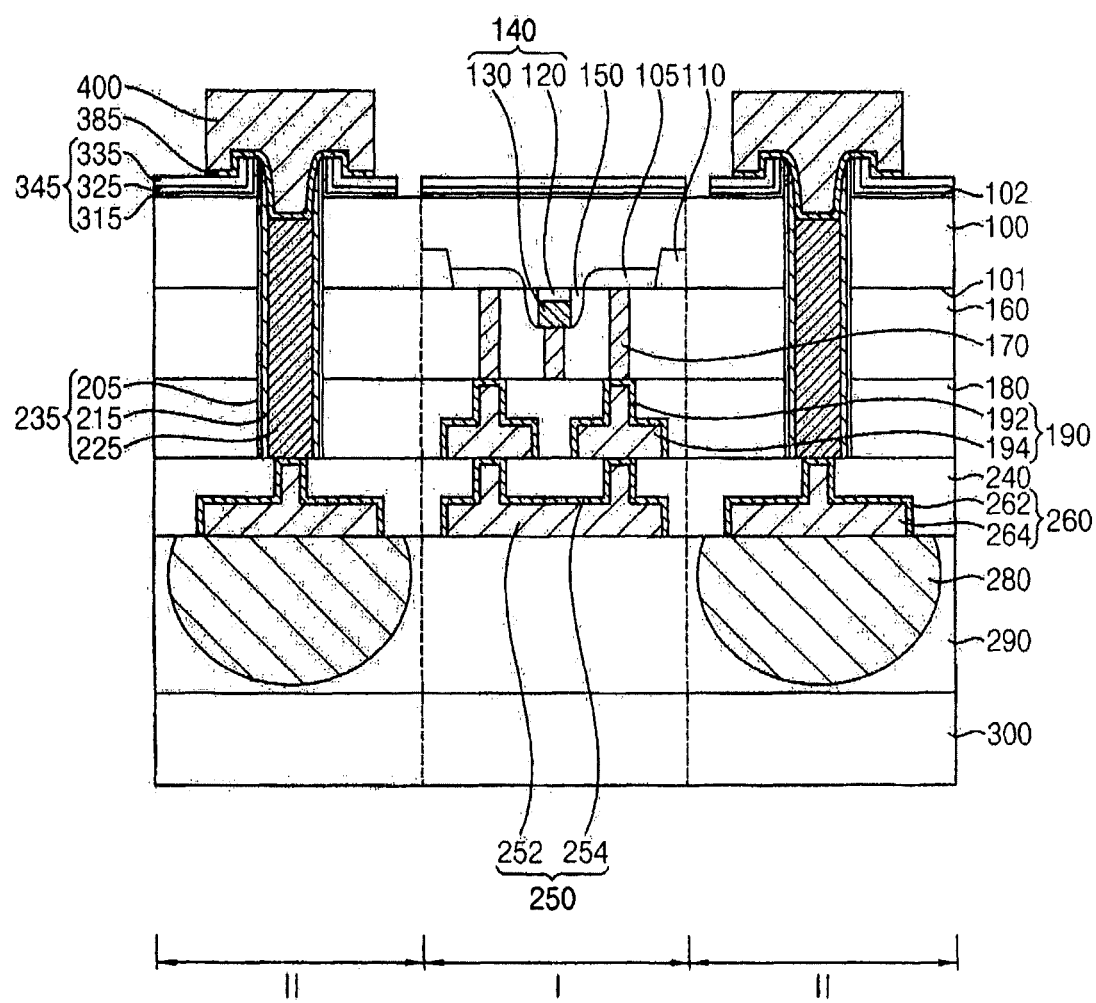

In FIGS. 4A, 5A and 6A, the second barrier layer pattern 215 and the insulation layer pattern 205 of the via structure 235 may have shapes different from those illustrated in FIGS. 1A, 2A and 3A, respectively.

That is, a portion of the second barrier layer pattern 215 above the second conductive pattern 225 may have a gradually decreasing width from a bottom toward a top thereof, and likewise, a portion of the insulation layer pattern 205 adjacent to the portion of the second barrier layer pattern 215 above the second conductive pattern 225 may have a gradually decreasing width from a bottom toward a top thereof. Thus, an upper portion of the second barrier layer pattern 215 and/or an upper portion of the insulation layer pattern 205 may have slanted inner walls. The slanted inner walls of the upper portion of the second barrier layer pattern 215 and/or the upper portion of the insulation layer pattern 205 may be formed because the second barrier layer pattern 215 and/or the insulation layer pattern 205 may be partially etched according to the process conditions and the size of a first recess 370a (refer to FIGS. 18A and 19A) when the second conductive pattern 225 is formed by a wet etch process.

The shapes of the via structure 235 illustrated in FIGS. 4A, 5A and 6A may be applied to other semiconductor devices described hereinafter, however, for the convenience of explanations, the via structure 235 having the shapes of FIGS. 1A, 2A and 3A only will be described.

FIGS. 1B, 2B, 3B, 4B, 5B and 6B are cross-sectional views illustrating semiconductor devices in accordance with example embodiments. The semiconductor devices may be substantially the same as or similar to those illustrated with reference to FIGS. 1A, 2A, 3A, 4A, 5A and 6A, respectively, except for the heights of the second conductive pattern and the pad.

Figure 1B:
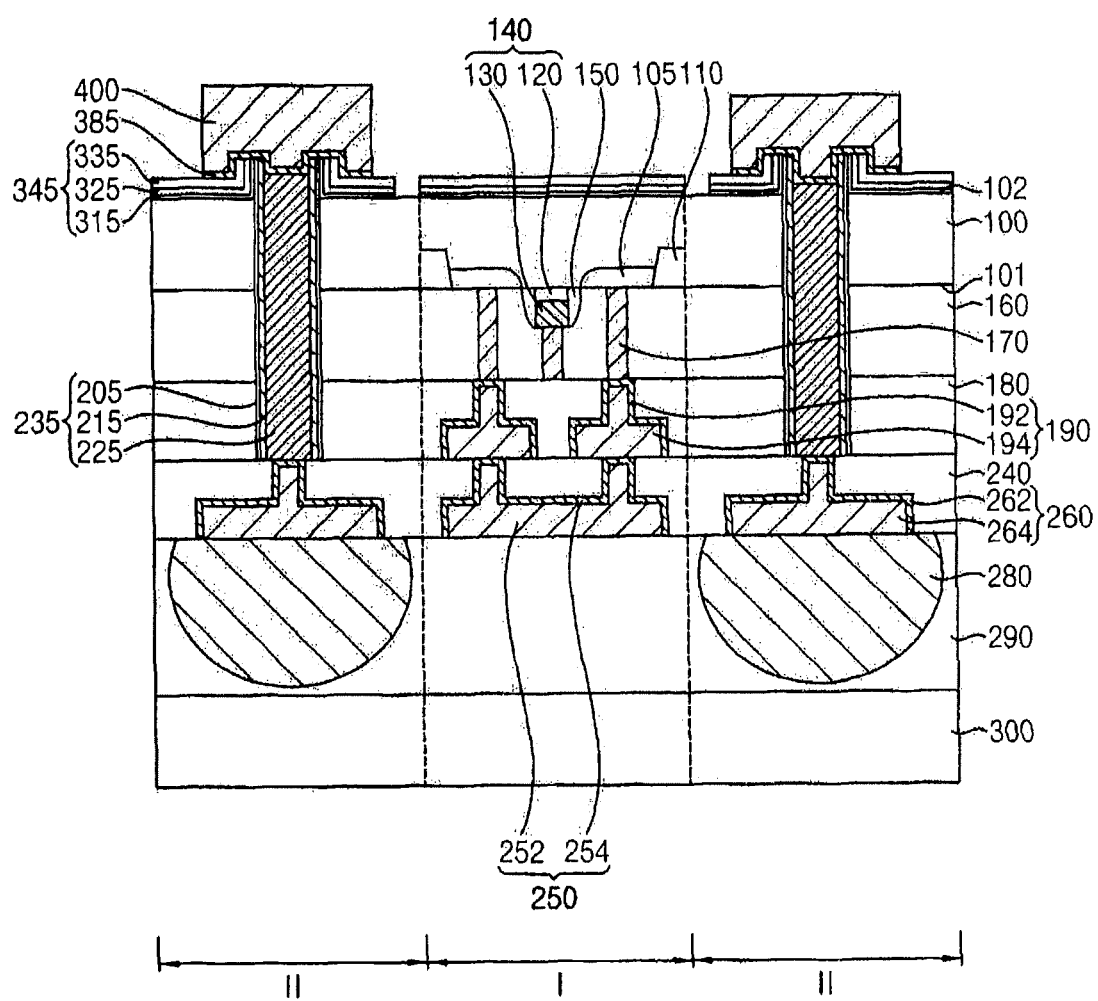
FIGS. 1B, 2B, 3B, 4B, 5B and 6B are cross-sectional views illustrating semiconductor devices in accordance with example embodiments.

Referring to FIG. 1B, the semiconductor device may include a plurality of via structures 235, and each via structure 235 may include an insulation layer pattern 205, a second conductive pattern 225 and a second barrier layer pattern 215. Top surfaces of the second conductive patterns 225 may have different heights from each other, and top surfaces of pads 400 on the via structures 235 may have different heights from each other. In FIG. 1B, only two via structures 235 are shown, however, more than two via structures 235 may be formed, and at least some of the second conductive patterns 225 of the via structures 235 may have top surfaces at different heights from each other, and thus at least some of the pads 400 may have top surfaces at different heights from each other.

Referring to FIGS. 2B, 3B, 4B, 5B and 6B, as the semiconductor device shown in FIG. 1B, each of the semiconductor devices may include a plurality of second conductive patterns 225, and at least some of the second conductive patterns 225 may have top surfaces at different heights from each other, and thus at least some of the pads 400 may have top surfaces at different heights from each other.

FIGS. 7 to 25 are cross-sectional views illustrating a method of manufacturing a semiconductor device in accordance with example embodiments.

Figure 7:
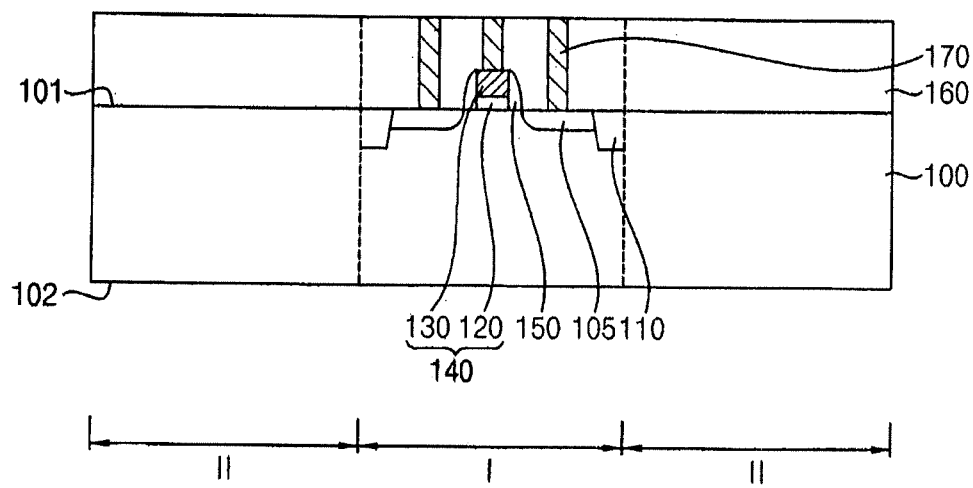

Referring to FIG. 7, circuit elements and a contact plug 170 may be formed on a substrate 100 having an isolation layer 110 thereon.

The substrate 100 may include silicon, germanium, silicon-germanium, or III-V compounds, e.g., GaP, GaAs, GaSb, etc. In some embodiments, the substrate 100 may be a silicon-on-insulator (SOI) substrate, or a germanium-on-insulator (GOI) substrate.

The substrate 100 may have a first surface 101 and a second surface 102 opposite thereto. The substrate 100 may include a first region I and a second region II. In example embodiments, the first region I may be a circuit region in which the circuit elements may be formed, and the second region II may be a via region in which a via structure 235 (refer to FIG. 18A) may be formed.

The first region I may include a cell region in which memory cells may be formed, a peripheral circuit region in which peripheral circuits for driving the memory cells may be formed, and a logic region in which logic devices may be formed.

In example embodiments, the isolation layer 110 may be formed by a shallow trench isolation (STI) process, and include an insulating material, e.g., silicon oxide.

A transistor serving as the circuit element may be formed by a following method.

Particularly, after sequentially forming a gate insulation layer and a gate electrode layer on the first surface 101 of the substrate 100 having the isolation layer 110 thereon, the gate electrode layer and the gate insulation layer may be patterned by a photolithography process to form a gate structure 140 including a gate insulation layer pattern 120 and a gate electrode 130 sequentially stacked on the first surface 101 of the substrate 100 in the first region I. The gate insulation layer may be formed to include an oxide, e.g., silicon oxide or a metal oxide, and the gate electrode layer may be formed to include, e.g., doped polysilicon, a metal, a metal nitride and/or a metal silicide.

A gate spacer layer may be formed on the substrate 100 and the isolation layer 110 to cover the gate structure 140, and may be anisotropically etched to form a gate spacer 150 on a sidewall of the gate structure 140. The gate spacer layer may be formed to include a nitride, e.g., silicon nitride.

Impurities may be implanted into an upper portion of the substrate 100 to form a first impurity region 105, so that the transistor including the gate structure 140 and the first impurity region 105 may be formed.

In example embodiments, a plurality of transistors may be formed on the substrate 100 in the first region I. The circuit elements may not be limited to the transistor, but various types of circuit elements, e.g., diodes, resistors, inductors, capacitors, etc. may be formed.

A first insulating interlayer 160 may be formed on the substrate 100 to cover the circuit elements, and a contact plug 170 may be formed through the first insulating interlayer 160 to contact the first impurity region 105. Alternatively, the contact plug 170 may be formed through the first insulating interlayer 160 to contact the gate structure 140.

The first insulating interlayer 160 may be formed to include an oxide, e.g., silicon oxide. The contact plug 170 may be formed by forming a contact hole through the first insulating interlayer 160 to expose the first impurity region 105, forming a conductive layer on the exposed first impurity region 105 and the first insulating interlayer 160 to fill the contact hole, and planarizing an upper portion of the conductive layer until a top surface of the first insulating interlayer 160 may be exposed. The conductive layer may be formed to include, e.g., a metal, a metal nitride, a metal silicide, doped polysilicon, etc.

Figure 8:
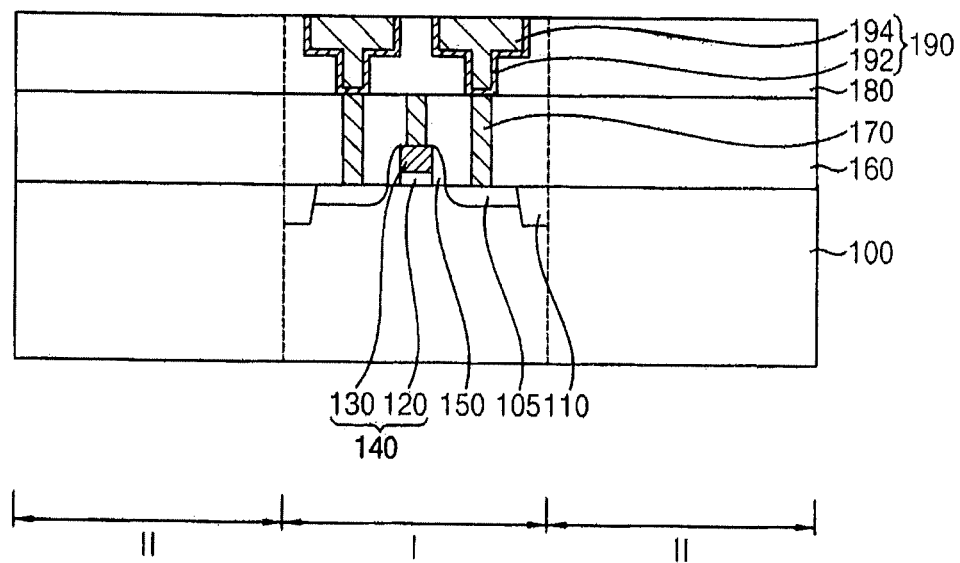

Referring to FIG. 8, a second insulating interlayer 180 may be formed on the first insulating interlayer 160 and the contact plug 170, and at least one first wiring 190 may be formed through the second insulating interlayer 180 in the first region I.

The second insulating interlayer 180 may be formed to include a low-k dielectric material, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

In example embodiments, the second insulating interlayerl 80 may be formed by a dual damascene process as follows.

After partially removing the second insulating interlayer 180 to form a via hole therethrough, which may expose top surfaces of the first insulating interlayer 160 and the contact plug 170, an upper portion of the second insulating interlayer 180 may be removed to form a first trench being in communication with the via hole and having a diameter greater than that of the via hole. Alternatively, after forming the first trench, the via hole may be formed later. A first barrier layer may be formed on inner walls of the via hole and the first trench and the exposed top surfaces of the first insulating interlayer 160 and the contact plug 170, and a first conductive layer may be formed on the first barrier layer to sufficiently fill remaining portions of the via hole and the first trench. Upper portions of the first barrier layer and the first conductive layer may be planarized until a top surface of the second insulating interlayer 180 may be exposed to form the first wiring 190 contacting the top surface of the contact plug 170 in the first region I. The first wiring 190 may be formed to include a first conductive pattern 194 and a first barrier layer pattern 192 surrounding a bottom and a sidewall of the first conductive pattern 194.

The first barrier layer may be formed to include a metal nitride, e.g., titanium nitride, tantalum nitride, tungsten nitride, copper nitride, aluminum nitride, etc., and the first conductive layer may be formed to include a metal, e.g., copper, aluminum, tungsten, titanium, tantalum, etc. When the first conductive layer is formed using copper or aluminum, a seed layer may be formed on the first barrier layer, and the first conductive layer may be formed by an electroplating process.

As illustrated above, the first wiring 190 may be formed by a dual damascene process, and thus may be formed to have a lower portion and an upper portion connected thereto. Alternatively, the first wiring 190 may be formed by a single damascene process. In this case, the first wiring 190 may have a substantially constant thickness from a bottom portion toward a top portion thereof. Hereinafter, for the convenience of explanations, only the first wiring 190 formed by a dual damascene process as shown in FIG. 8 will be illustrated.

In FIG. 8, the first wiring 190 may be formed through the single second insulating interlayer 180, however, more insulating interlayers may be further formed on the second insulating interlayer 180 and more first wirings 190 may be formed through each of the insulating interlayers.

Figure 9:
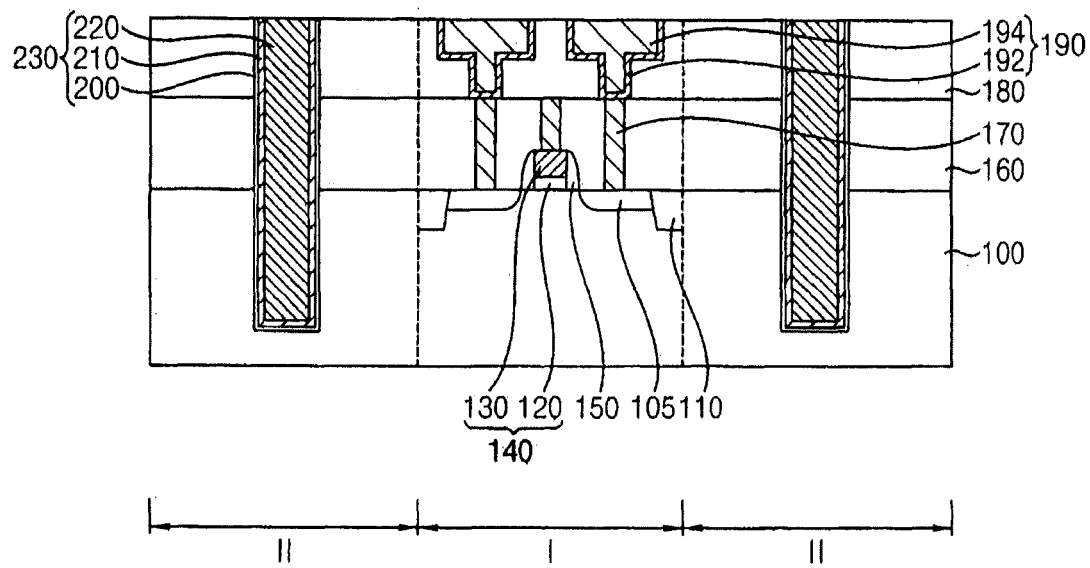

Referring to FIG. 9, a preliminary via structure 230 may be formed through a portion of the substrate 100.

Particularly, a first photoresist pattern covering the first region I of the substrate 100 and partially exposing the second region II of the substrate 100 may be formed on the second insulating interlayer 180 and the first wiring 190, and the first and second insulating interlayers 160 and 180 and the substrate 100 may be etched using the first photoresist pattern as an etching mask to form a second trench. The second trench may be formed through the first and second insulating interlayers 160 and 180 and the portion of the substrate 100.

An insulation layer 200 and a second barrier layer 210 may be sequentially formed on an inner wall of the second trench, the second insulating interlayer 180 and the first wiring 190, and a second conductive layer 220 may be formed on the second barrier layer 210 to sufficiently fill the second trench. The insulation layer 200 may be formed to include an oxide, e.g., silicon oxide or a nitride, e.g., silicon nitride, and the second barrier layer 210 may be formed to include a metal nitride, e.g., titanium nitride, tantalum nitride, tungsten nitride, copper nitride, aluminum nitride, etc. The second conductive layer 220 may be formed to include a metal, e.g., copper, aluminum, tungsten, etc., or doped polysilicon. When the second conductive layer 220 is formed to include copper or aluminum, a second seed layer may be formed on the second barrier layer 210, and the second conductive layer 220 may be formed by an electroplating process.

The second conductive layer 220, the second barrier layer 210 and the insulation layer 200 may be planarized until a top surface of the second insulating interlayer 180 may be exposed to form the preliminary via structure 230 filling the second trench. The preliminary via structure 230 may include the insulation layer 200, the second barrier layer 210 and the second conductive layer 220.

Figure 10:
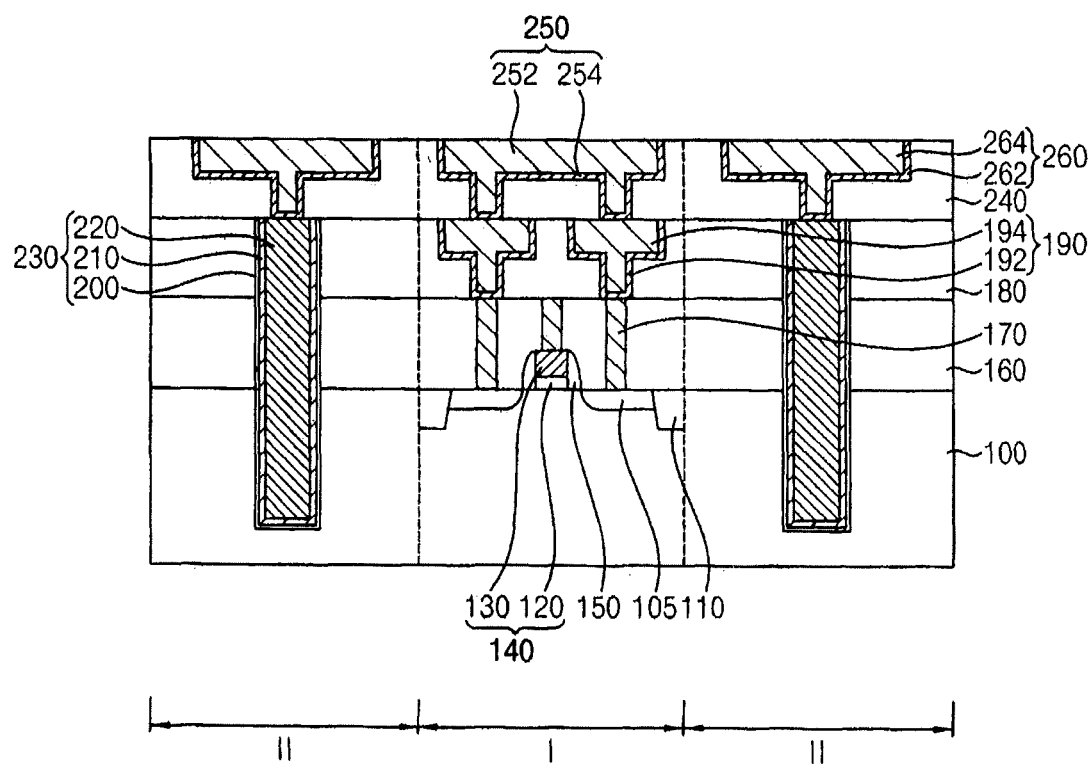

Referring to FIG. 10, a third insulating interlayer 240 may be formed on the second insulating interlayer 180, the first wiring 190 and the preliminary via structure 230, and second and third wirings 250 and 260 may be formed through the third insulating interlayer 240 in the first and second regions I and II, respectively.

The third insulating interlayer 240 may be formed to include a low-k dielectric material, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

The second and third wirings 250 and 260 may be formed by a dual damascene process or a single damascene process, as the first wiring 190. In example embodiments, the second wiring 250 may be formed to contact a top surface of the first wiring 190, and the third wiring 260 may be formed to contact a top surface of the preliminary via structure 230. According to the circuit layout, the second and third wirings 250 and 260 may be formed to be electrically connected to each other. In example embodiments, the second wiring 250 may be formed to include a third conductive pattern 254 and a third barrier layer pattern 252 covering a bottom and a sidewall of the third conductive pattern 254, and the third wiring 260 may be formed to include a fourth conductive pattern 264 and a fourth barrier layer pattern 262 covering a bottom and a sidewall of the fourth conductive pattern 264.

Figure 11:
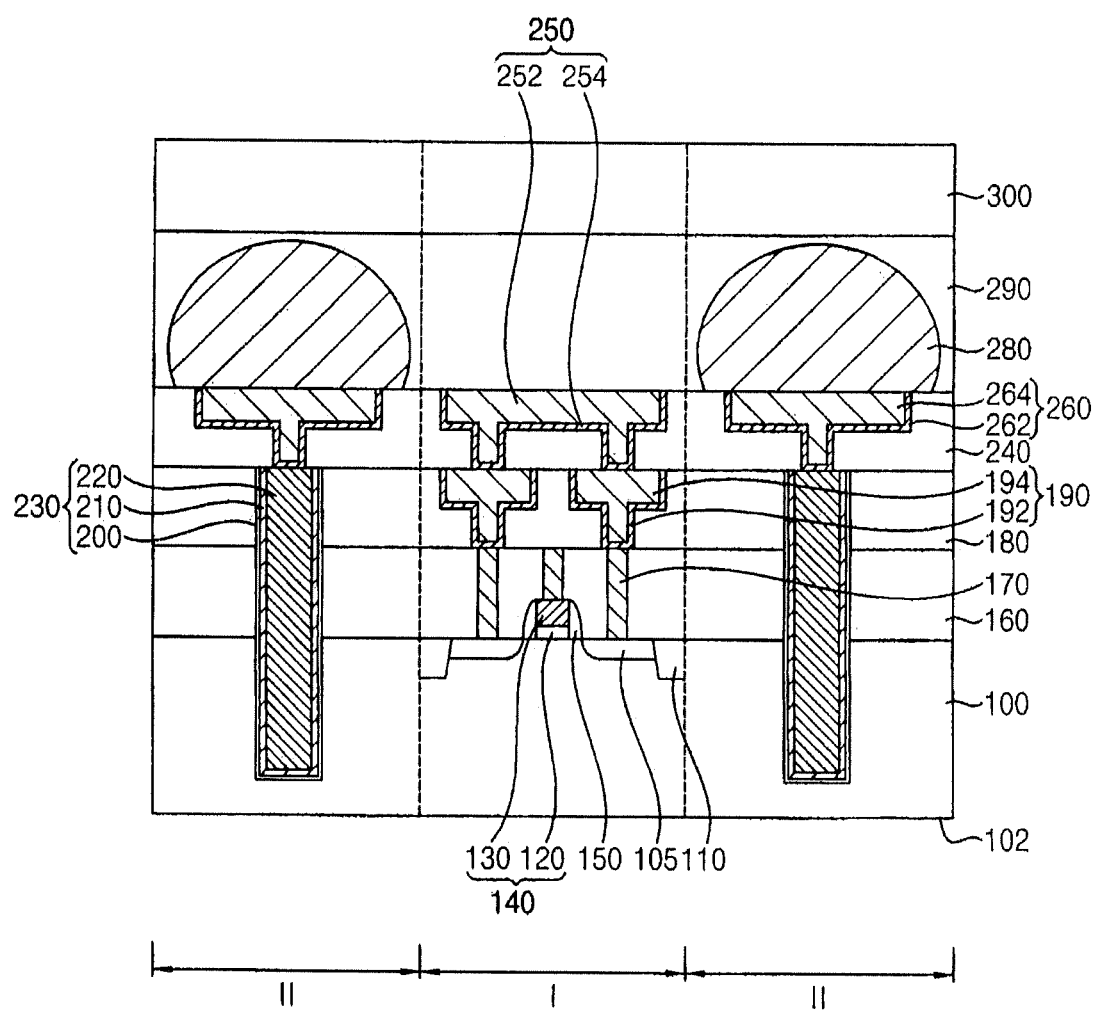

Referring to FIG. 11, after a first conductive bump 280 may be formed on the third insulating interlayer 240 to contact a top surface of the third wiring 260, an adhesion layer 290 may be formed on the third insulating interlayer 240 and the second wiring 250, and may adhere to a handling substrate 300.

The first conductive bump 280 may be formed to include a metal, e.g., silver, copper, etc., or an alloy, e.g., solder. The handling substrate 300 may be, e.g., a glass substrate.

Figure 12:
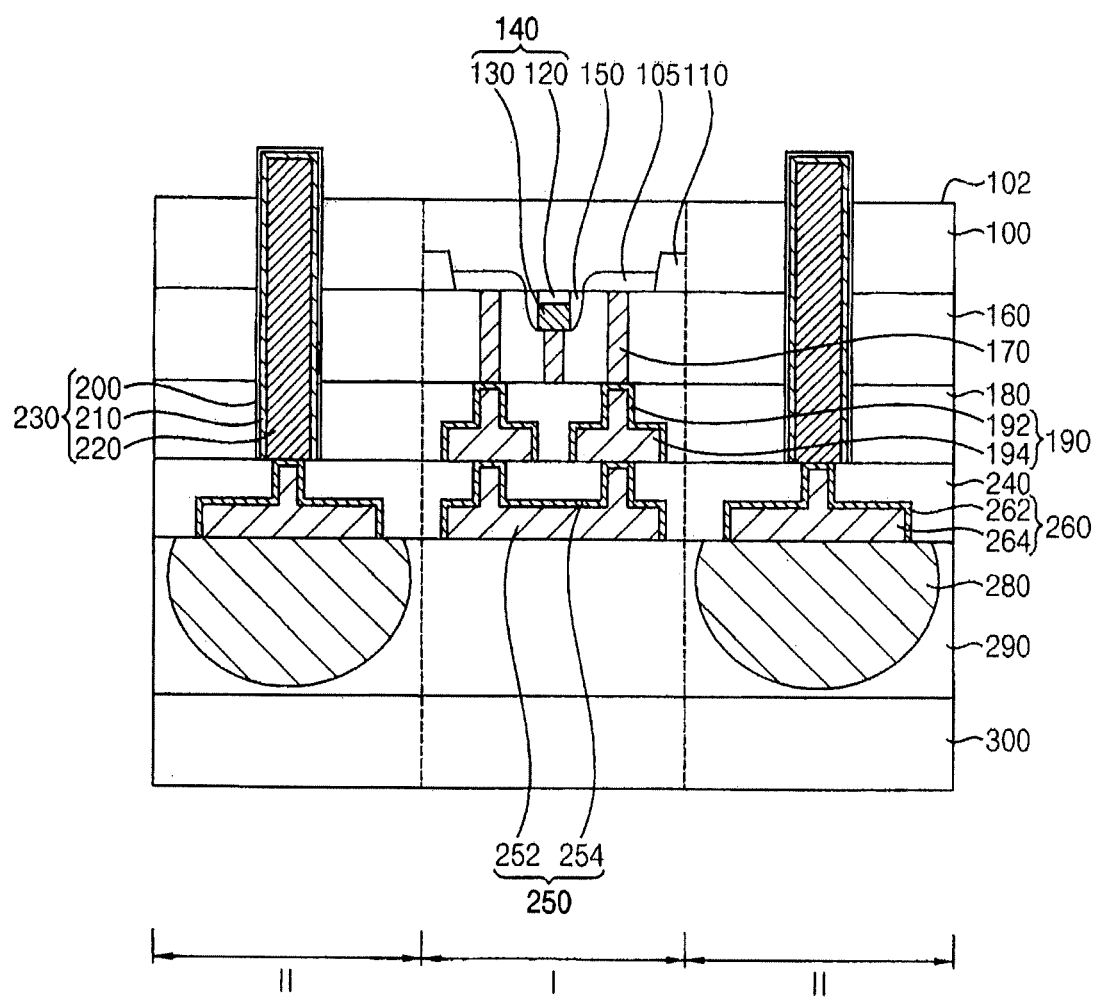

Referring to FIG. 12, the substrate 100 may be overturned using the handling substrate 300 so that the second surface 102 of the substrate 100 may face upward. A portion of the substrate 100 adjacent to the second surface 102 may be removed to expose a portion of the preliminary via structure 230. Thus, the substrate 100 may be partially removed by, e.g., an etch back process.

Figure 13:
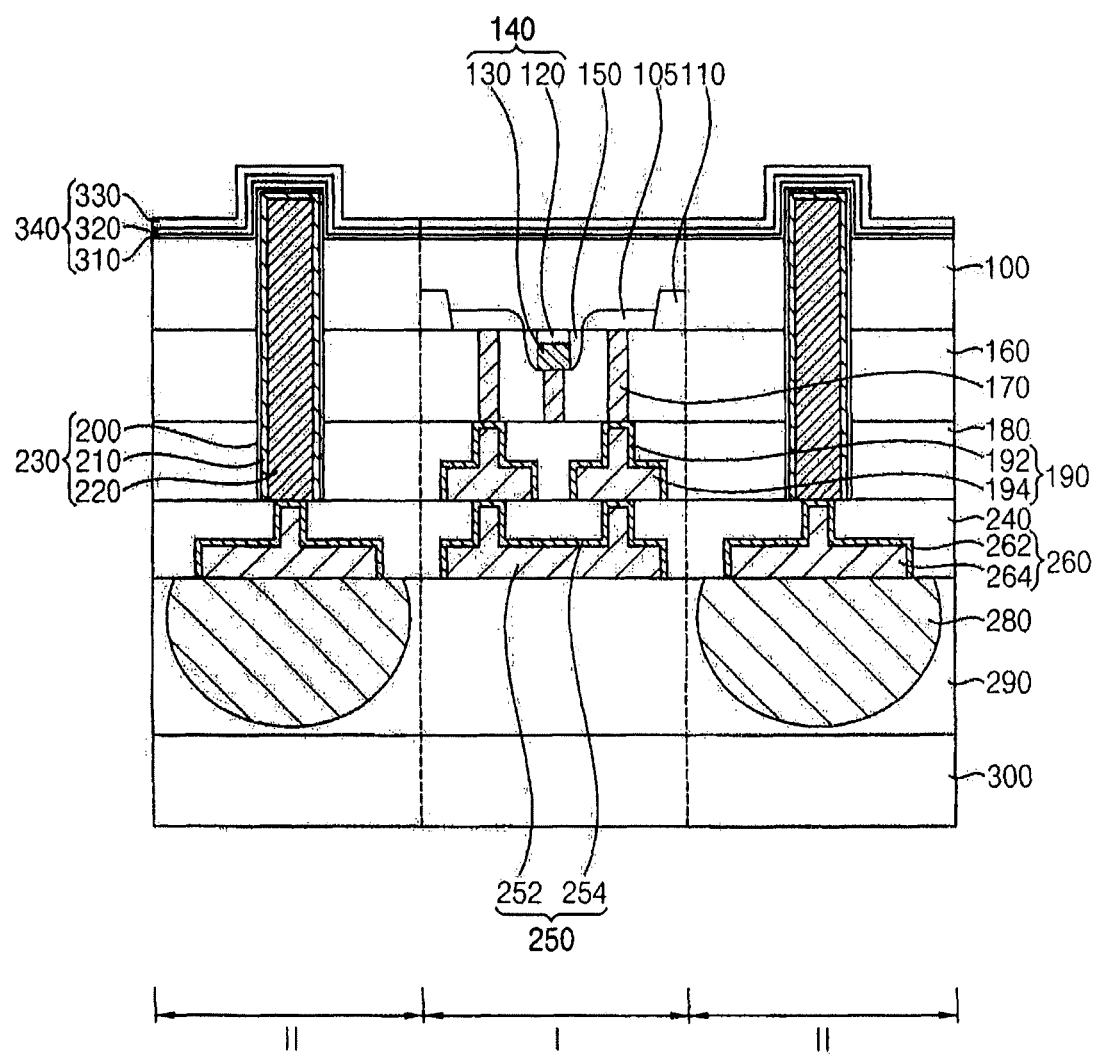

Referring to FIG. 13, a protection layer structure 340 may be formed on the second surface 102 of the substrate 100 and the exposed portion of the preliminary via structure 230.

In example embodiments, the protection layer structure 340 may be formed to include a first oxide layer 310, a nitride layer 320 and a second oxide layer 330 sequentially stacked. In an example embodiment, the second oxide layer 330 may be formed to have a thickness more than that of the first oxide layer 310 and the nitride layer 320. In this case, in a subsequent process illustrated with reference to FIG. 17A, a first oxide layer pattern 315, a nitride layer pattern 325 and a second oxide layer pattern 335 may remain.

In other example embodiments, the nitride layer 320 may be formed to have a thickness less than that of the first oxide layer 310 and the second oxide layer 330, and the first and second oxide layers 310 and 330 may be formed to have thicknesses substantially the same as or similar to each other. In this case, in the subsequent process illustrated with reference to FIG. 17A, only the first oxide layer pattern 315 and the nitride layer pattern 325 may remain, and the second oxide layer 330 may be removed.

Figure 14:
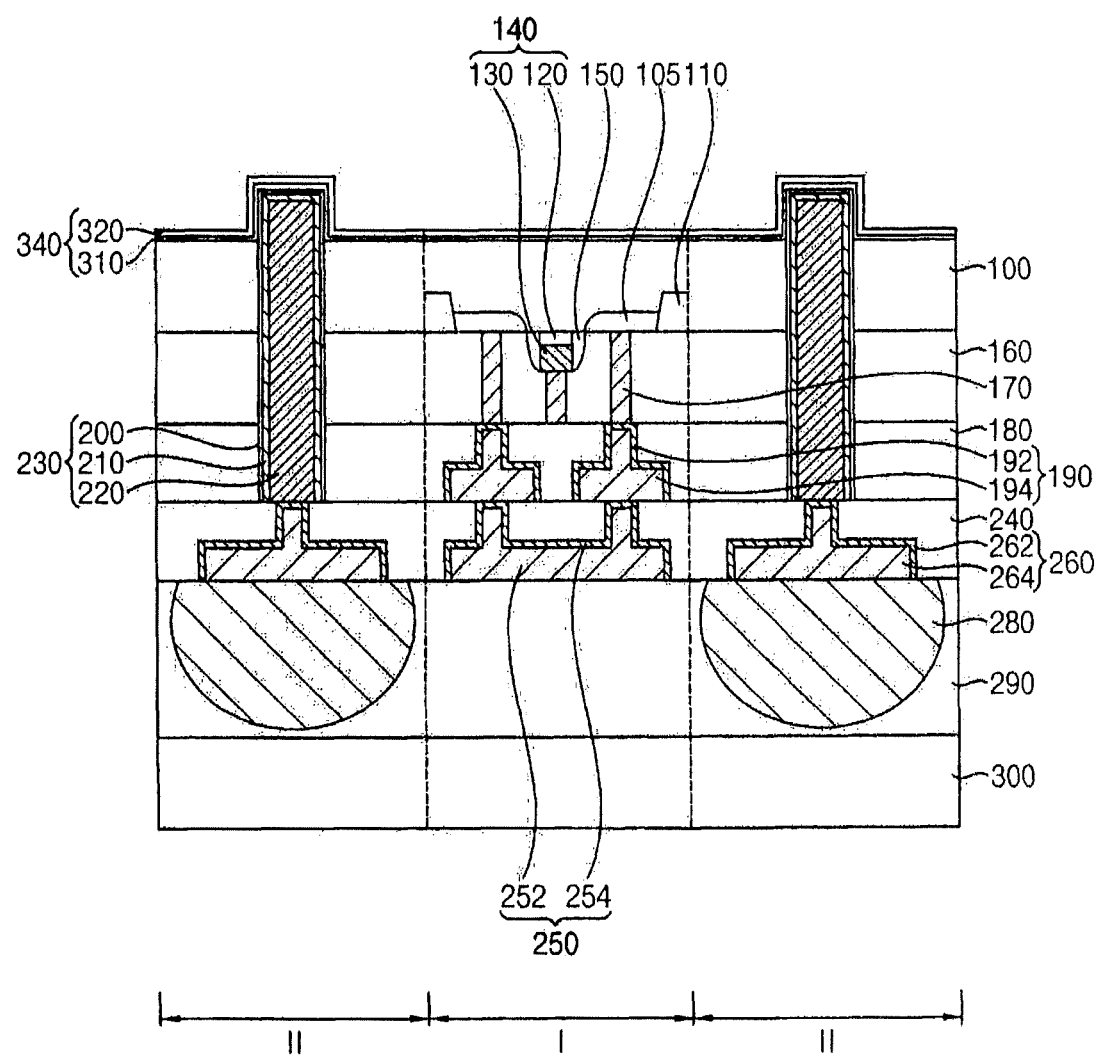

Referring to FIG. 14, the protection layer structure 340 may be formed to include the first oxide layer 310 and the nitride layer 320. Thus, in the subsequent process illustrated with reference to FIG. 17A, only the first oxide layer pattern 315 and the nitride layer pattern 325 may be formed. However, for convenience the protection layer structure 340 including the first oxide layer 310, the nitride layer 320 and the second oxide layer 330 sequentially stacked is illustrated hereinafter.

Figure 15:
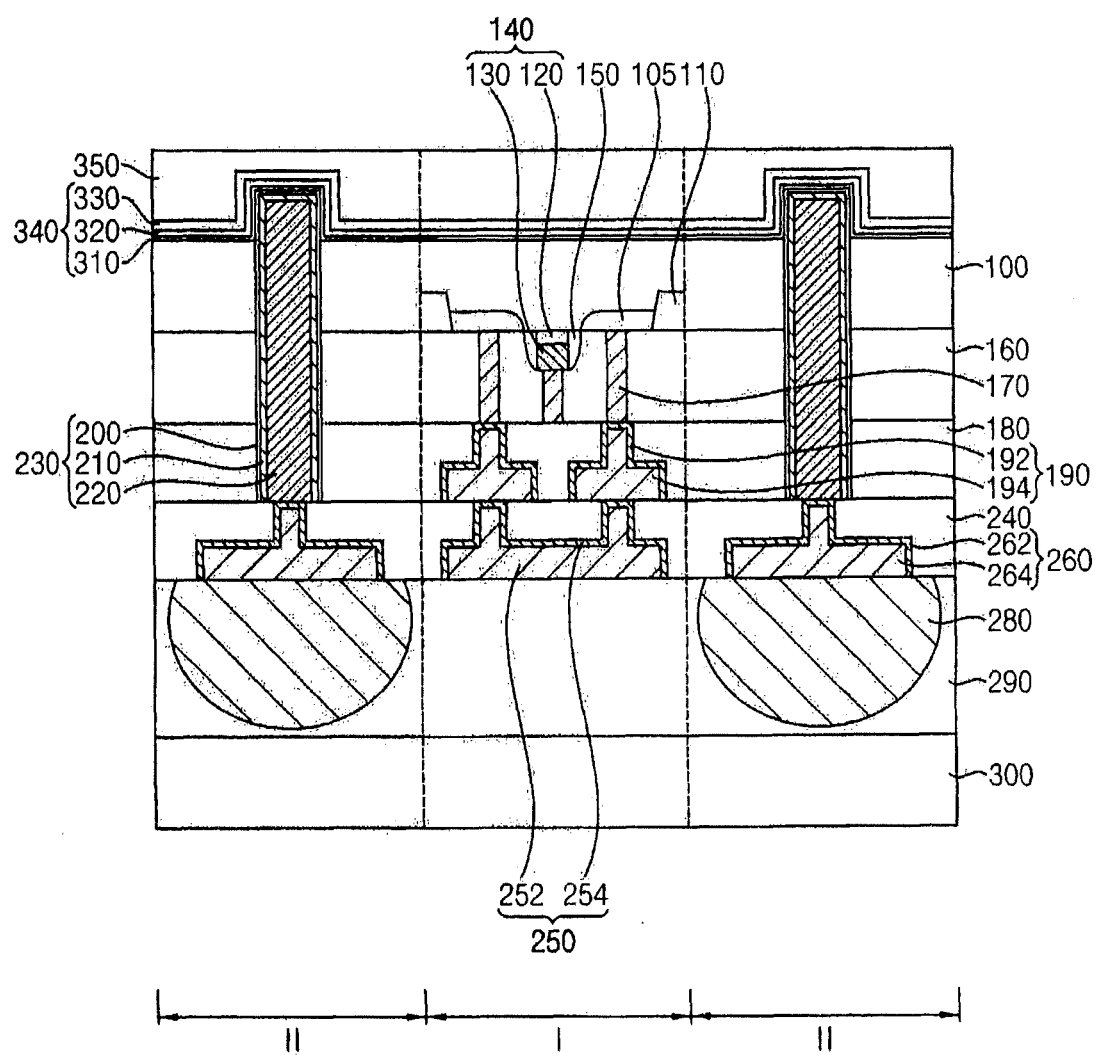

Referring to FIG. 15, a photoresist layer 350 may be formed on the protection layer structure 340.

In example embodiments, the photoresist layer 350 may be formed to have a top surface higher than that of a portion of the protection layer structure 340 on the exposed portion of the preliminary via structure 230 above the second surface 102 of the substrate 100.

Figure 16:
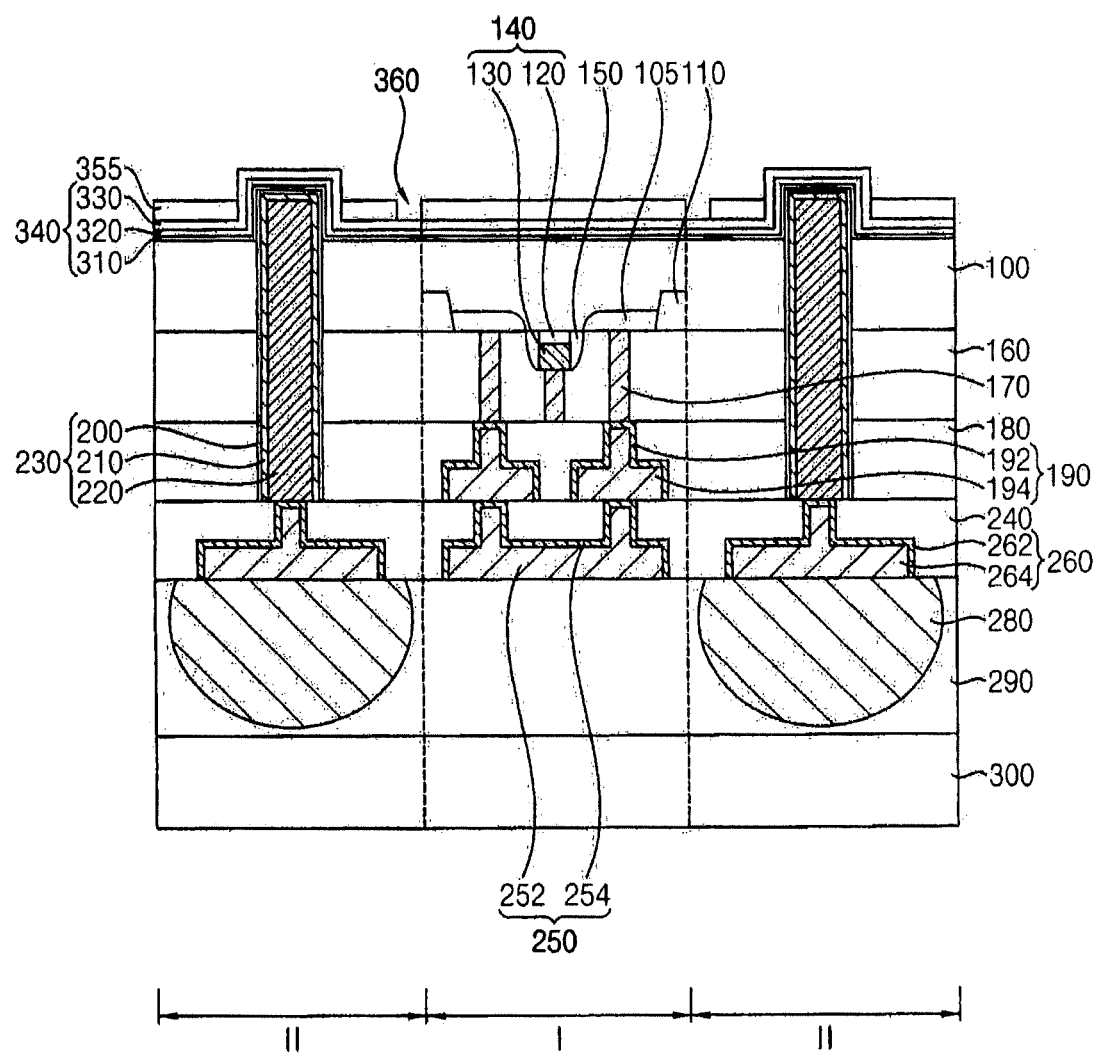

Referring to FIG. 16, the photoresist layer 350 may be patterned by an exposure process and a development process to form a second photoresist pattern 355 on the protection layer structure 340.

In example embodiments, the second photoresist pattern 355 may be formed to have a first opening 360 to provide an alignment key. When the photoresist layer 350 is etched to form the second photoresist pattern 355, the portion of the protection layer structure 340 on the preliminary via structure 230 may be exposed.

Figure 17A:
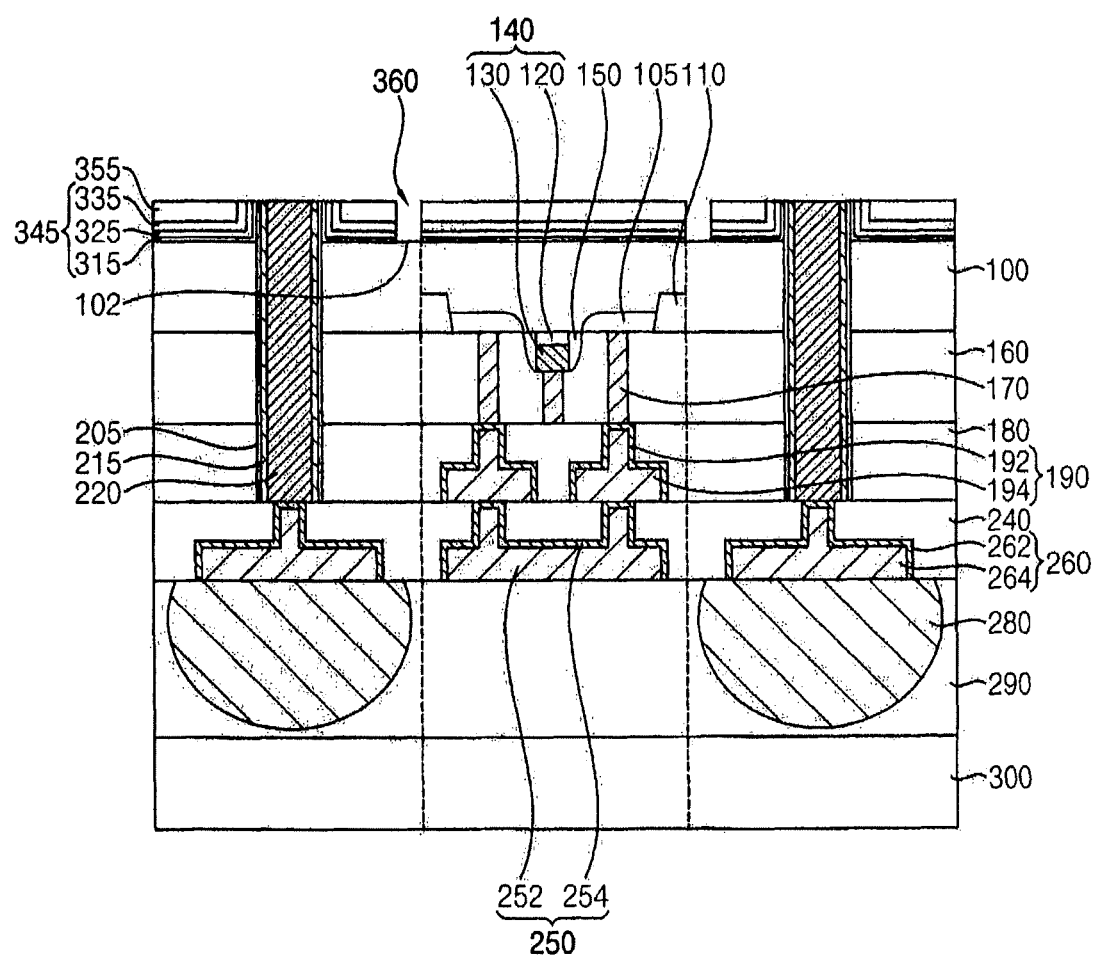

Referring to FIG. 17A, the protection layer structure 340 may be etched using the second photoresist pattern 355 as an etching mask to form a protection layer pattern structure 345.

In example embodiments, by the etching process, a portion of the protection layer structure 340 exposed by the first opening 360 may be etched to partially expose the second surface 102 of the substrate 100. Additionally, by the etching process, the exposed portion of the protection layer structure 340 on the preliminary via structure 230 may be etched to expose a portion of the preliminary via structure 230, and the exposed portion of the preliminary via structure 230 may be also partially etched.

In example embodiments, upper portions of the insulation layer 200 and the second barrier layer 210 may be removed, and thus an insulation layer pattern 205 and a second barrier layer pattern 215, respectively, may be formed. The protection layer pattern structure 345 may include the first oxide layer pattern 315, the nitride layer pattern 325 and the second oxide layer pattern 335 sequentially stacked on the second surface 102 of the substrate 100.

In example embodiments, top surfaces of the insulation layer pattern 205, the second barrier layer pattern 215 and the second conductive layer 220 protruding from the second surface 102 of the substrate 100 may be substantially coplanar with one another, and the protection layer pattern structure 345 may surround sidewalls of the protruding portions of the insulation layer pattern 205, the second barrier layer pattern 215 and the second conductive layer 220.

Figure 17B:
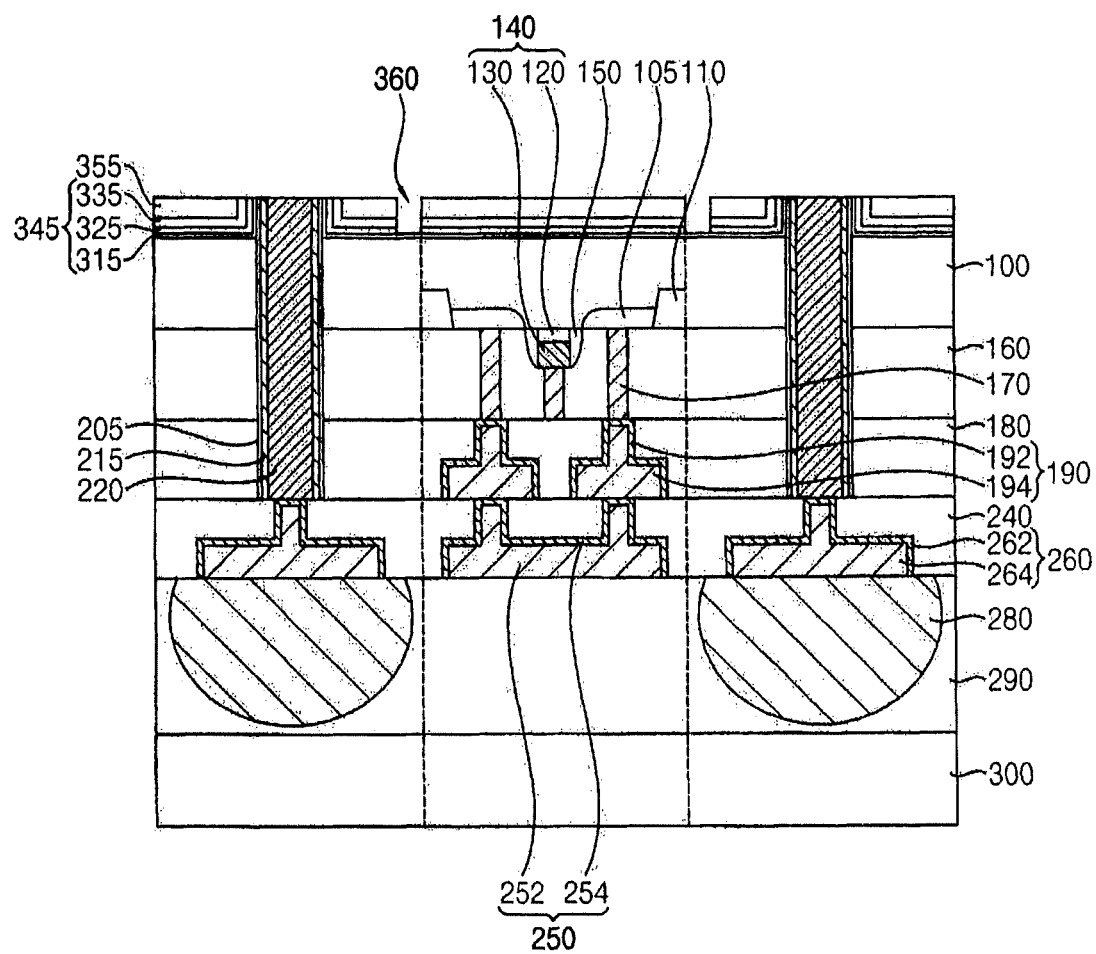
Figure 17C:
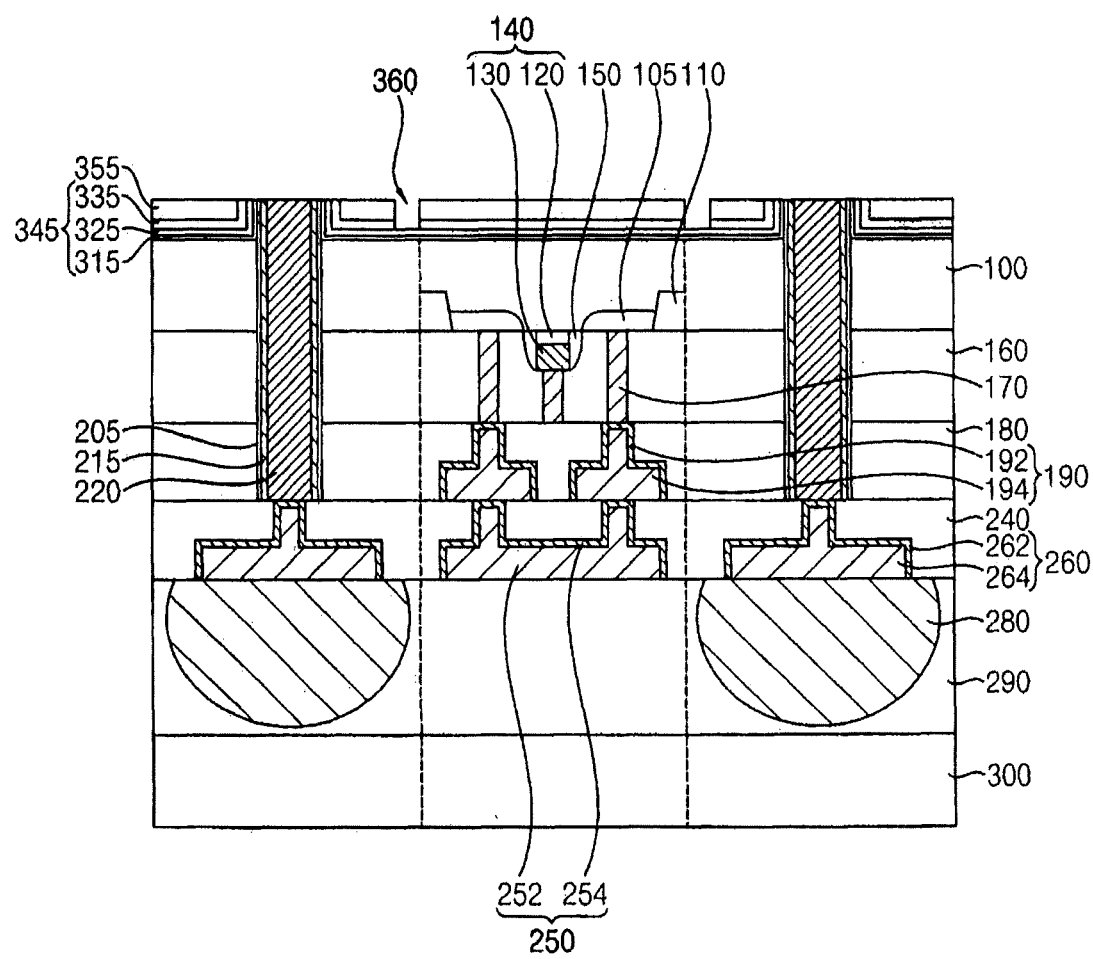
Figure 17D:
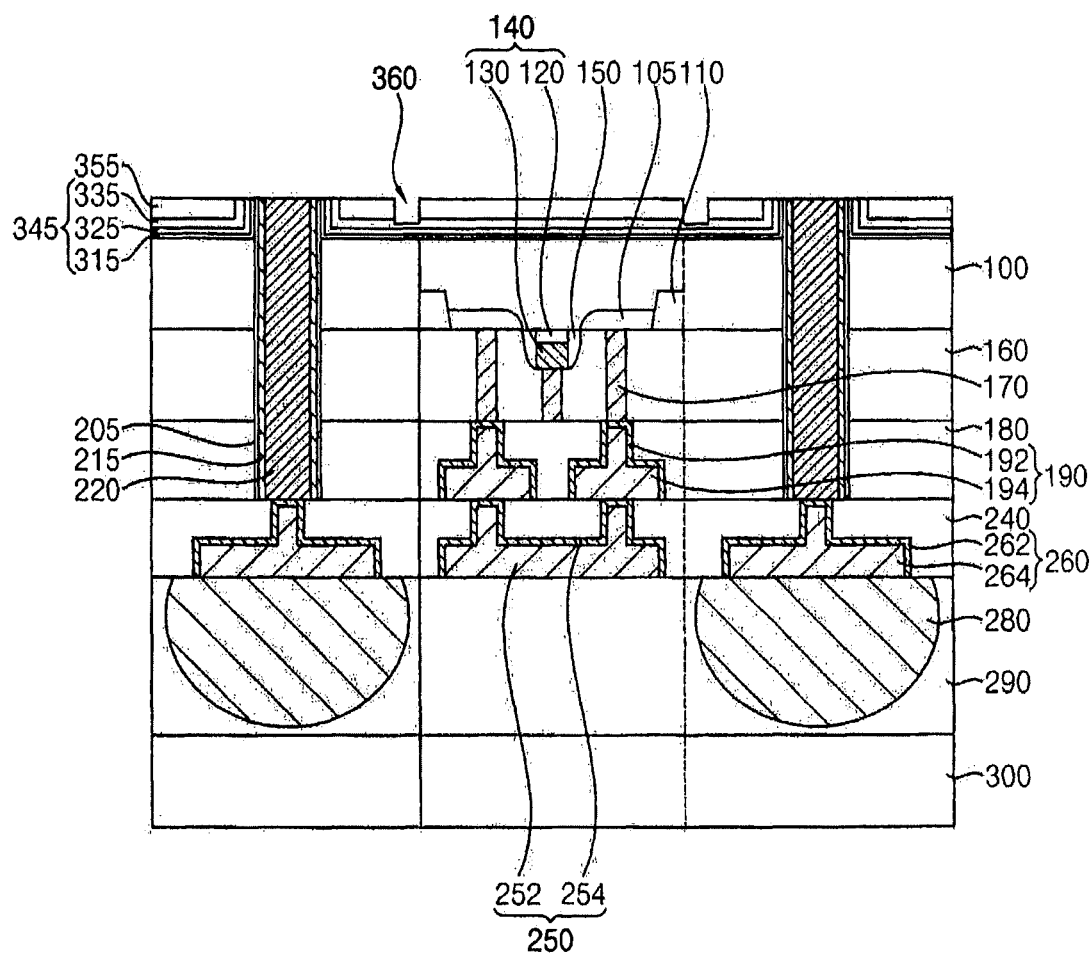
Figure 17D:
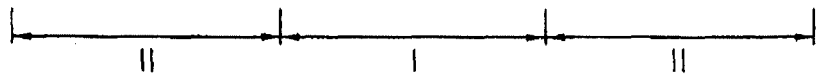

Referring to FIGS. 17B, 17C and 17D, by the etching process, the portion of the protection layer structure 340 exposed by the first opening 360 may not be completely removed, and thus the second surface 102 of the substrate 100 may not be exposed. That is, FIG. 17B shows that portions of the second oxide layer pattern 335 and the nitride layer pattern 325 under the first opening 360 may be removed, however, a portion of the first oxide layer pattern 315 under the first opening 360 may remain. FIG. 17C shows that a portion of the second oxide layer pattern 335 under the first opening 360 may be removed, however, portions of the nitride layer pattern 325 and the first oxide layer pattern 315 may remain. FIG. 17D shows that a portion of the second oxide layer pattern 335 under the first opening 360 may be partially removed and partially remain, and portions of the nitride layer pattern 325 and the first oxide layer pattern 360 may remain.

That is, the etching process may be performed to form an alignment key in the protection layer structure 340, and the second surface 102 of the substrate 100 may not be exposed if the alignment key may be formed. However, for the convenience of explanations, as shown in FIG. 17A, only the case in which the second surface 120 of the substrate 100 is exposed is illustrated hereinafter.

Figure 18A:
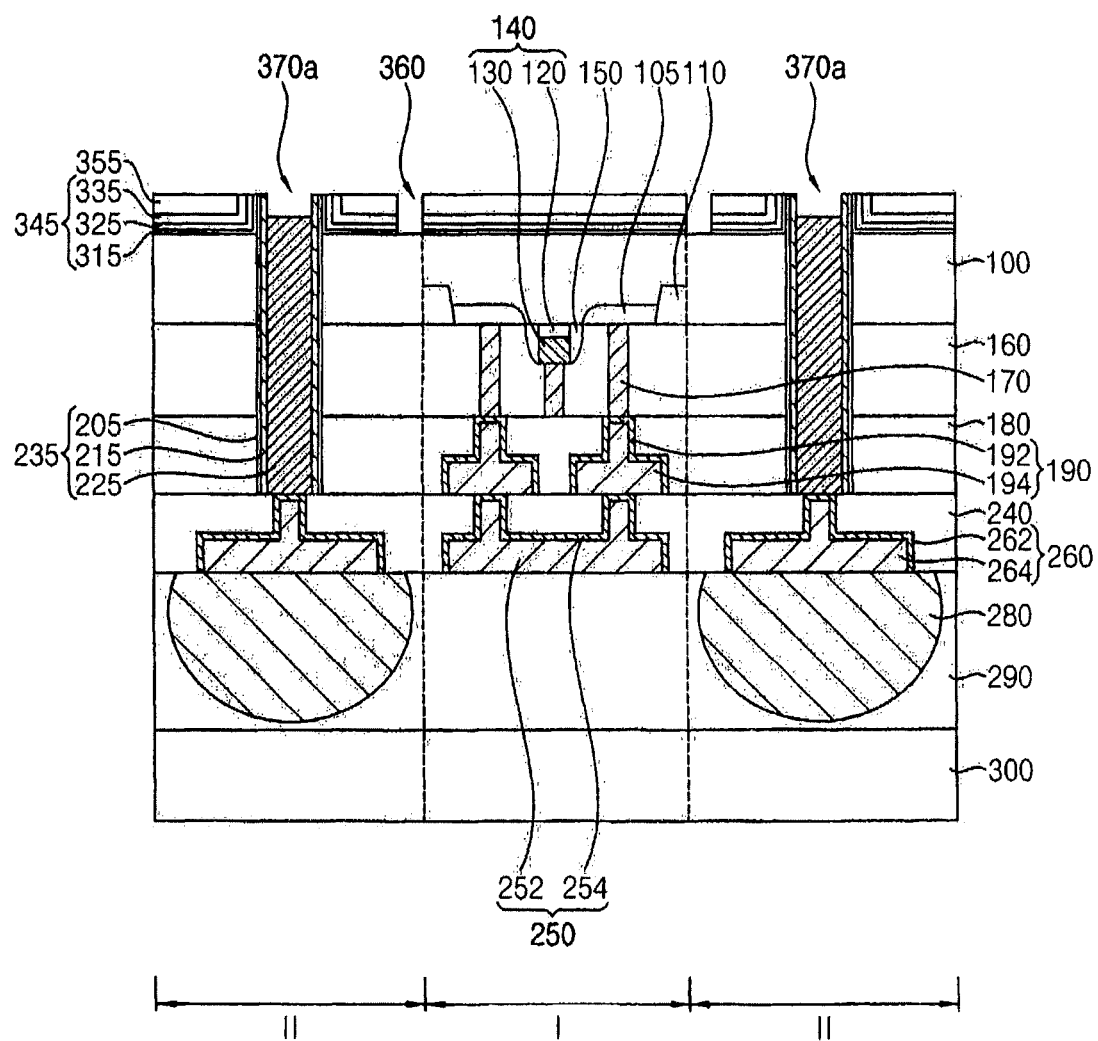

Referring to FIG. 18A, an upper portion of the second conductive layer 220 may be removed to form a first recess 370a, and thus the second conductive layer 220 may be transformed into a second conductive pattern 225.

In example embodiments, the upper portion of the second conductive layer 220 may be removed by a dry etching process or a wet etching process, and a top surface of the second conductive pattern 225 may be lower than those of the insulation layer pattern 205 and the second barrier layer pattern 215.

The second conductive pattern 225 and the second barrier layer pattern 215 surrounding a sidewall of the second conductive pattern 225 may form a via electrode, and the via electrode and the insulation layer pattern 205 surrounding a sidewall of the via electrode may form a via structure 235. A top surface of the second conductive pattern 225 at a central portion of the via structure 235 may be lower than those of the second barrier layer pattern 215 and the insulation layer pattern 205 surrounding the sidewall of the second conductive pattern 225, and thus the via structure 235 may have a top surface of which a central portion may be stepped down relative to a top surface of the second barrier layer pattern 215.

Figure 19A:
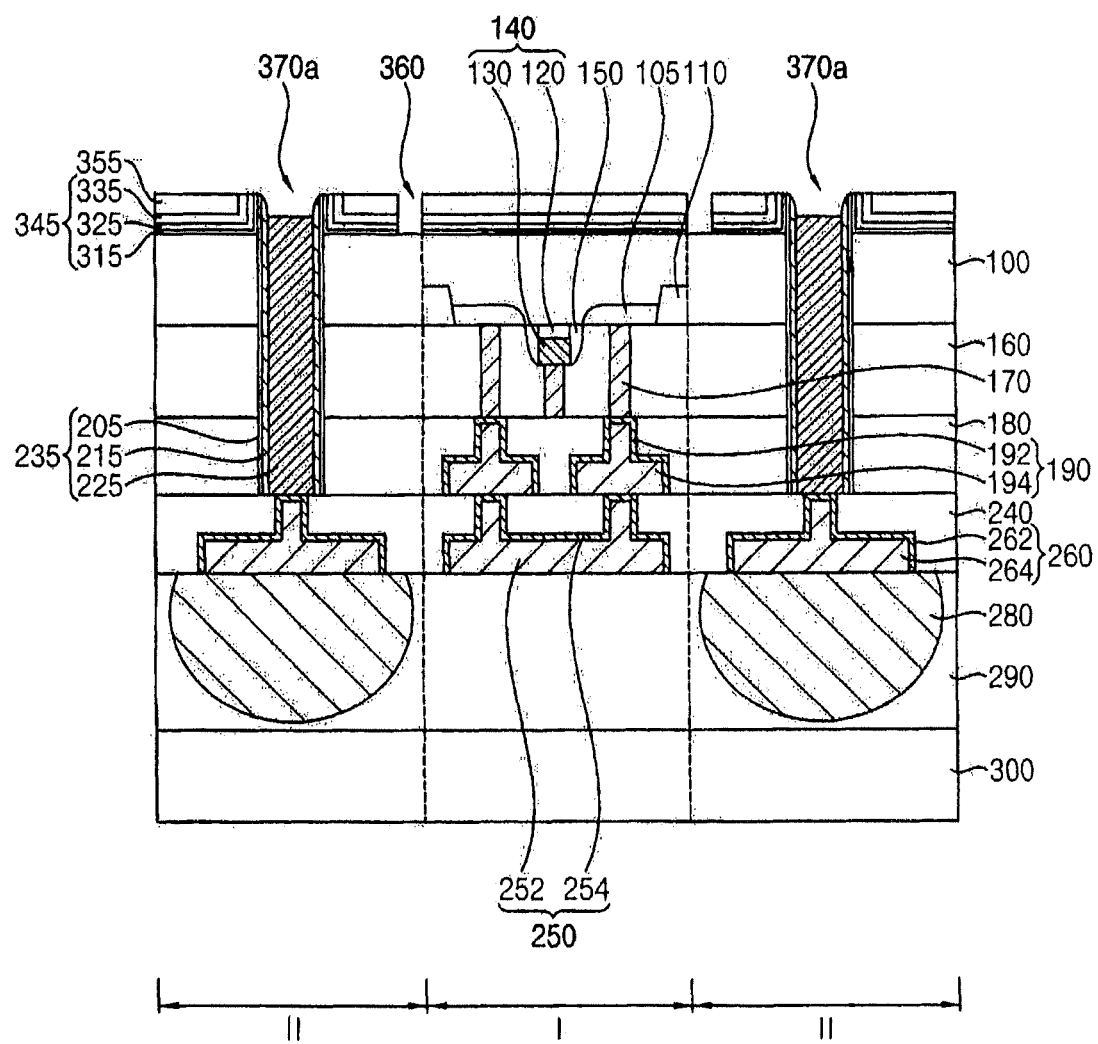

Referring to FIG. 19A, when the upper portion of the second conductive layer 220 is removed by a wet etching process to form the first recess 370a, upper portions of the second barrier layer pattern 215 and the insulation layer pattern 205 surrounding the sidewall of the second conductive layer 220 may be also partially removed by the wet etching process. Thus, a portion of the second barrier layer pattern 215 above the second conductive pattern 225 exposed by the first recess 370a may have a gradually decreasing width from a bottom toward a top thereof. Additionally, a portion of the insulation layer pattern 205 adjacent to the portion of the second barrier layer pattern 215 above the second conductive pattern 225 exposed by the first recess 370a may have a decreasing width from a bottom toward a top thereof. Thus, the upper portions of the second barrier layer pattern 215 and/or the insulation layer pattern 205 may have inner walls that are slanted.

That is, when the upper portion of the second conductive layer 220 is removed by a dry etching process, portions of the second barrier layer pattern 215 and/or the insulation layer pattern 205 adjacent to the first recess 370a may have substantially vertical sidewalls. When the upper portion of the second conductive layer 220 is removed by a wet etching process, the portions of the second barrier layer pattern 215 and/or the insulation layer pattern 205 adjacent to the first recess 370a may have gradually decreasing widths or substantially vertical sidewalls according to the process conditions of the wet etching process and/or the size of the first recess 370a.

Hereinafter, for the convenience of explanations, as shown in FIG. 18A, only the second barrier layer pattern 215 and the insulation layer pattern 205 having substantially vertical sidewalls will be illustrated.

Figure 18B:
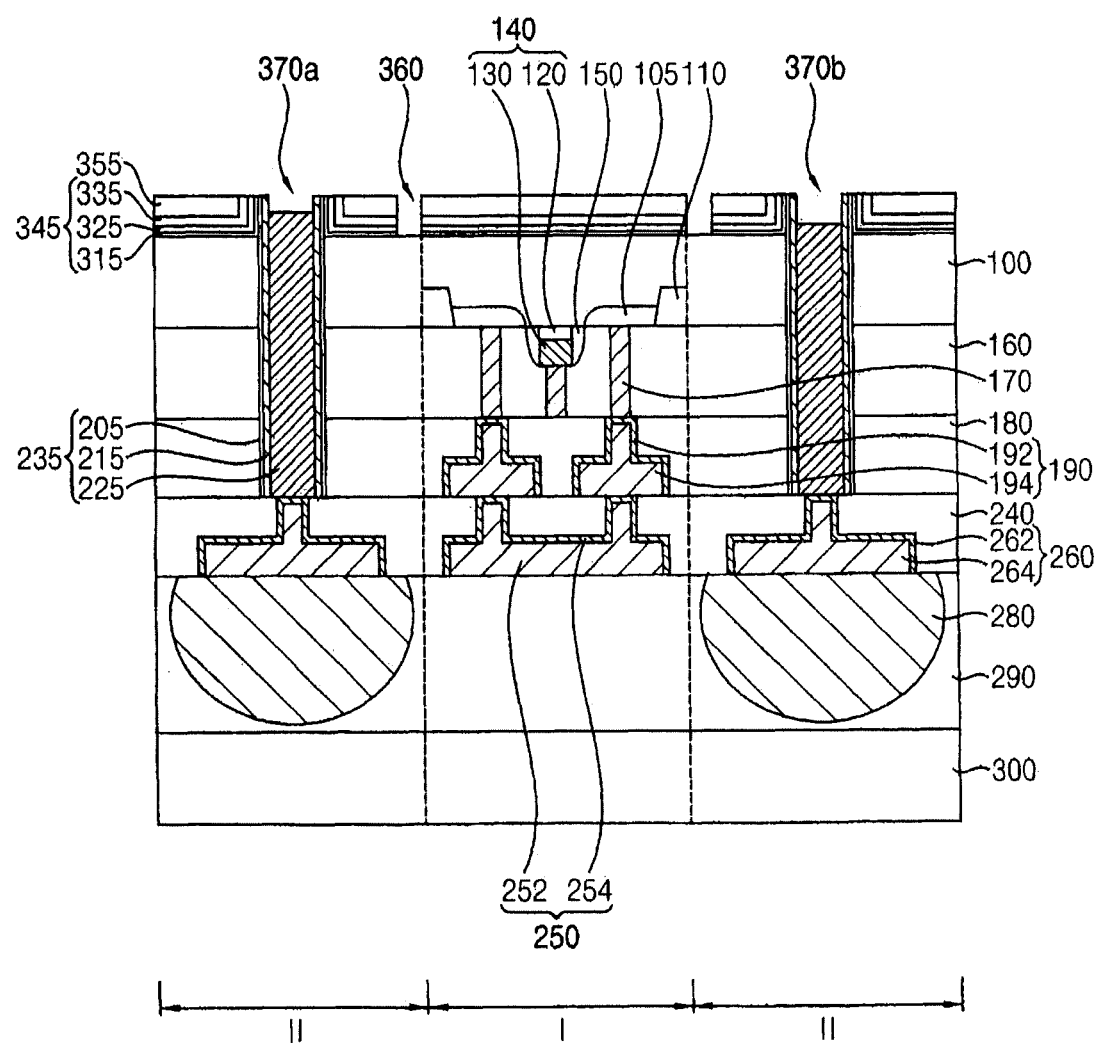
Figure 19B:
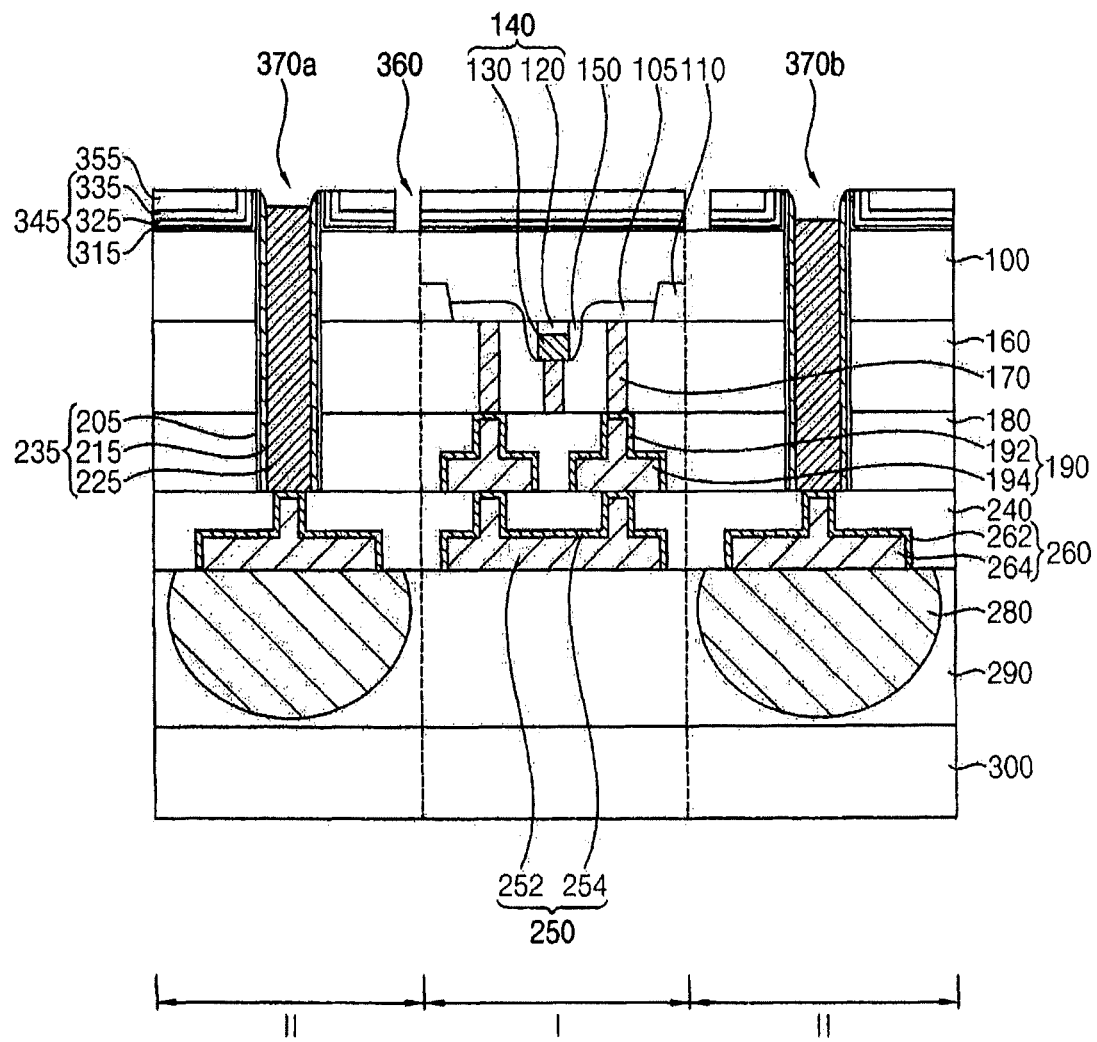

Referring to FIGS. 18B and 19B, when upper portions of a plurality of second conductive layers 220 are removed by a wet etching process, they may not be etched to the same degree according to the positions thereof, and thus the recesses on the second conductive patterns 225 may have different depths from each other. That is, for example, first and second recesses 370a and 370b having different depths may be formed by the wet etching process.

In this case, during a process for forming pads 400 (see FIG. 25), top surfaces of the pads 400 formed on the second conductive patterns 225 may have different heights, and semiconductor devices having the pads 400 are shown in FIGS. 1B, 2B, 4B and 5B. That is, one of the pads 400 filling the first recess 370a having a relatively shallow depth may have a top surface higher than that of another of the pads 400 filling the second recess 370b. However, for the convenience of explanations, only the first recesses 370a having substantially the same depths on the second conductive patterns 225 will be illustrated hereinafter.

Figure 20A:
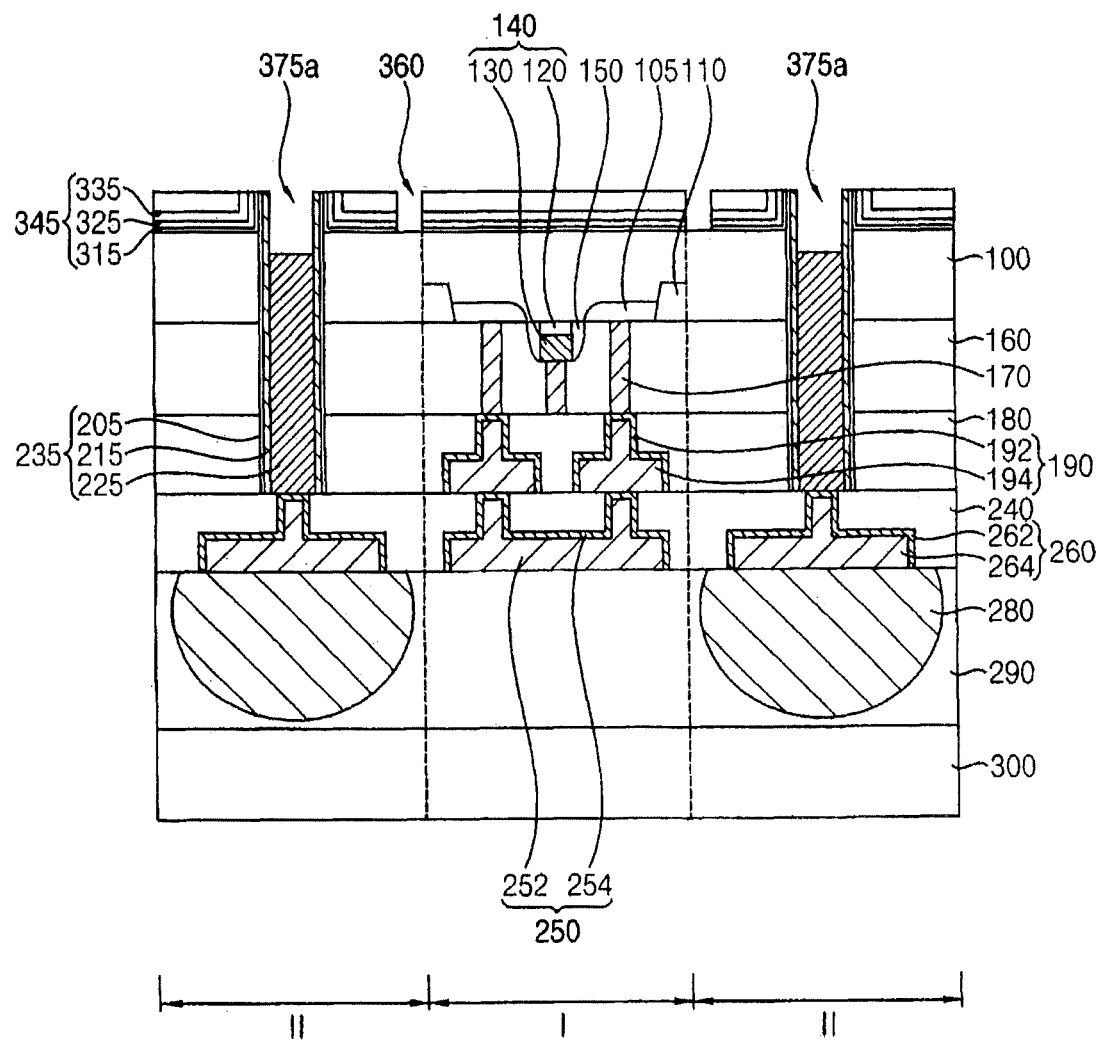

Referring to FIG. 20A, an upper portion of the second conductive layer 220 may be removed to form a third recess 375a, and a top surface of the second conductive pattern 225 may be lower than the second surface 102 of the substrate 100.

Figure 21A:
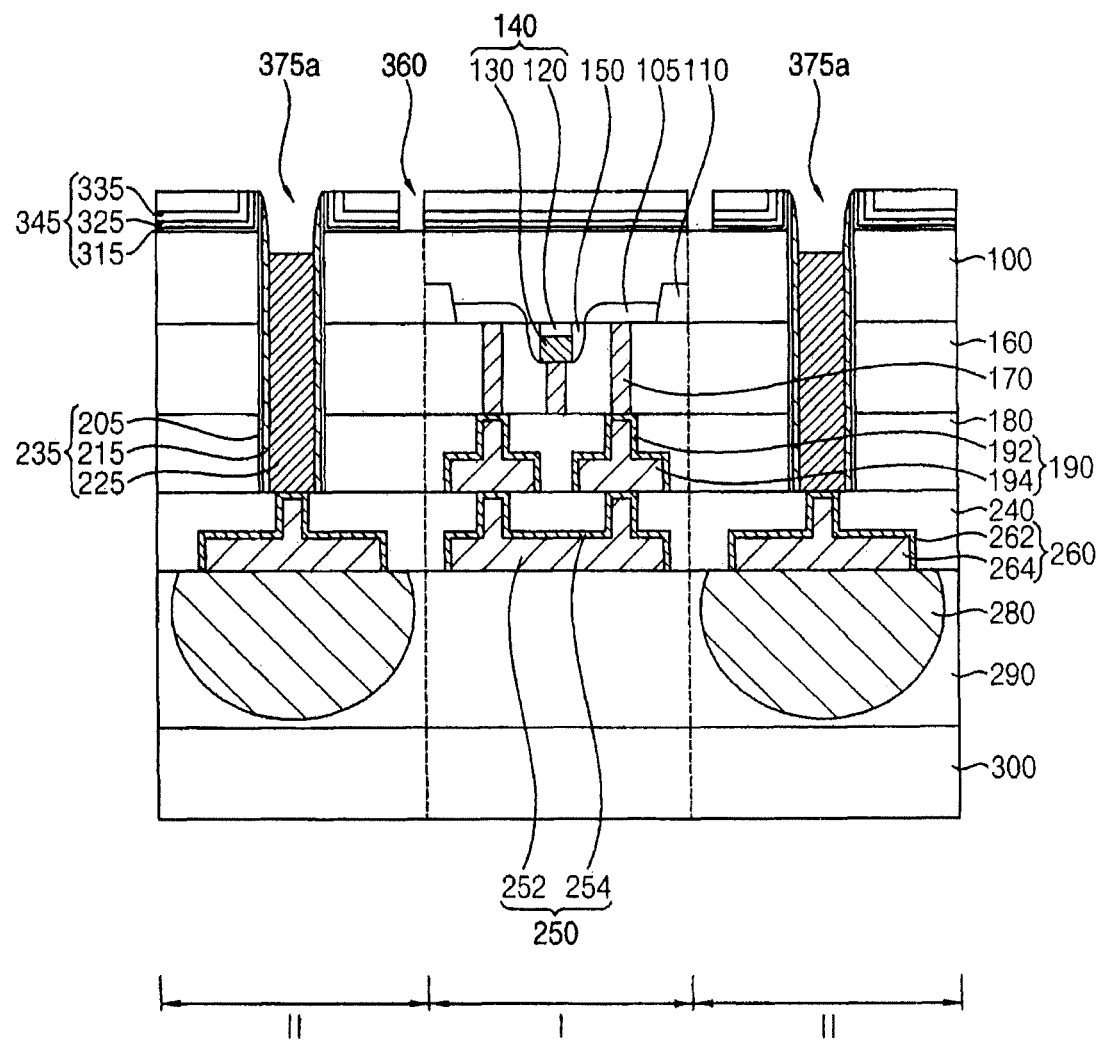

Further referring to FIG. 21A, as similar to FIG. 19A, an upper portion of the second conductive layer 220 may be removed by a wet etching process to form a third recess 375a, and upper portions of the second barrier layer pattern

215 and the insulation layer pattern 205 may be partially removed by the wet etching process. Thus, a portion of the second barrier layer pattern 215 above the second conductive pattern 225 exposed by the third recess 375a may have a decreasing width from a bottom toward a top thereof, and a portion of the insulation layer pattern 205 adjacent to the portion of the second barrier layer pattern 215 above the second conductive pattern 225 may have a decreasing width from a bottom toward a top thereof.

However, for the convenience of explanations, only the first recess 370a formed by removing the upper portion of the second conductive layer 220 is illustrated hereinafter.

Figure 20B:
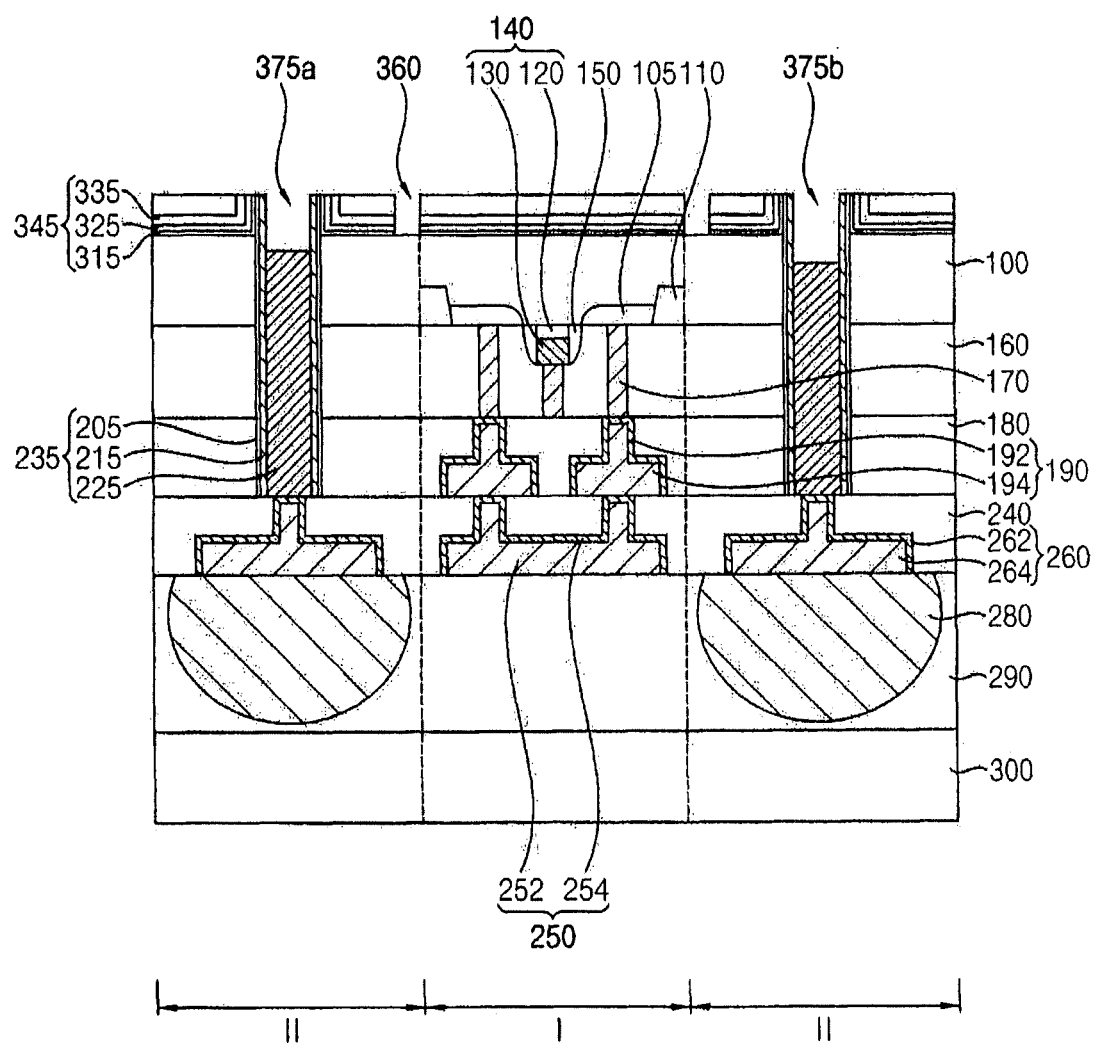
Figure 21B:
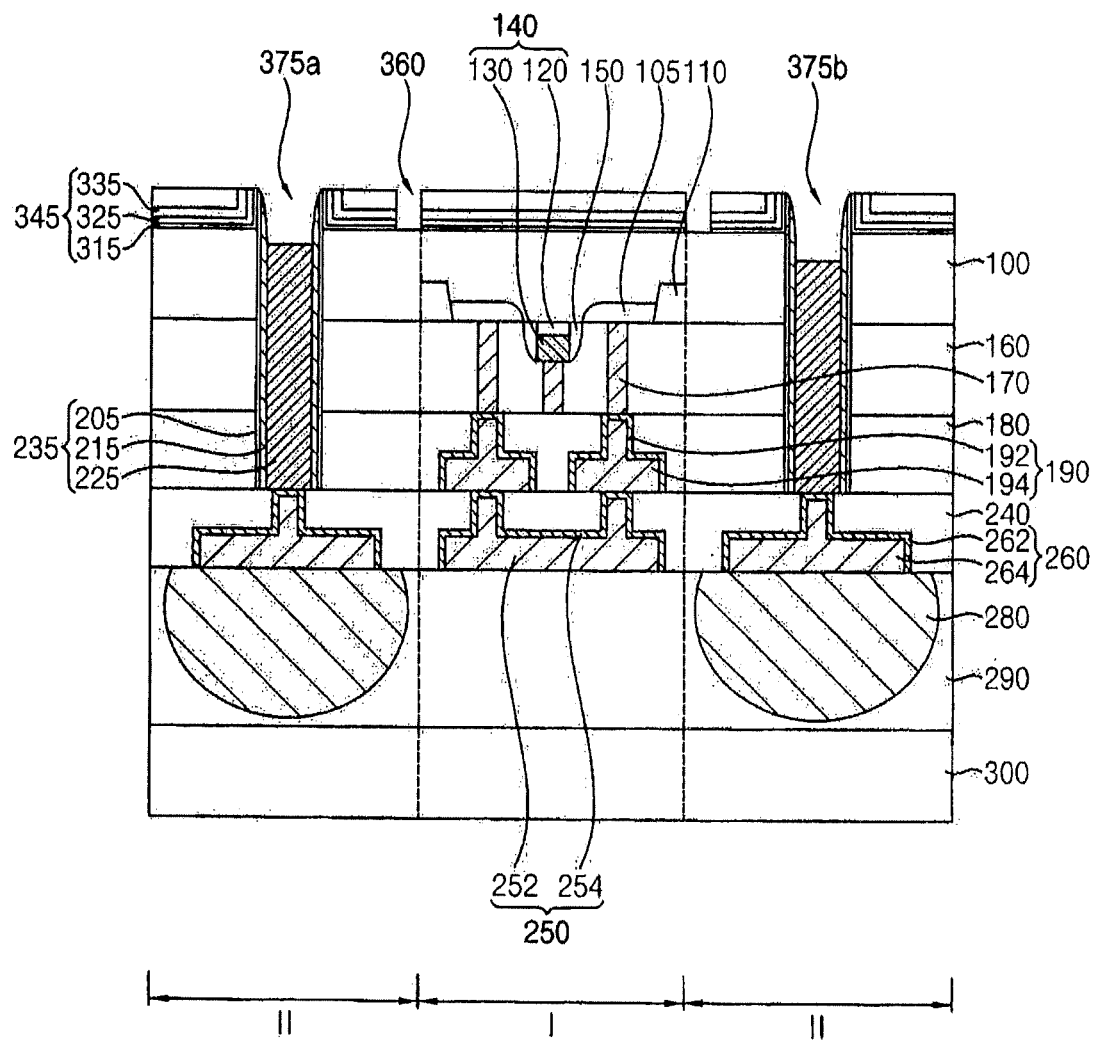

Referring to FIGS. 20B and 21B, as similar to FIGS. 18B and 19B, when upper portions of a plurality of second conductive layers 220 are removed by a wet etching process, they may not be etched to the same degree according to the positions thereof, and thus the recesses on the second conductive patterns 225 may have different depths from each other. That is, for example, third and fourth recesses 375a and 375b having different depths may be formed by the wet etching process.

Figure 3B:
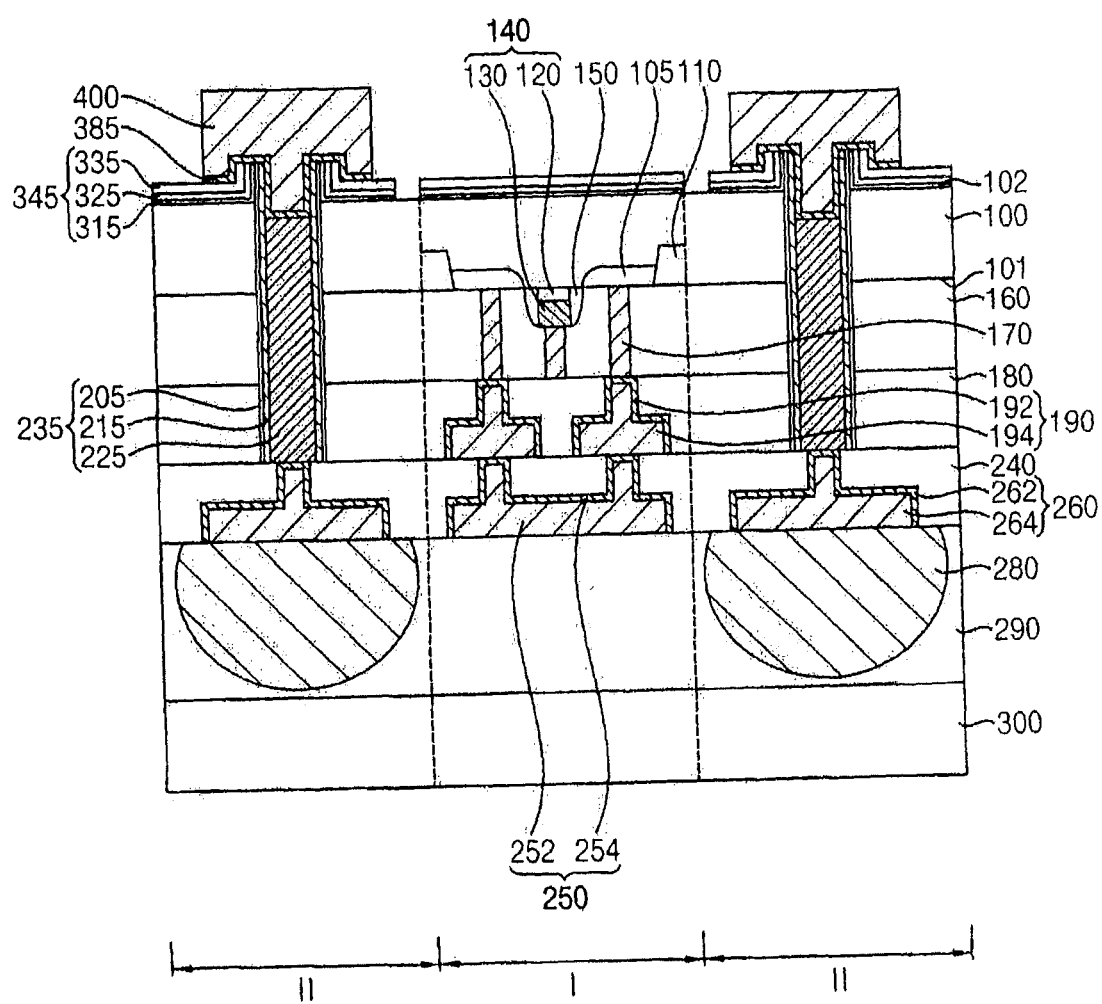
Figure 6B:
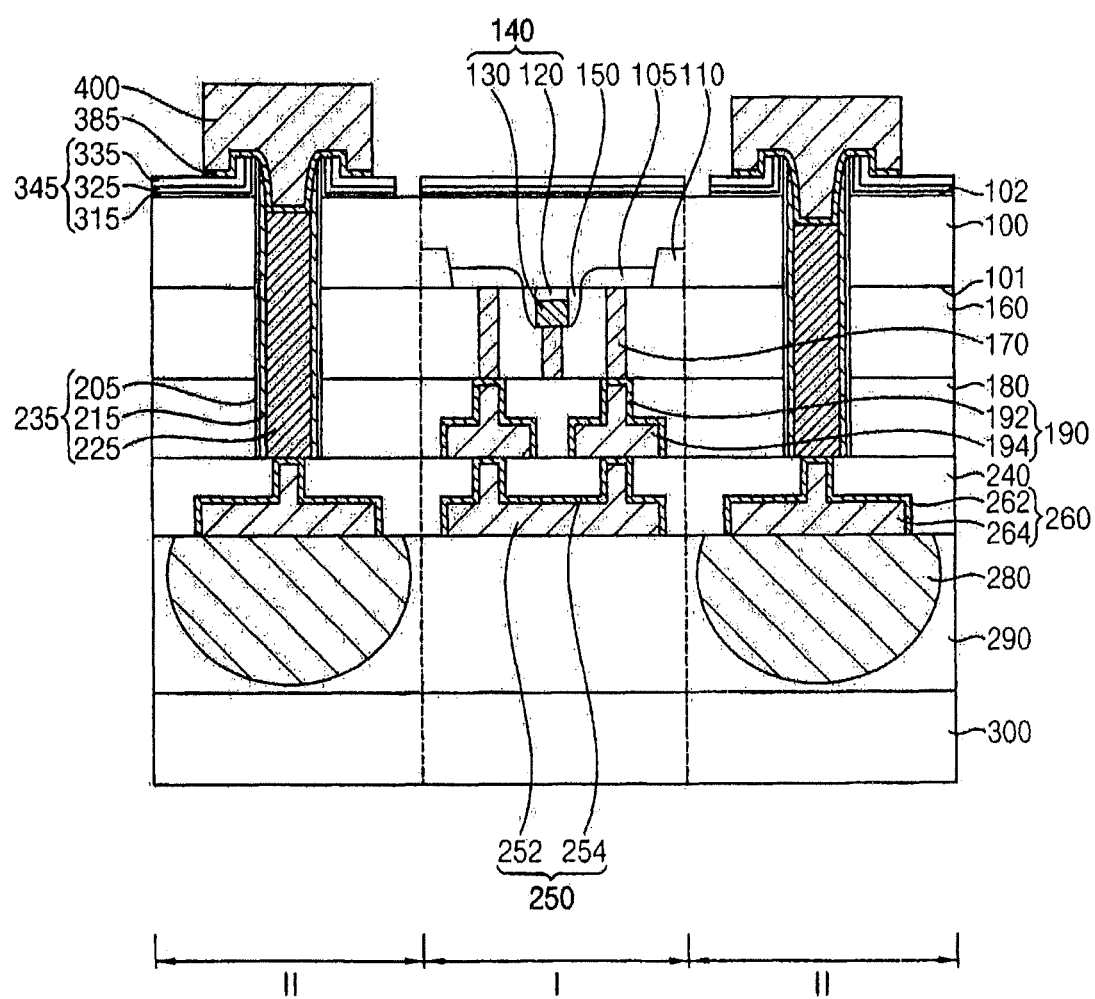

In this case, during a process for forming pads 400 (see FIG. 25), top surfaces of the pads 400 formed on the second conductive patterns 225 may have different heights, and semiconductor devices having the pads 400 are shown in FIGS. 3B and 6B. For the convenience of explanations, only the third recesses 375a having substantially the same depths on the second conductive patterns 225 is illustrated hereinafter.

Figure 22:
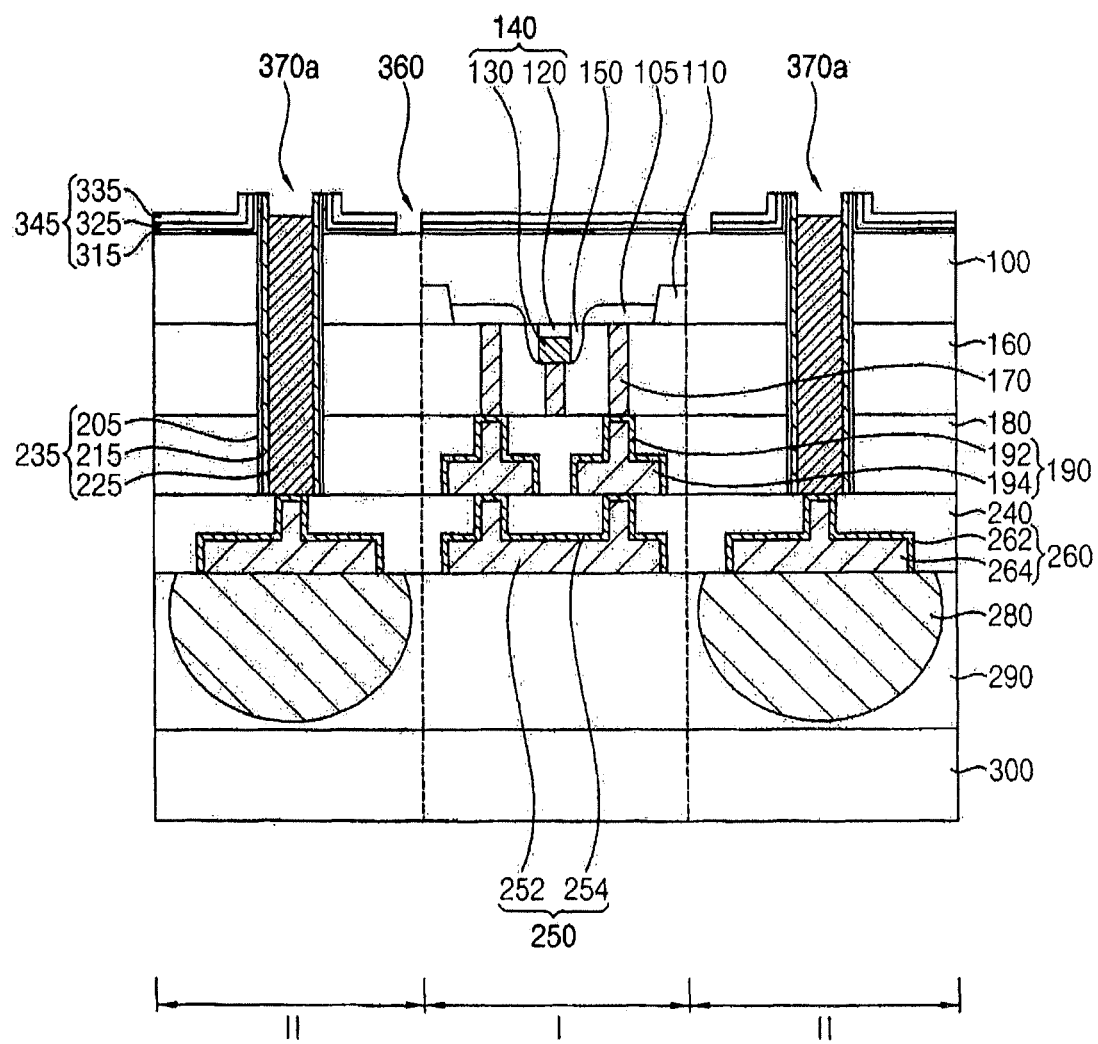

Referring to FIG. 22, the second photoresist pattern 355 remaining on the protection layer pattern structure 345 may be removed.

In example embodiments, the second photoresist pattern 355 may be removed by an ashing process and/or a stripping process.

A portion of the protection layer pattern structure 345 surrounding a sidewall of the via structure 235 may have a top surface higher than that of other portions of the protection layer pattern structure 345. Thus, the whole top surface of the via structure 235 together with the protection layer pattern structure 345 may not be flat but stepped, particularly toward the center of the protection layer pattern 345.

Figure 23:
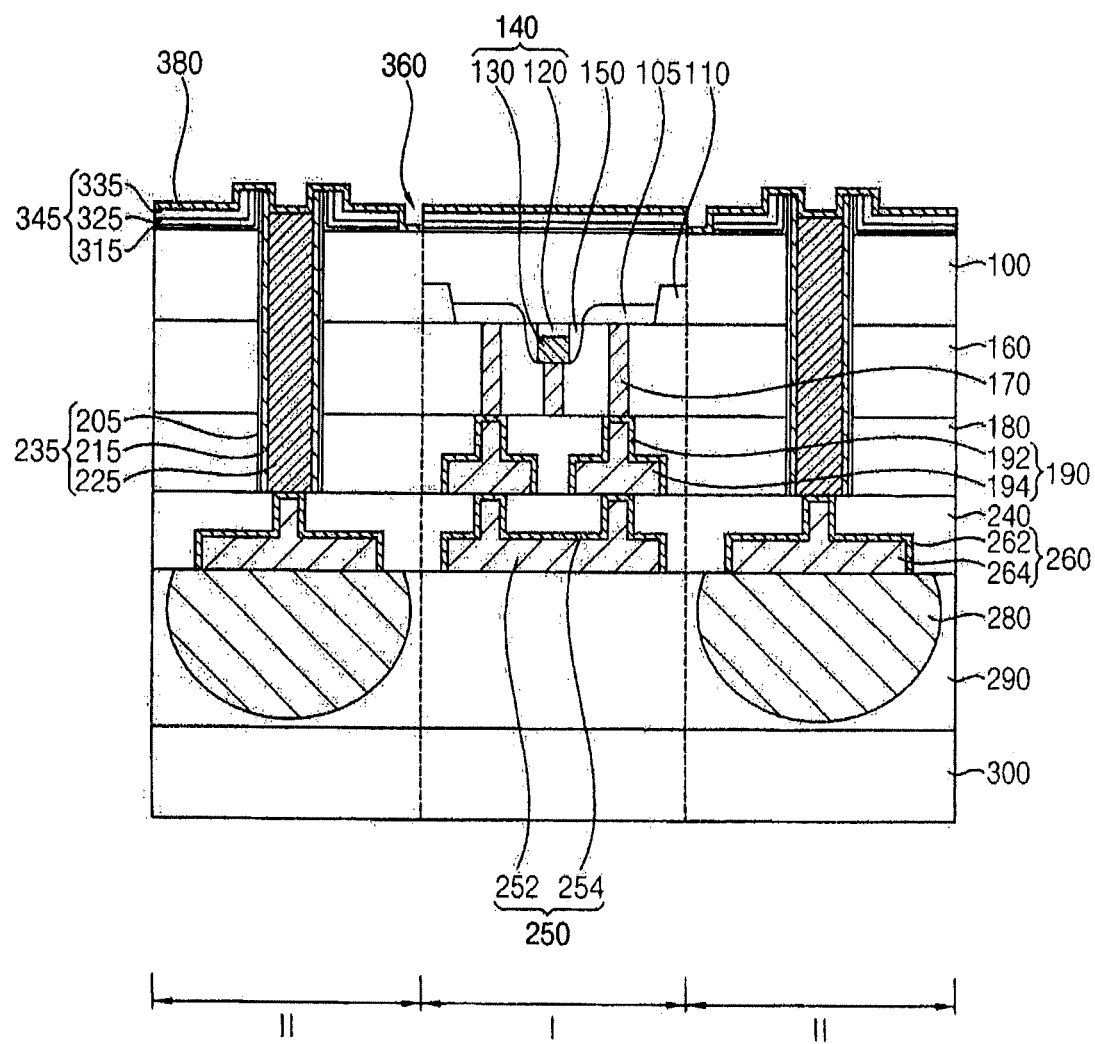

Referring to FIG. 23, a third seed layer 380 may be conformally formed on the via structure 235 and the protection layer pattern structure 345, and may have an uneven top surface.

The third seed layer 380 may be formed to include, e.g., copper, by a physical vapor deposition (PVD) process.

Figure 24:
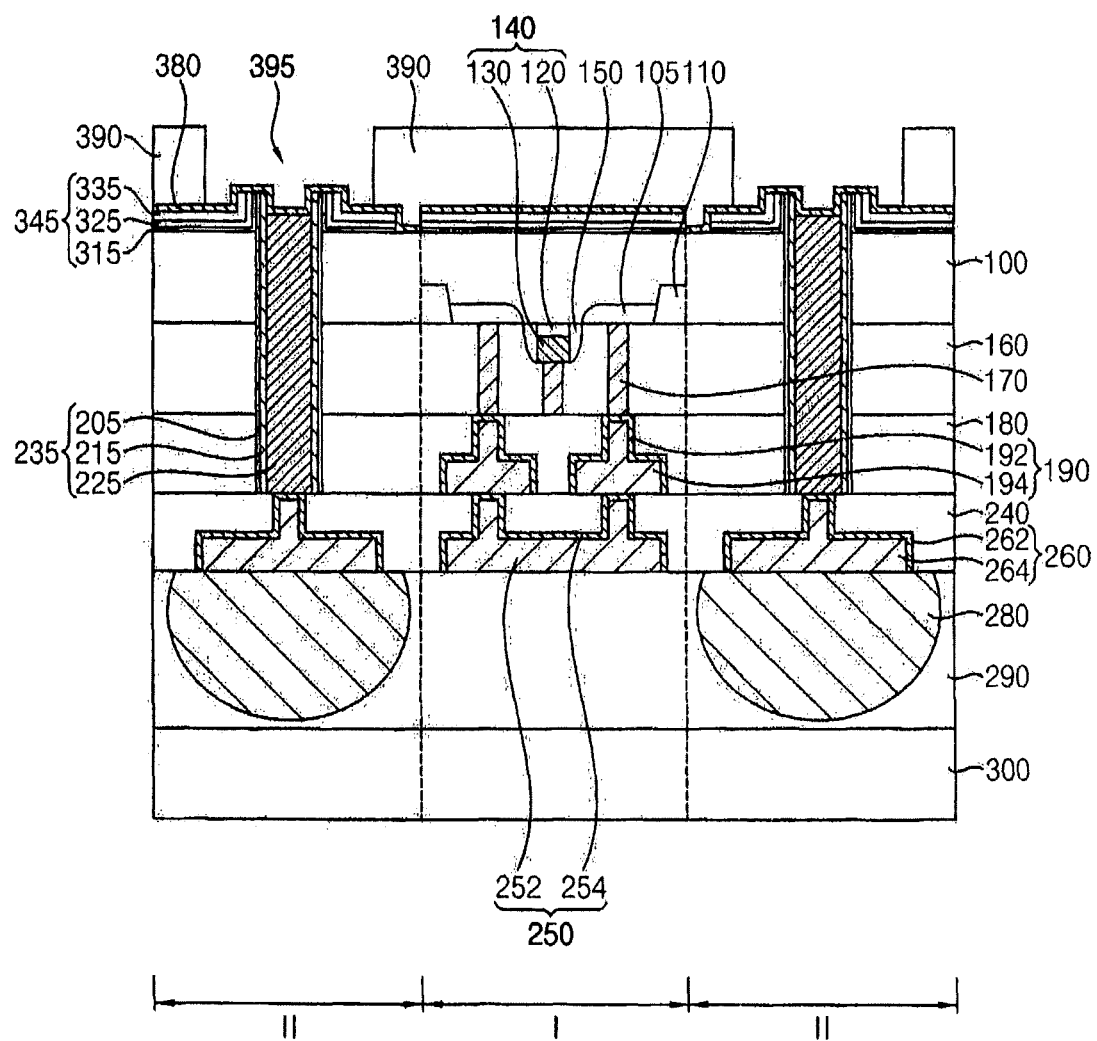

Referring to FIG. 24, a third photoresist pattern 390 may be formed on the third seed layer 380.

In example embodiments, the third photoresist pattern 390 may be formed to have a second opening 395 exposing at least a portion of the third seed layer 380 on the top surface of the via structure 235. The second opening 395 may expose a portion of the third seed layer 380 on the top surface of the portion of the protection layer pattern structure 345 surrounding the sidewall of the via structure 235.

Figure 25:
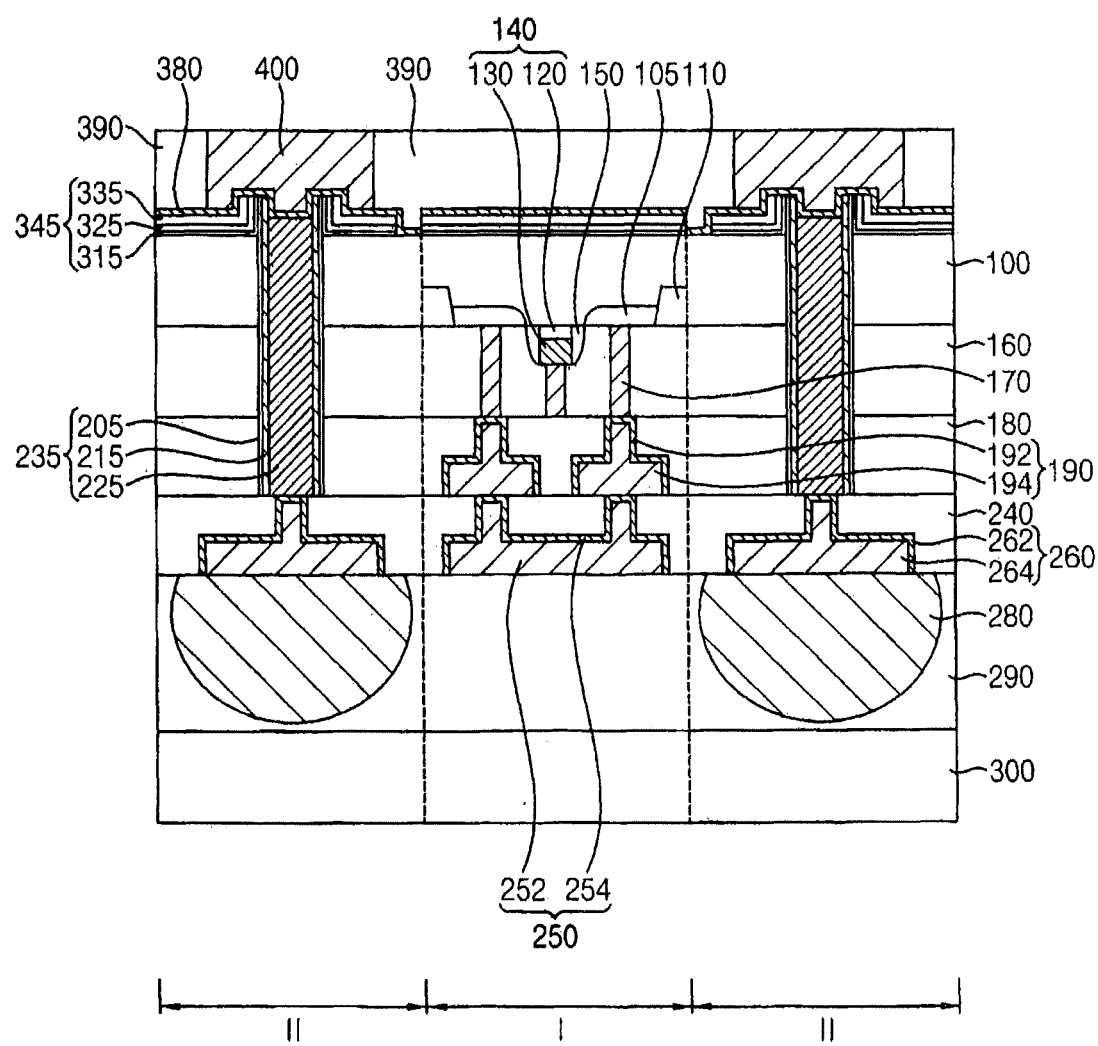

Referring to FIG. 25, an electroplating process may be performed to form the pad 400 filling the second opening 395.

In example embodiments, the electroplating process may be performed using a plating solution including an electrolyte solution containing nickel ion, and an additive. The additive may include at least a leveler, and further include a suppressor and an accelerator. The leveler may include a polymer, e.g., polyimine, polyamide, etc., the suppressor may include a polymer, e.g., polyethylene glycol (PEG), and the accelerator may include an organic sulfur compound.

The leveler may be disposed mostly at an entrance of the second opening 395 to delay the nickel plating. The accelerator may have a relatively small molecular size, and thus may easily penetrate into the concave top surface of the via structure 235. However, the suppressor may have a relatively large molecular size, and thus may not easily penetrate into the second opening 395 and may be disposed mostly on a top surface of the third photoresist pattern 390. Thus, the nickel plating may be accelerated by the accelerator in the second opening 395, and may be delayed by the leveler and/or the suppressor at the entrance of the second opening 395 and on the third photoresist pattern 390. Accordingly, an upper portion of the second opening 395 may not be filled before the second opening 395 may be filled entirely, and further the pad 400 may be formed to have a flat top surface.

The bottom surface of the second opening 395, i.e., a top surface of the third seed layer 380 may not be flat, however, the pad 400 may have a flat top surface regardless of the profile of the top surface of the third seed layer 380, because of the leveler and/or the suppressor of the plating solution used in the electroplating process.

Referring to FIG. 1 again, after removing the third photoresist pattern 390, a portion of the third seed layer 380 not covered by the pad 400 may be removed.

In example embodiments, the third photoresist pattern 390 may be removed by an ashing process and/or a stripping process, and the third seed layer 380 may be partially removed to form a seed pattern 385. The seed pattern 385 and the pad 400 sequentially stacked may form a pad structure.

As illustrated above, in example embodiments, after forming the protection layer structure 340 on the exposed preliminary via structure 230 above the second surface 102 of the substrate 100, no CMP process may be performed to expose the preliminary via structure 230. Rather, in some embodiments, via structure 235 may be partially removed by a wet etching process and an electroplating process using a plating solution including a leveler may be performed to form a pad having a flat to surface on the TSV. Thus, the via structure 235 may not be damaged, and the cost for performing the CMP process may be reduced.

Even though the third seed layer 380 may have the uneven top surface as the upper portion of the preliminary via structure 230 may be removed by a wet etching process, the plating solution used in the electroplating process may include the leveler and/or the suppressor, and thus the pad 400 formed by the electroplating process may have the flat top surface. Thus, when a conductive bump is formed on the pad 400 so that the chip including the semiconductor device may be electrically connected to another chip, the connection between the pad 400 and the conductive bump may be good, and thus a semiconductor package including the semiconductor device may have good electrical characteristics.

Figure 26A:
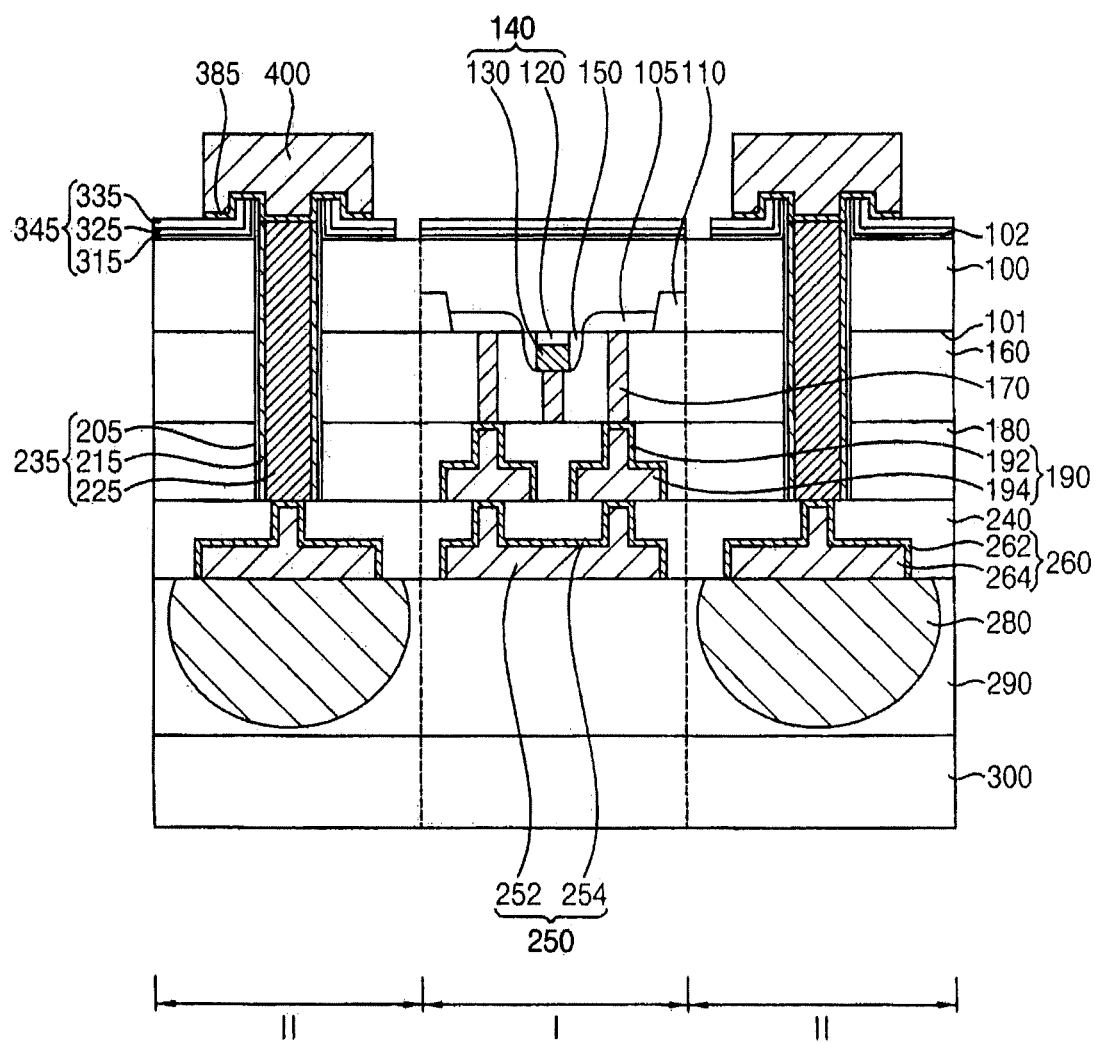
FIGS. 26A, 27A and 28A are cross-sectional views illustrating semiconductor devices in accordance with example embodiments.
Figure 27A:
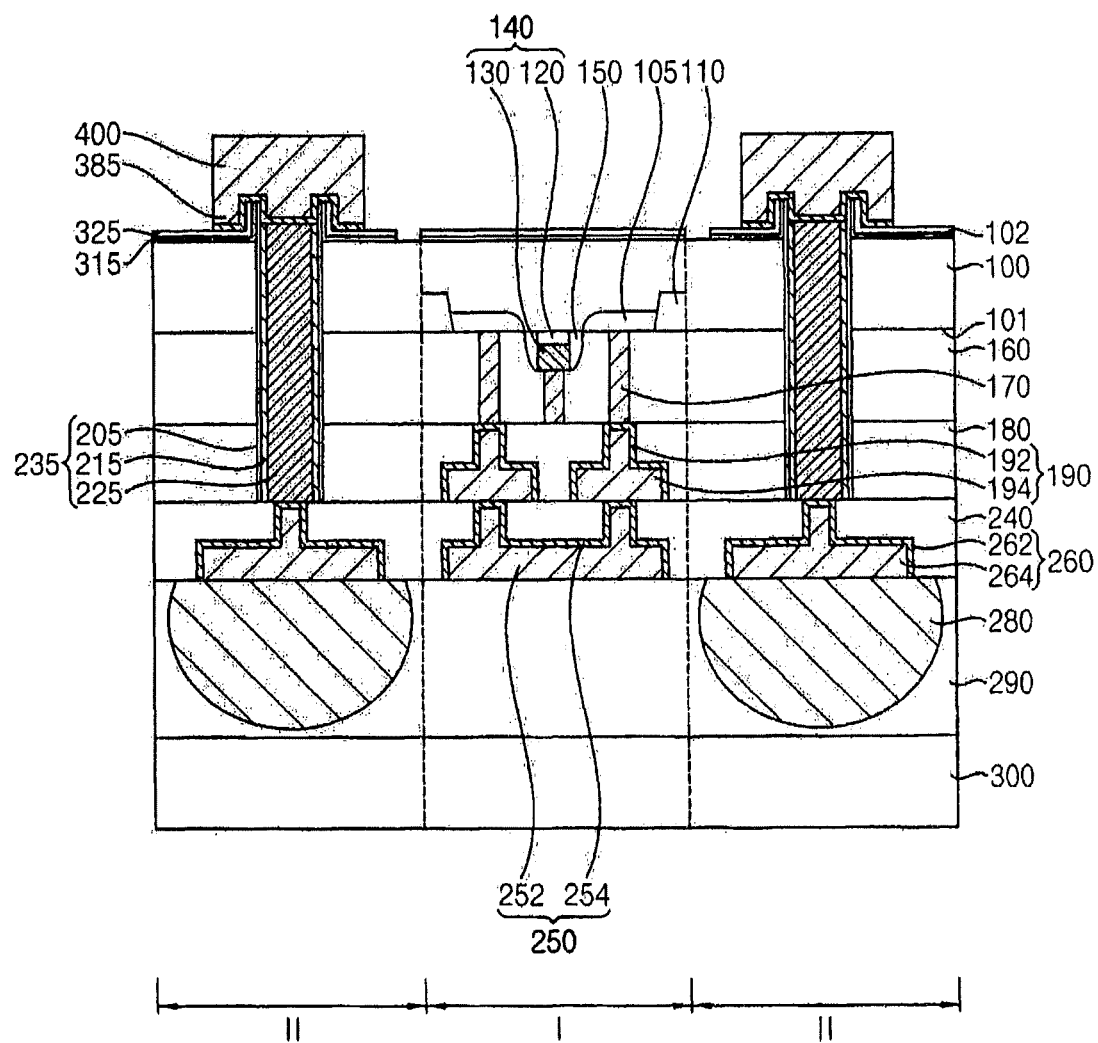
Figure 28A:
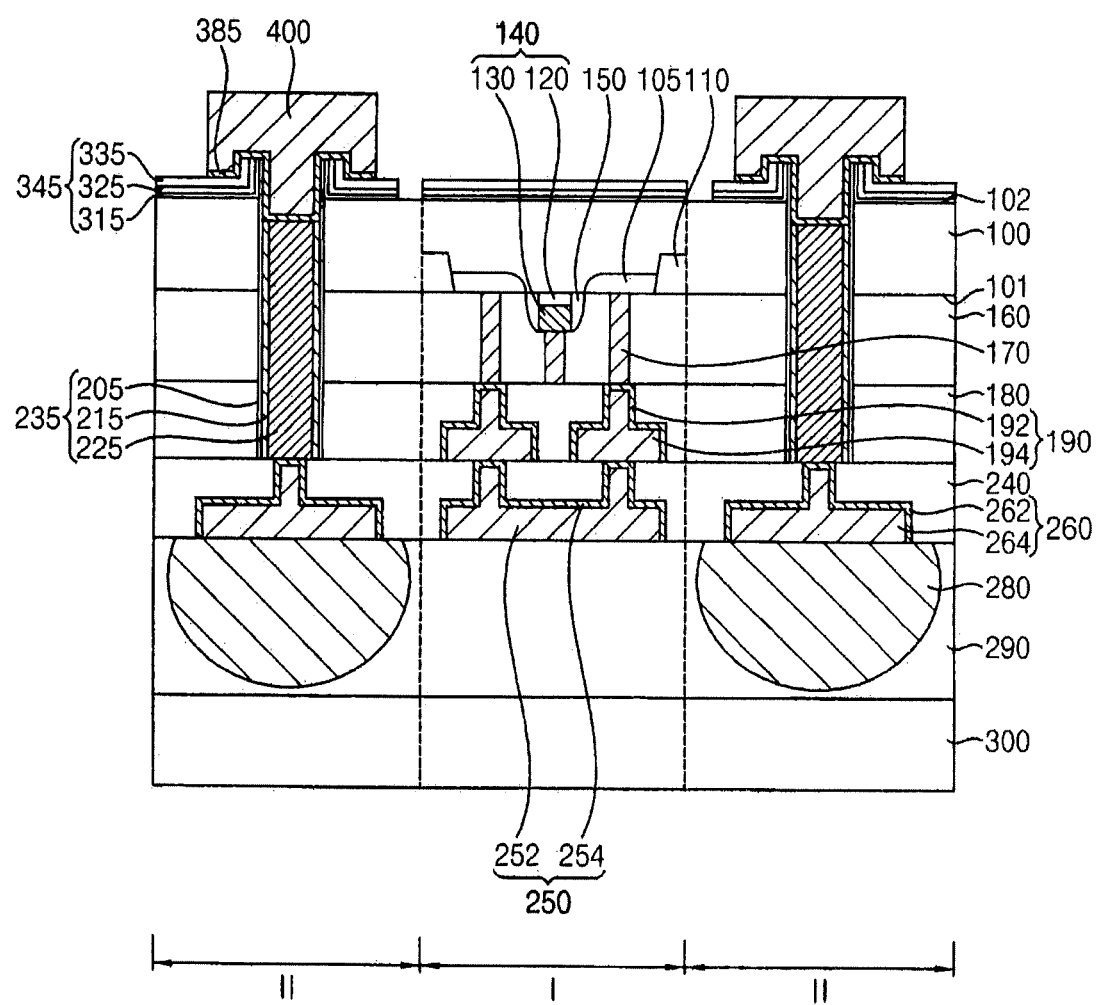

FIGS. 26A, 27A and 28A are cross-sectional views illustrating semiconductor devices in accordance with example embodiments. The semiconductor devices may be substantially the same as or similar to those of FIGS. 1A, 2A and 3A, respectively, except for the shape of the via structure.

Referring to FIG. 26A, the semiconductor device may include a via structure 235, a protection layer pattern structure 345 and a pad structure.

The via structure 235 may be formed through the first and second insulating interlayers 160 and 180 and a substrate 100, and a portion of the via structure 235 may be exposed above a second surface 102 of the substrate 100. The via structure 235 may have a top surface of which a central portion may be concave (or stepped toward the center).

In example embodiments, the via structure 235 may include a via electrode and an insulation layer pattern 205 surrounding a sidewall of the via electrode. The via electrode may include a second conductive pattern 225 and a second barrier layer pattern 215 surrounding a sidewall of the second conductive pattern 225.

In example embodiments, top surfaces of the second conductive pattern 225 and the second barrier layer pattern 215 may be lower than that of the insulation layer pattern 205, and the top surfaces of the second conductive pattern 225 and the second barrier layer pattern 215 may be substantially coplanar with each other. Referring to FIG. 28A, the top surfaces of the second conductive pattern 225 and the second barrier layer pattern 215 may be lower than the second surface 102 of the substrate 100.

FIG. 27A shows that the protection layer pattern structure 345 may include only a first oxide layer pattern 315 and a nitride layer pattern 325 sequentially stacked on the second surface 102 of the substrate 100.

Each of the pad structures of the semiconductor devices shown in FIGS. 26A, 27A and 28A may have an uneven bottom surface but have a flat top surface, as those of the semiconductor devices shown in FIGS. 1A, 2A and 3A, and thus the connection between the pad structure and a conductive bump may be good. Thus, a semiconductor package including the semiconductor device may have good electrical characteristics.

Figure 26B:
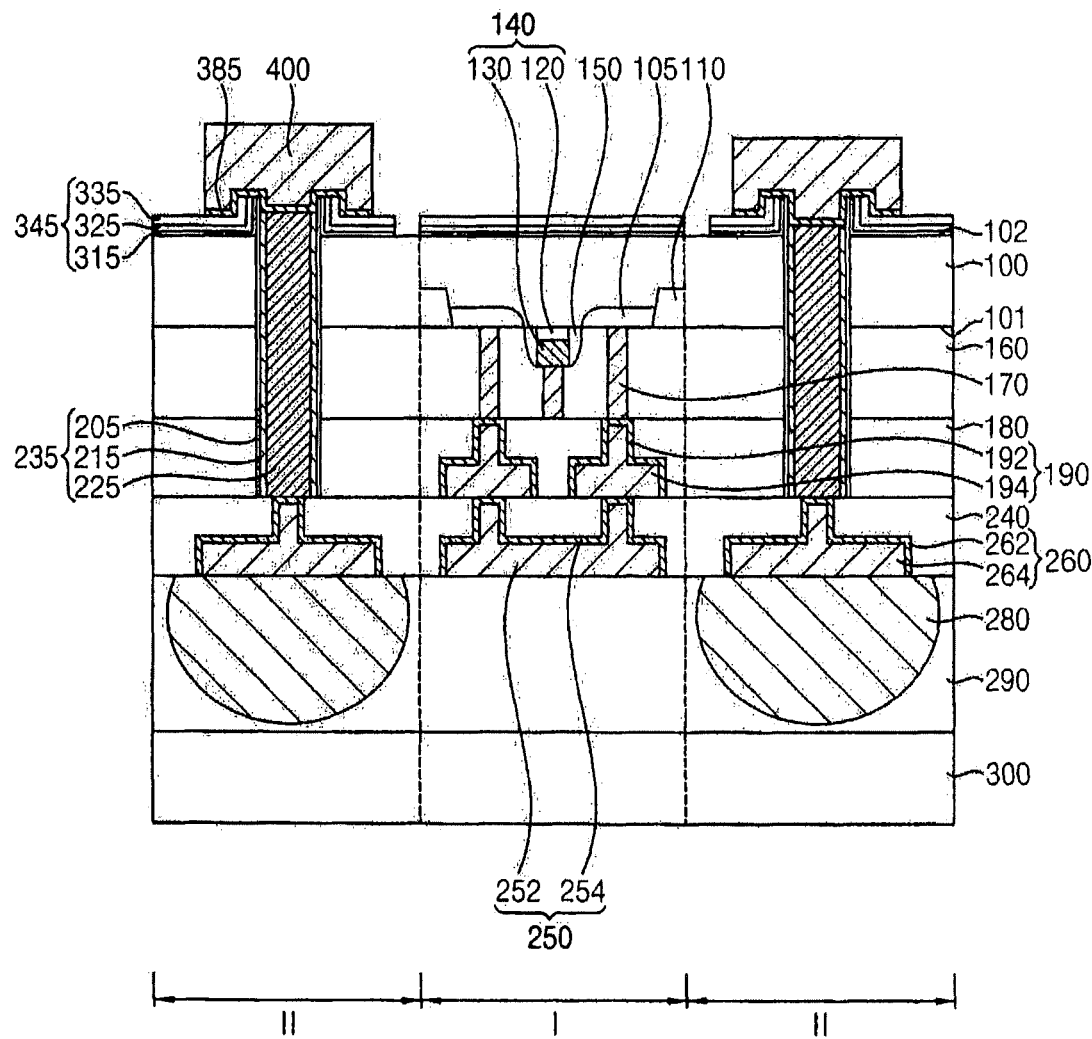
FIGS. 26B, 27B and 28B are cross-sectional views illustrating semiconductor devices in accordance with example embodiments.
Figure 27B:
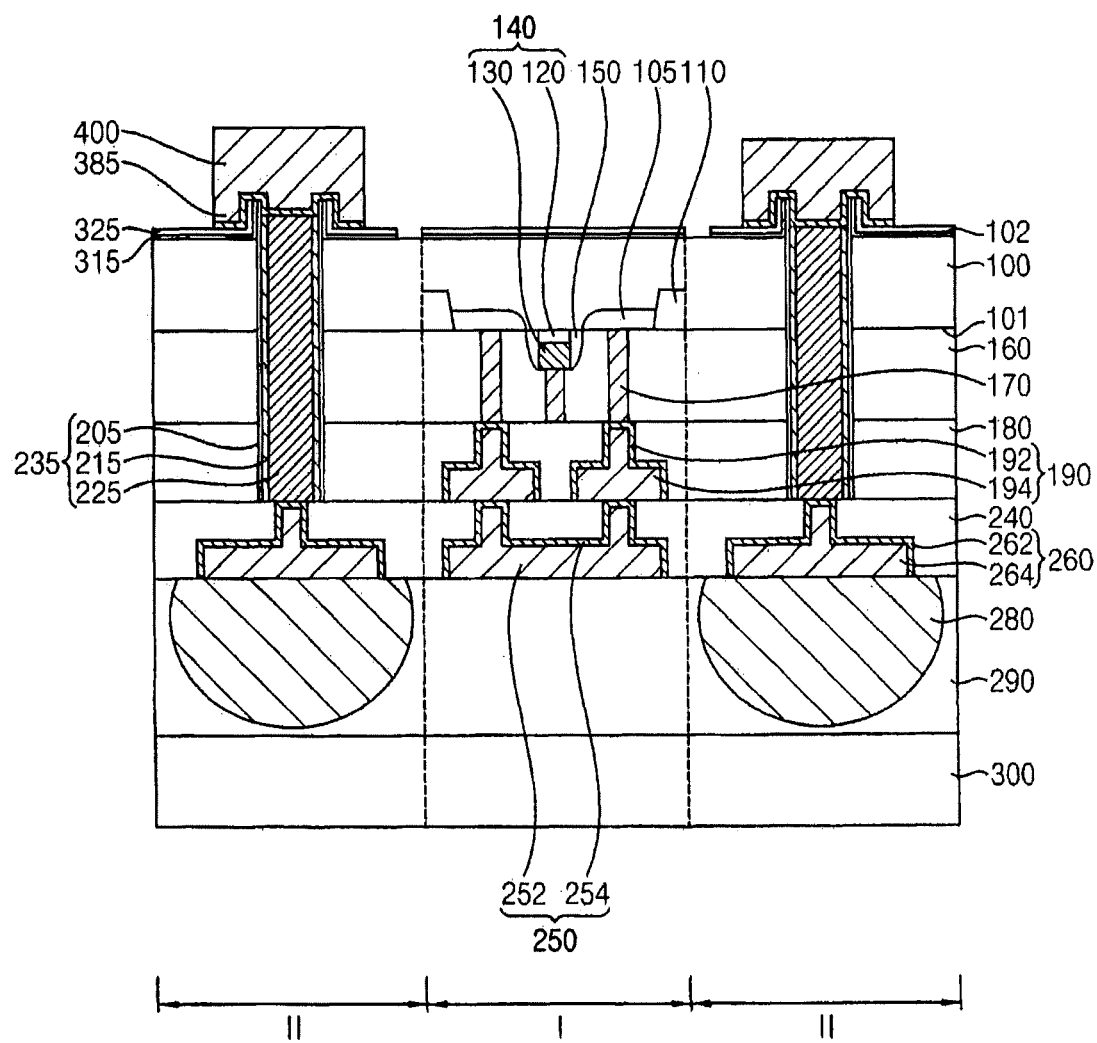
Figure 28B:
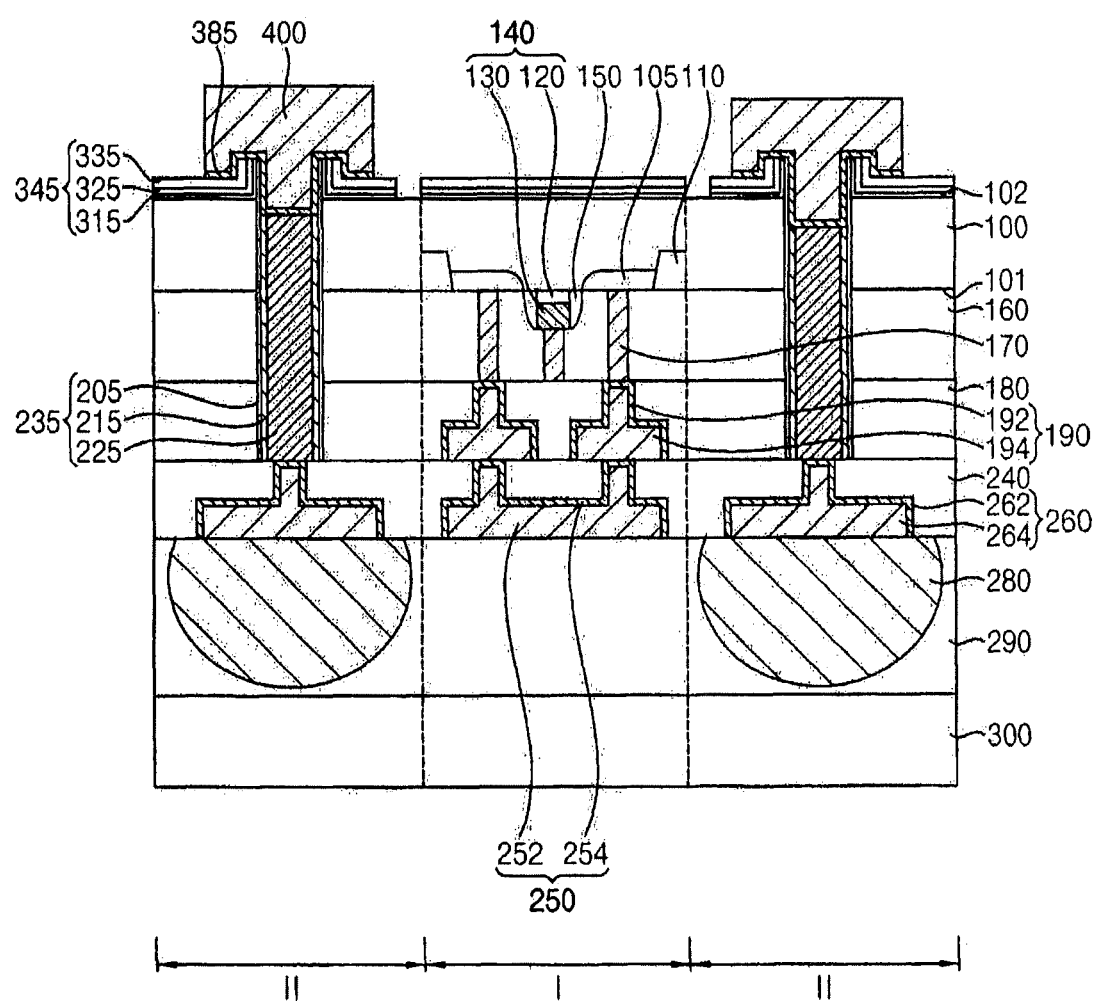

FIGS. 26B, 27B and 28B are cross-sectional views illustrating semiconductor devices in accordance with example embodiments. The semiconductor devices may be substantially the same as those of FIGS. 26A, 26B and 27B, respectively, except for the heights of the second conductive pattern and the pad.

Referring to FIGS. 26B, 27B and 28B, each of the semiconductor devices may include a plurality of second conductive patterns 225, and at least some of the second conductive patterns 225 may have top surfaces at different heights, and correspondingly, at least some of pads 400 may have top surface at different heights.

Figure 29:
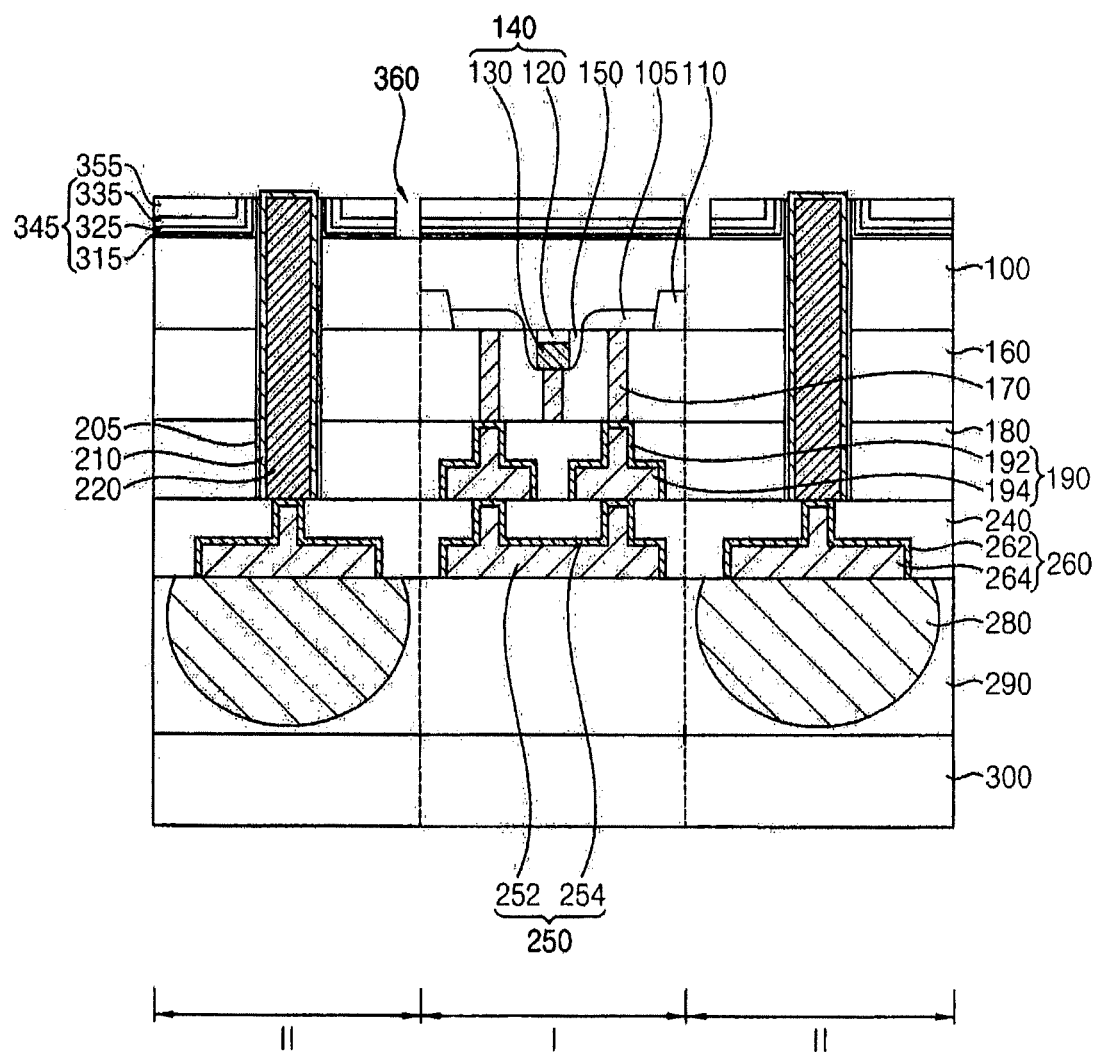
Figure 30:
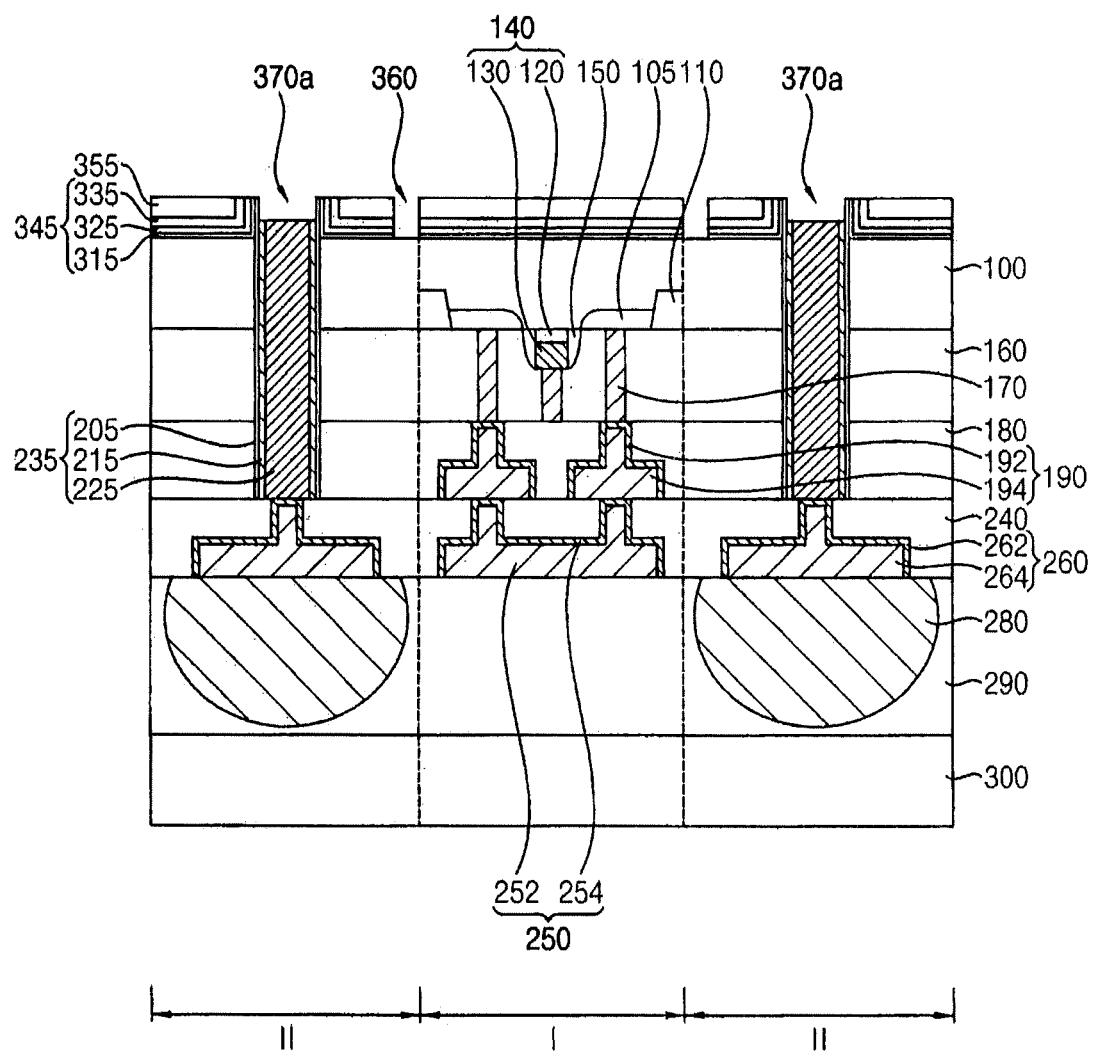
Figure 31:
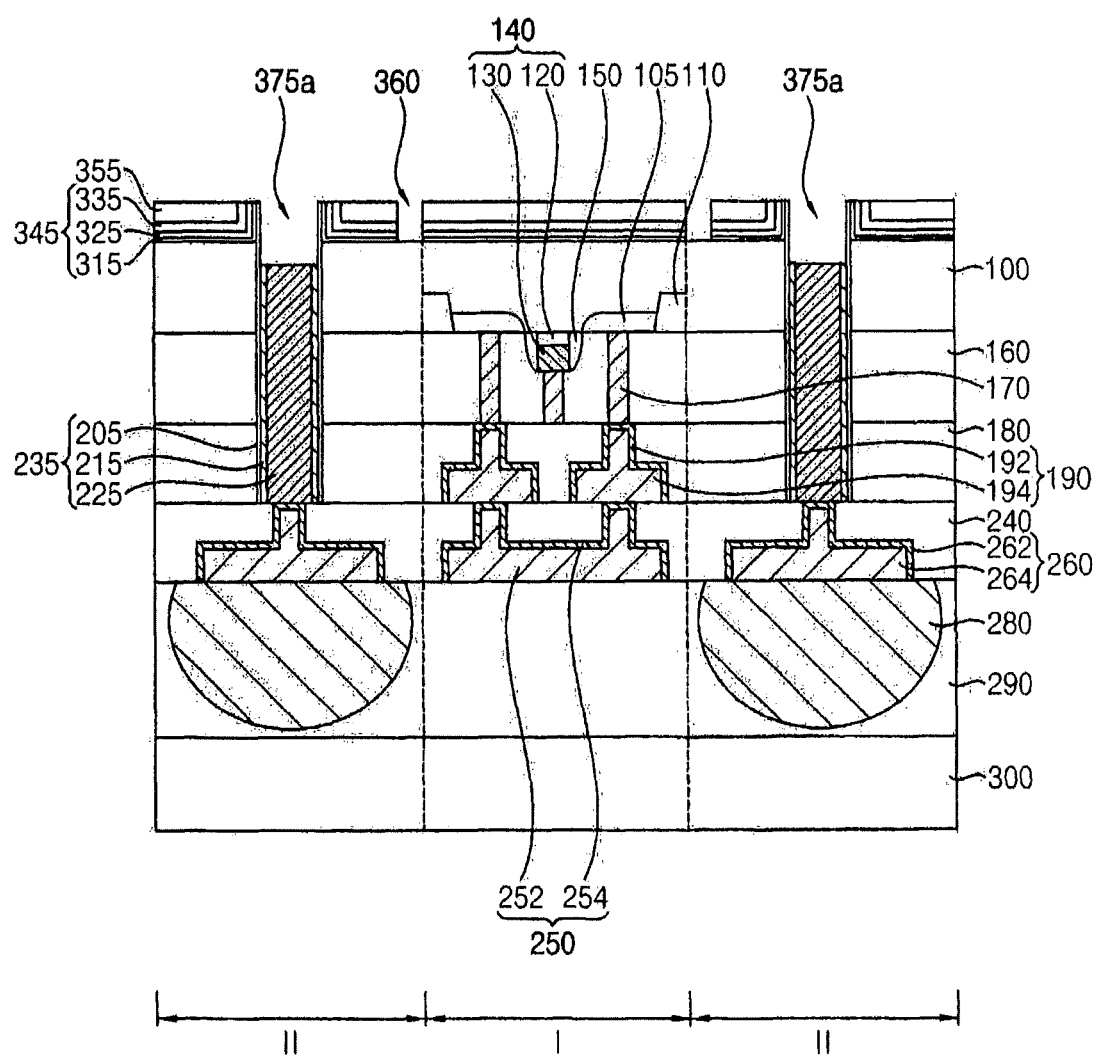

FIGS. 29 to 31 are cross-sectional views illustrating a method of manufacturing a semiconductor device in accordance with example embodiments. This method may include processes substantially the same as or similar to those of the method illustrated with reference to FIGS. 7 to 25.

First, processes substantially the same as or similar to those illustrated with reference to FIGS. 7 to 16 may be performed.

Referring to FIG. 29, the protection layer structure 340 may be etched using a second photoresist pattern 355 as an etching mask to form a protection layer pattern structure 345.

In example embodiments, by the etching process, a portion of the protection layer structure 340 on the preliminary via structure 230 may be etched to expose the preliminary via structure 230, and the exposed portion of the preliminary via structure 230 may be also partially etched.

In example embodiments, an upper portion of the insulation layer 200 in the preliminary via structure 230 may be removed to form an insulation layer pattern 205, while an upper portion of the second barrier layer 210 may not be removed due to the etching selectivity with respect to the protection layer structure 340 or the insulation layer 200.

Referring to FIG. 30, upper portions of the second barrier layer 210 and the second conductive layer 220 may be removed to form a first recess 370a, and thus the second barrier layer 210 and the second conductive layer 220 may be transformed into a second barrier layer pattern 215 and a second conductive pattern 225, respectively.

In example embodiments, the upper portions of the second barrier layer 210 and the second conductive layer 220 may be removed by a wet etching process, and top surfaces of the second barrier layer pattern 215 and the second conductive pattern 225 formed by the wet etching process may be lower than that of the insulation layer pattern 205. The top surfaces of the second barrier layer pattern 215 and the second conductive pattern 225 may be substantially the same as each other.

The second conductive pattern 225 and the second barrier layer pattern 215 surrounding a sidewall of the second conductive pattern 225 may form a via electrode, and the via electrode and the insulation layer pattern 205 surrounding a sidewall of the via electrode may form a via structure 235. The top surfaces of the second conductive pattern 225 and the second barrier layer pattern 215 at a central portion of the via structure 235 may be lower than that of the insulation layer pattern 205 surrounding the second conductive pattern 225 and the second barrier layer pattern 215, and thus the via structure 235 may have a whole top surface of which a central portion may be concave (i.e., stepped toward the central portion).

Referring to FIG. 31, upper portions of the second barrier layer 210 and the second conductive layer 220 may be removed to form a third recess 375a, and top surfaces of the second conductive pattern 225 and the second barrier layer pattern 215 may be lower than the second surface 102 of the substrate 100.

Then, processes substantially the same as or similar to those illustrated with reference to FIGS. 22 to 25 and FIGS. 1A, 2A and 3A may be performed to complete the semiconductor device of FIGS. 26 to 28.

As the method of manufacturing the semiconductor device illustrated with reference to FIGS. 7 to 25, in the method of manufacturing the semiconductor device illustrated with reference to FIGS. 29 to 31, after forming the protection layer structure 340 on the exposed preliminary via structure 230 above the second surface 102 of the substrate 100, no CMP process may be performed to expose the preliminary via structure 230. Additionally, even though the third seed layer 380 may have the uneven top surface as the upper portion of the preliminary via structure 230 may be removed by a wet etching process, the plating solution used in the electroplating process may include the leveler and/or the suppressor, and thus the pad 400 formed by the electroplating process may have the flat top surface.

Figure 32A:
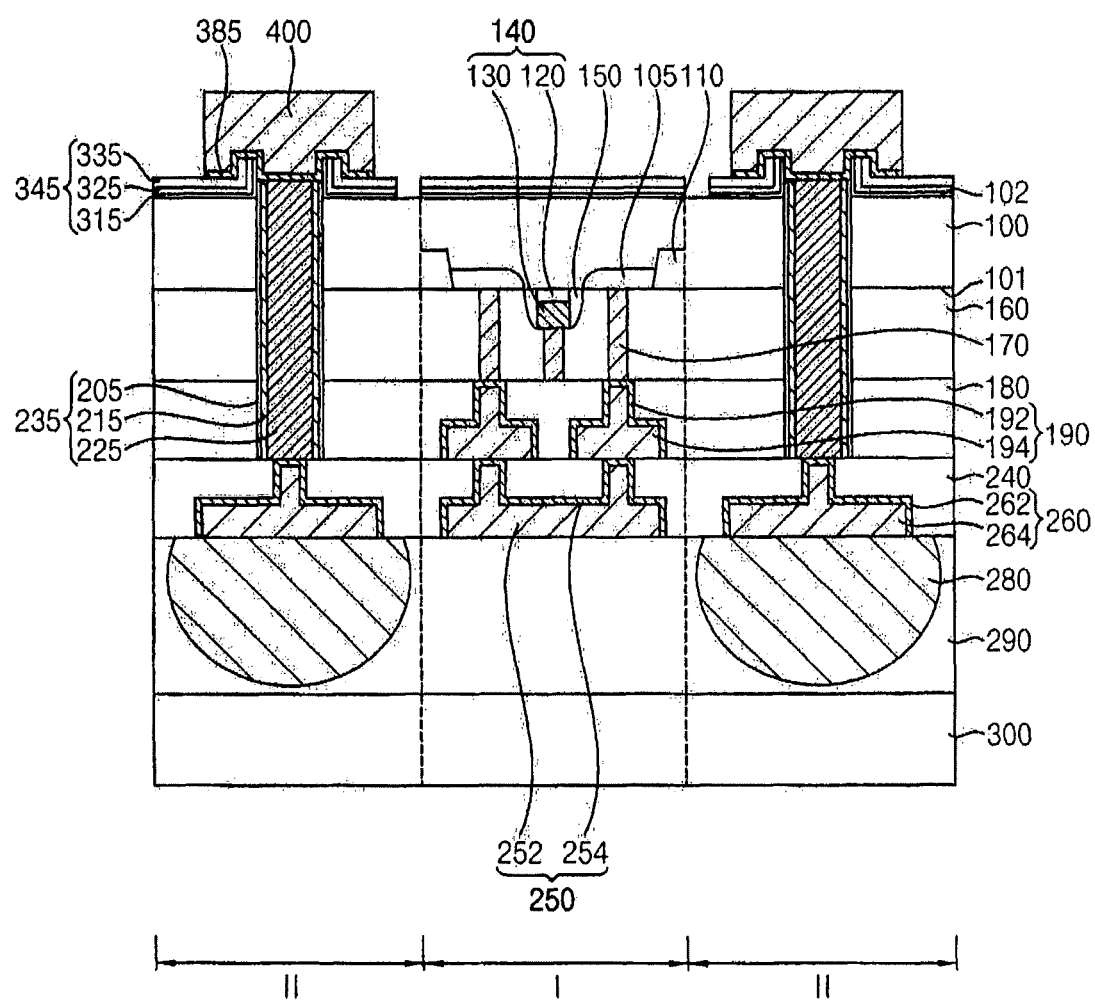
FIGS. 32A, 33A and 34A are cross-sectional views illustrating semiconductor devices in accordance with example embodiments.
Figure 33A:
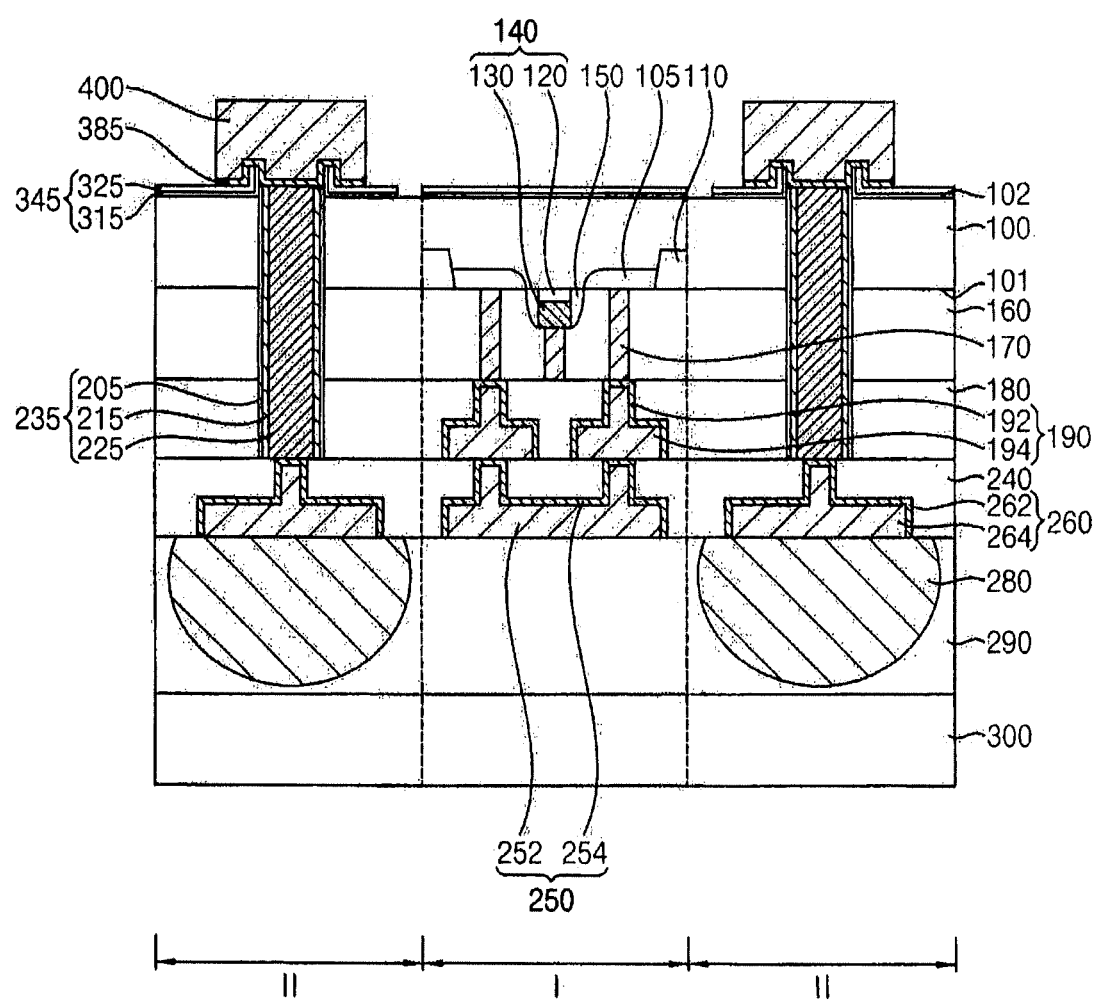
Figure 34A:
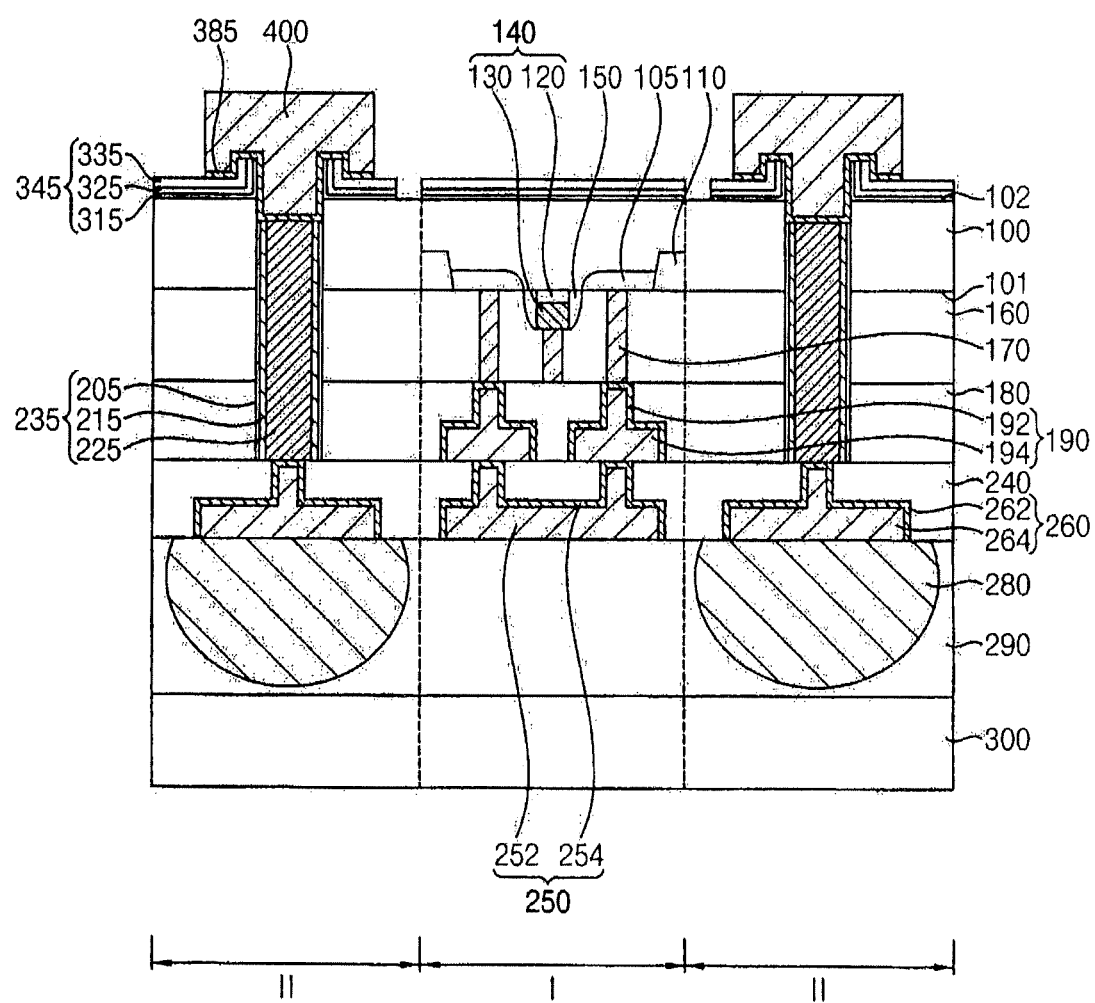

FIGS. 32A, 33A and 34A are cross-sectional views illustrating semiconductor devices in accordance with example embodiments. The semiconductor devices may be substantially the same as or similar to those of FIGS. 1A, 2A and 3A, respectively, except for the shape of the via structure.

Referring to FIG. 32A, the semiconductor device may include a via structure 235, a protection layer pattern structure 345 and a pad structure.

The via structure 235 may be formed through the first and second insulating interlayers 160 and 180 and a substrate 100, and a portion of the via structure 235 may be exposed above a second surface 102 of the substrate 100.

In example embodiments, the via structure 235 may include a via electrode and an insulation layer pattern 205 surrounding a sidewall of the via electrode. The via electrode may include a second conductive pattern 225 and a second barrier layer pattern 215 surrounding a sidewall of the second conductive pattern 225. In example embodiments, top surfaces of the second conductive pattern 225, the second barrier layer pattern 215 and the insulation layer pattern 205 may substantially coplanar with each other.

The protection layer pattern structure 345 may be formed on the second surface 102 of the substrate 100, and cover a sidewall of the exposed portion of the via structure 235. The protection layer pattern structure 345 may have a top surface higher than that of the via structure 235. Thus, the protection layer pattern structure 345 may partially surround a lower portion of the pad structure on the exposed via structure 235.

Referring to FIG. 33A, the protection layer pattern structure 345 may include only the first oxide layer pattern 315 and the nitride layer pattern 325 sequentially stacked on the second surface 102 of the substrate 100.

Referring to FIG. 34A, the semiconductor device may include a via structure 235, a protection layer pattern structure 345 and a pad structure.

The via structure 235 may be formed through the first and second insulating interlayers 160 and 180 and a portion of a substrate 100.

In example embodiments, the via structure 235 may include a via electrode and an insulation layer pattern 205 surrounding a sidewall of the via electrode. The via electrode may include a second conductive pattern 225 and a second barrier layer pattern 215 surrounding a sidewall of the second conductive pattern 225. In example embodiments, top surfaces of the second conductive pattern 225, the second barrier layer pattern 215 and the insulation layer pattern 205 may substantially coplanar with each other and lower than the second surface 102 of the substrate 100.

The protection layer pattern structure 345 may be formed on the second surface 102 of the substrate 100, and may not vertically overlap the via structure 235.

The pad structure may be formed through a portion of the substrate 100, and may contact top surfaces of the via structure 235 and the protection layer pattern structure 345. A lower portion of the pad structure on the via structure 235 may be partially surrounded by the protection layer pattern structure 345.

Each of the pad structures shown in FIGS. 32A, 33A and 34A, as those illustrated with reference to FIGS. 1A, 2A and 3A, may have an uneven bottom surface, however, may have a flat top surface, and thus, when a conductive bump is formed on the top surface of the pad structure, the connection between the pad structure and the conductive bump may be good.

Figure 32B:
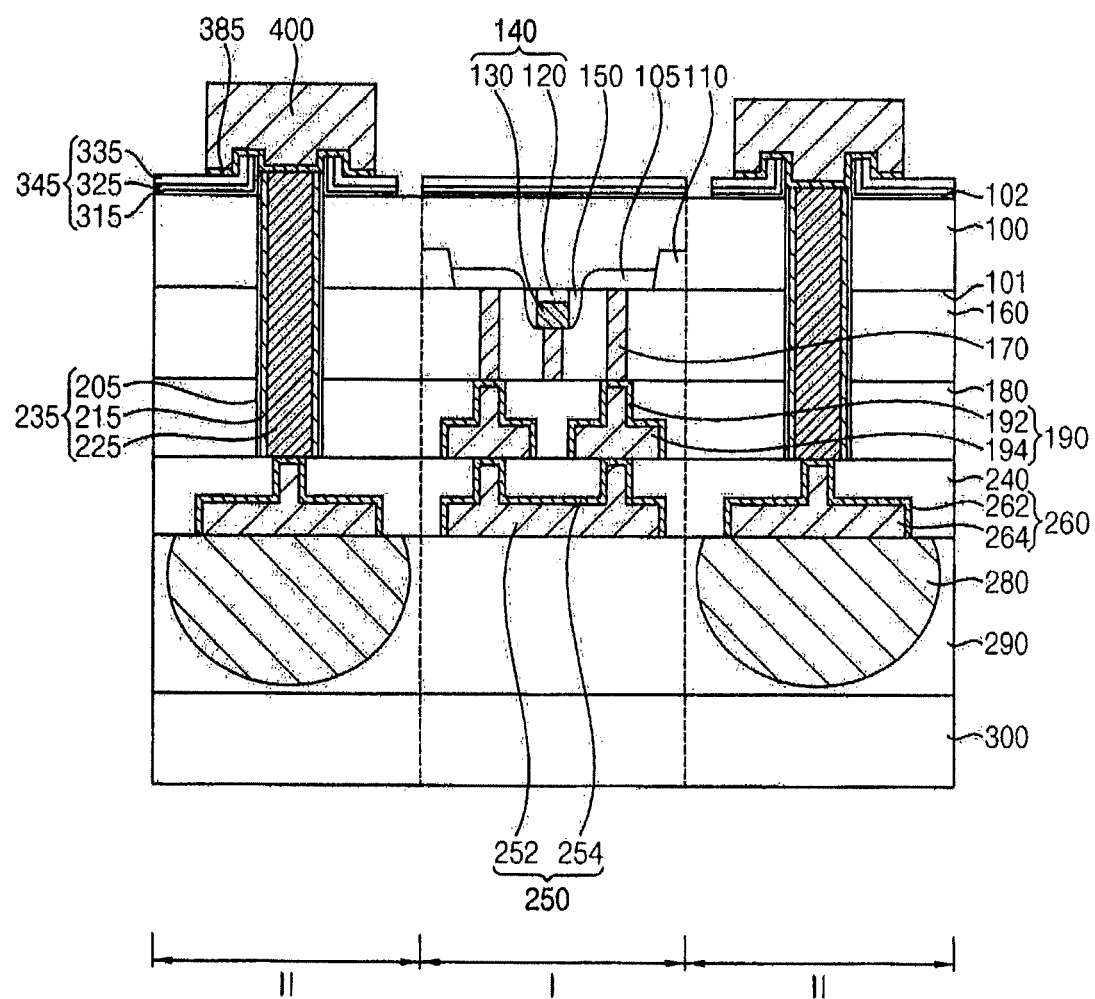
FIGS. 32B, 33B and 34B are cross-sectional views illustrating semiconductor devices in accordance with example embodiments.
Figure 33B:
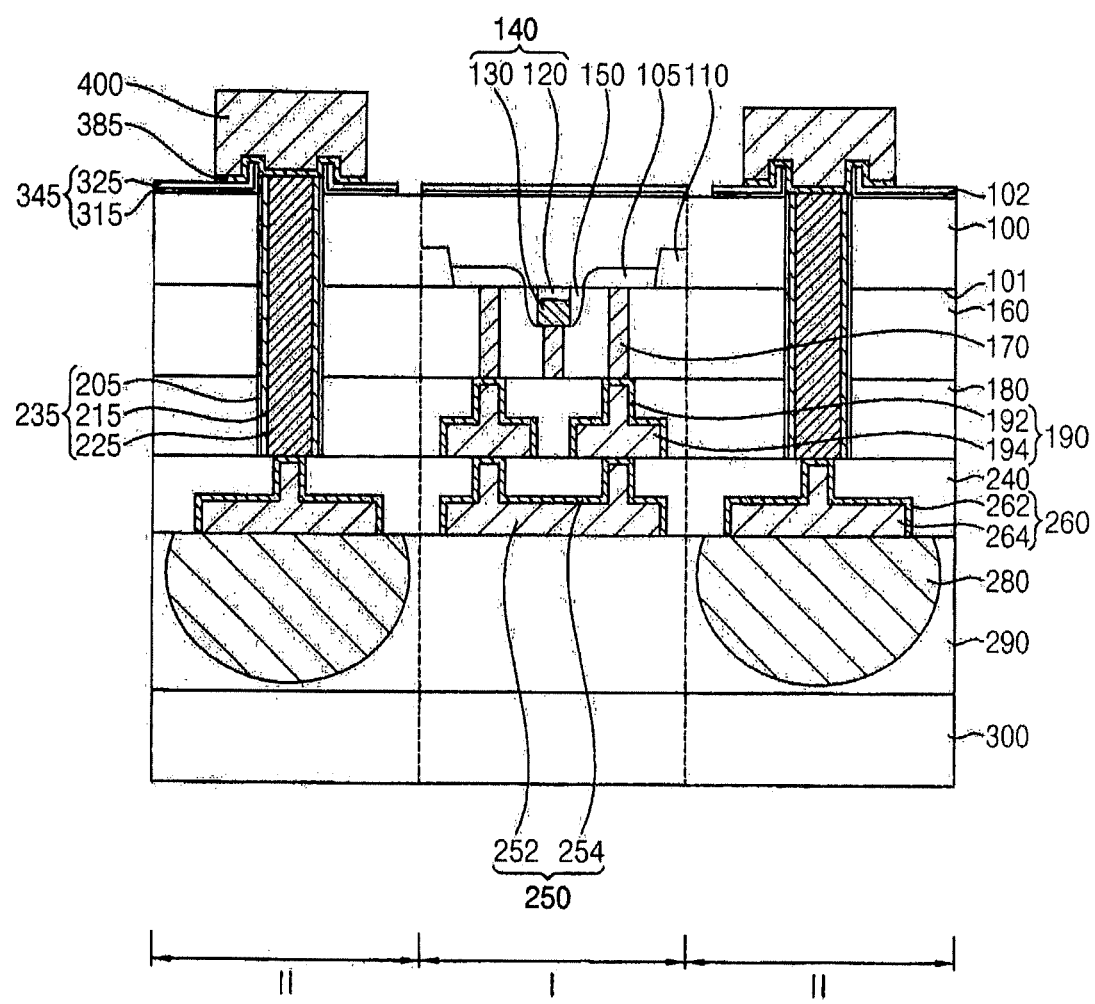
Figure 34B:
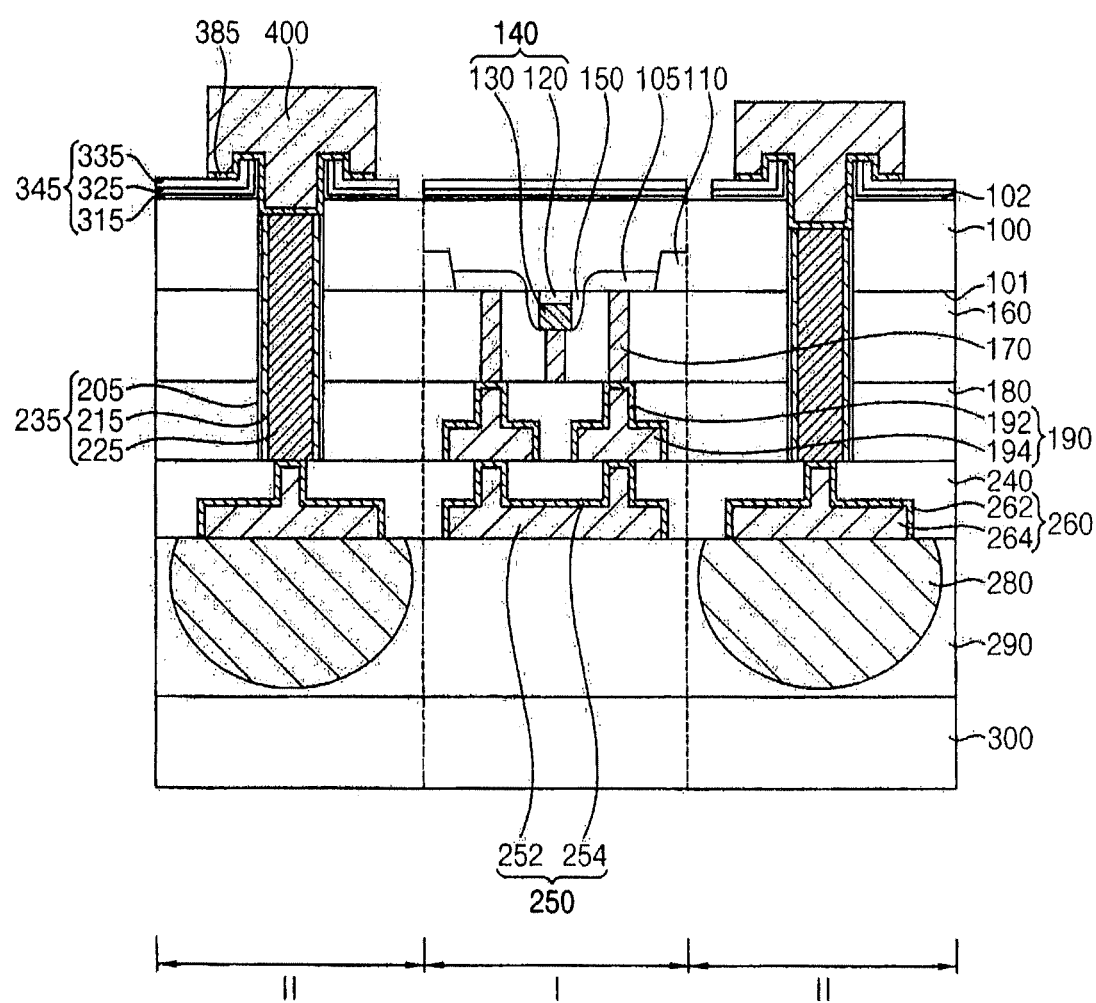

FIGS. 32B, 33B and 34B are cross-sectional views illustrating semiconductor devices in accordance with example embodiments. The semiconductor devices may be substantially the same as those of FIGS. 32A, 32B and 32B, respectively, except for the heights of the second conductive pattern and the pad.

Referring to FIGS. 32B, 33B and 34B, each of the semiconductor devices may include a plurality of second conductive patterns 225, and at least some of the second conductive patterns 225 may have top surfaces at different heights, and correspondingly, at least some of pads 400 may have top surface at different heights.

Figure 35:
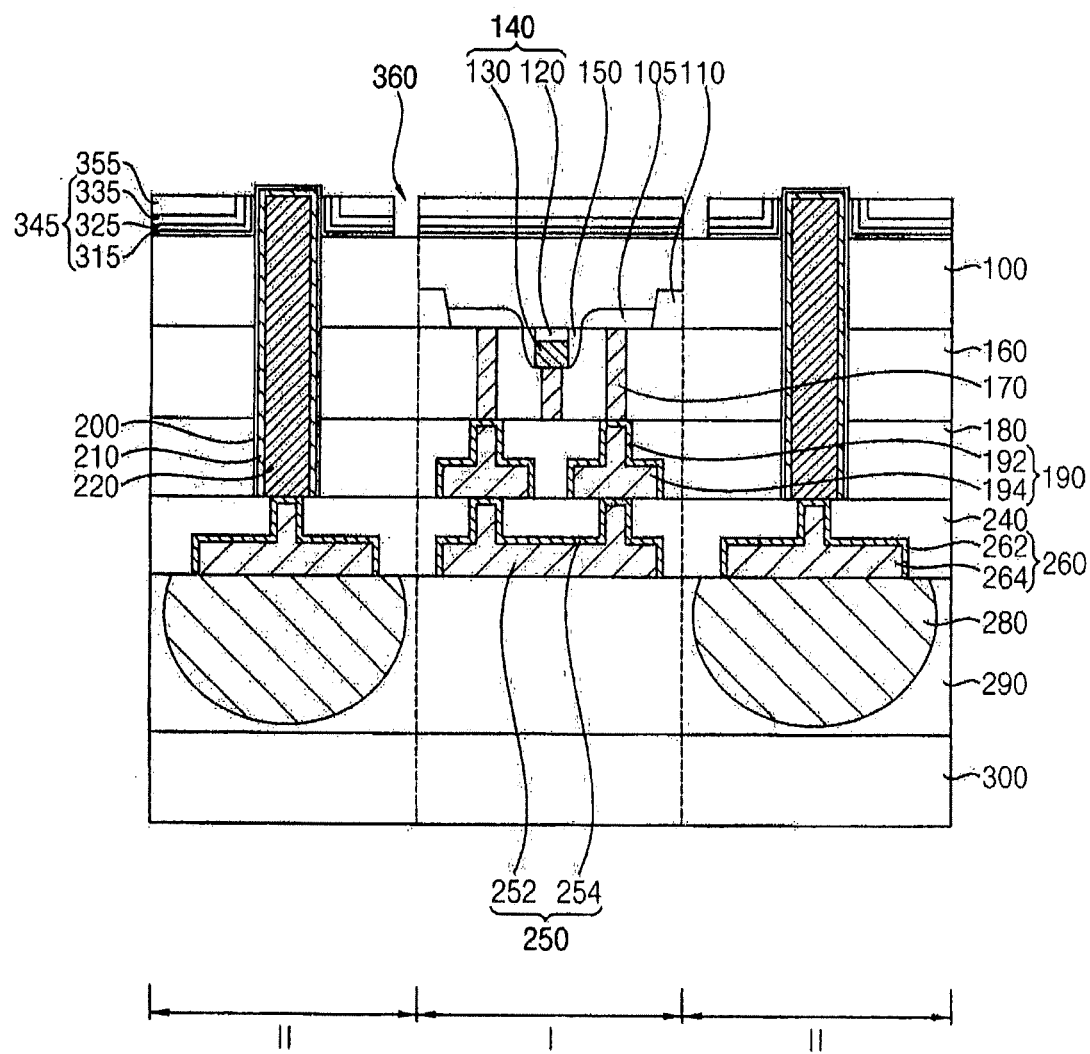
Figure 36:
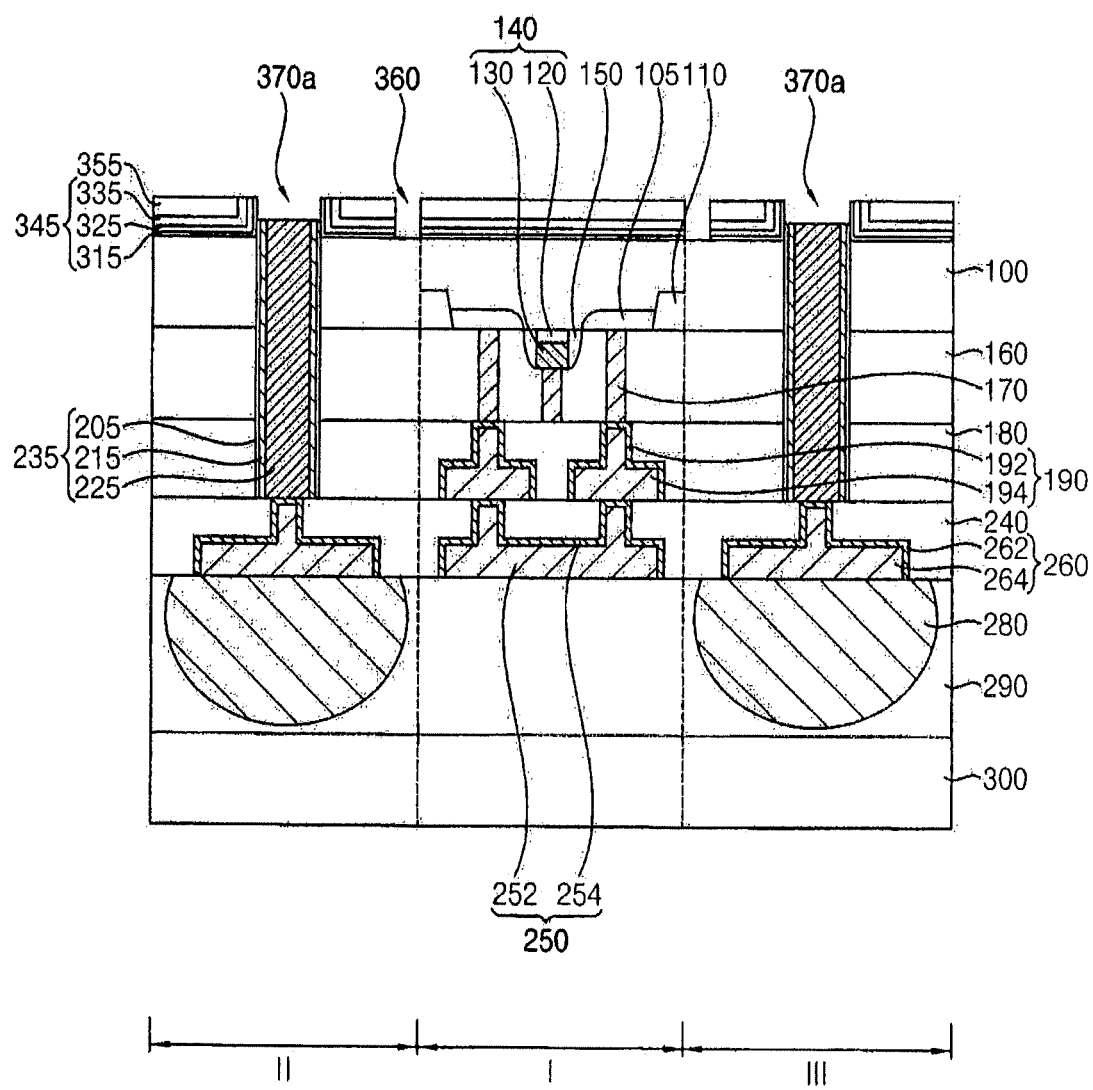
Figure 37:
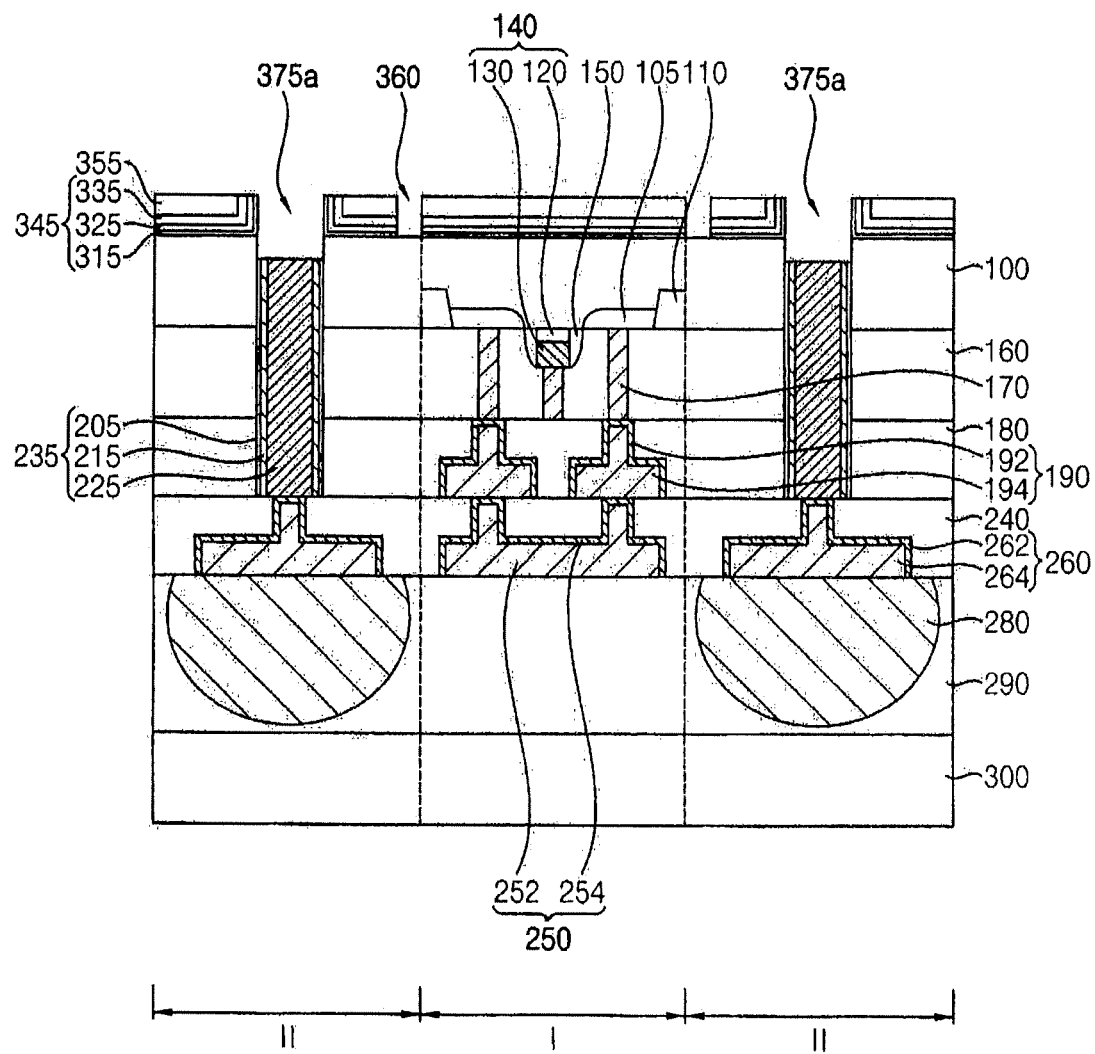

FIGS. 35 to 37 are cross-sectional views illustrating a method of manufacturing a semiconductor device in accordance with example embodiments. This method may include processes substantially the same as or similar to those of the method illustrated with reference to FIGS. 7 to 25.

First, processes substantially the same as or similar to those illustrated with reference to FIGS. 7 to 16 may be performed.

Referring to FIG. 35, the protection layer structure 340 may be etched using a second photoresist pattern 355 as an etching mask to form a protection layer pattern structure 345.

In example embodiments, by the etching process, a portion of the protection layer structure 340 on the preliminary via structure 230 may be etched to expose the preliminary via structure 230.

Referring to FIG. 36, upper portions of the insulation layer 200, the second barrier layer 210 and the second conductive layer 220 may be removed to form a first recess 370a, and thus the insulation layer 200, the second barrier layer 210 and the second conductive layer 220 may be transformed into an insulation layer pattern 205, a second barrier layer pattern 215 and a second conductive pattern 225, respectively.

In example embodiments, the upper portions of the insulation layer 200, the second barrier layer 210 and the second conductive layer 220 may be removed by a wet etching process, and top surfaces of the insulation layer pattern 205, the second barrier layer pattern 215 and the second conductive pattern 225 formed by the wet etching process may be lower than that of the insulation layer pattern 205. The top surfaces of the insulation layer pattern 205, the second barrier layer pattern 215 and the second conductive pattern 225 may be substantially the same as each other.

The second conductive pattern 225 and the second barrier layer pattern 215 surrounding a sidewall of the second conductive pattern 225 may form a via electrode, and the via electrode and the insulation layer pattern 205 surrounding a sidewall of the via electrode may form a via structure 235.

Referring to FIG. 37, upper portions of the insulation layer 200, the second barrier layer 210 and the second conductive layer 220 may be removed to form a third recess 375a, and top surfaces of the insulation layer pattern 205, the second conductive pattern 225 and the second barrier layer pattern 215 may be lower than the second surface 102 of the substrate 100.

Then, processes substantially the same as or similar to those illustrated with reference to FIGS. 22 to 25 and FIGS. 1A, 2A and 3A may be performed to complete the semiconductor device of FIGS. 32A, 33A and 34A.

FIGS. 38A, 39A, 40A, 41A, 42A and 43A are cross-sectional views illustrating semiconductor devices in accordance with example embodiments. The semiconductor devices may be substantially the same as or similar to those of FIGS. 1A, 2A and 3A, or FIGS. 26A, 27A and 28A, or FIGS. 32A, 33A and 34A, except for the shape of the protection layer pattern structure. Particularly, the semiconductor devices of FIGS. 38A, 39A, 40A, 41A, 42A and 43A may be substantially the same as or similar to those of FIGS. 1A, 3A, 26A, 28A, 32A and 34A, respectively, except for the shape of the protection layer pattern structure.

Figure 38A:
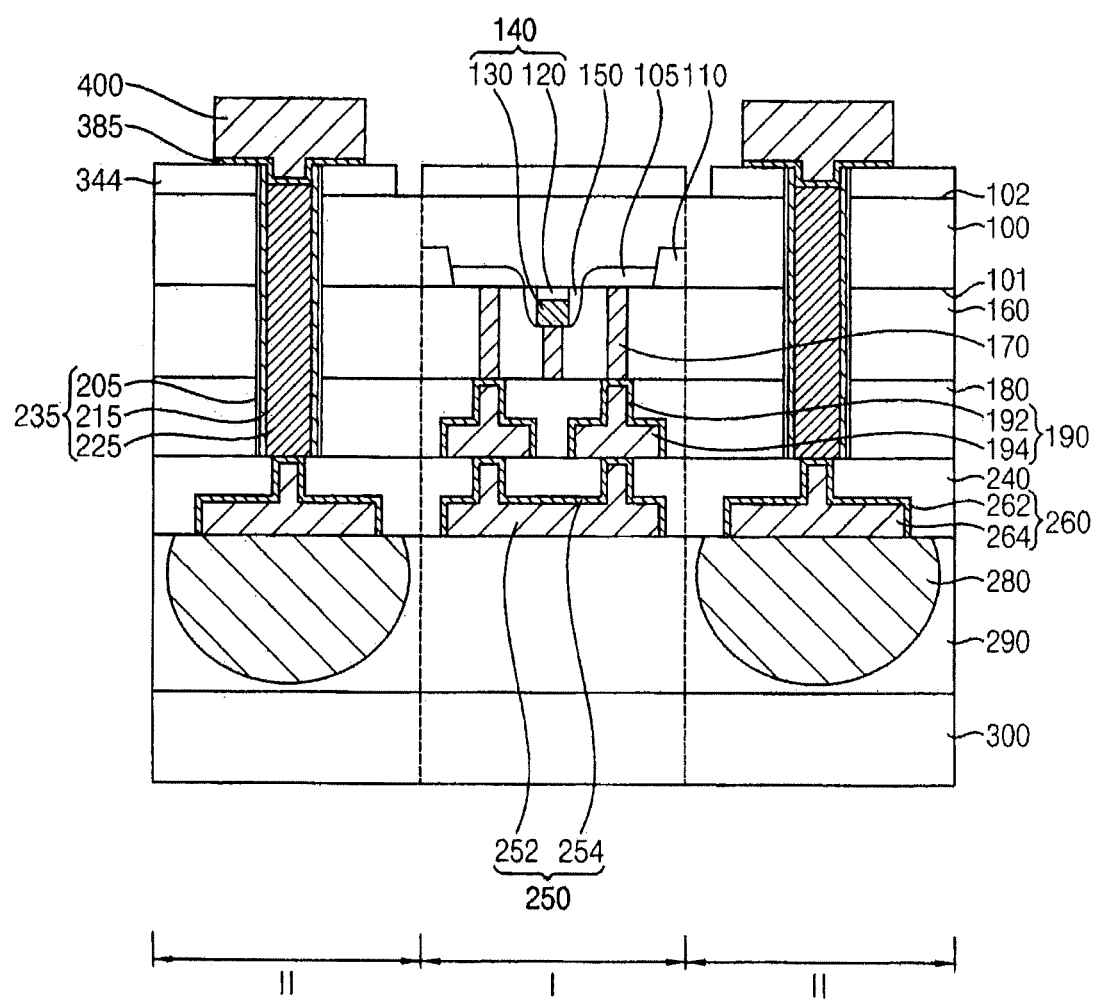
FIGS. 38A, 39A, 40A, 41A, 42A and 43A are cross-sectional views illustrating semiconductor devices in accordance with example embodiments.
Figure 38B:
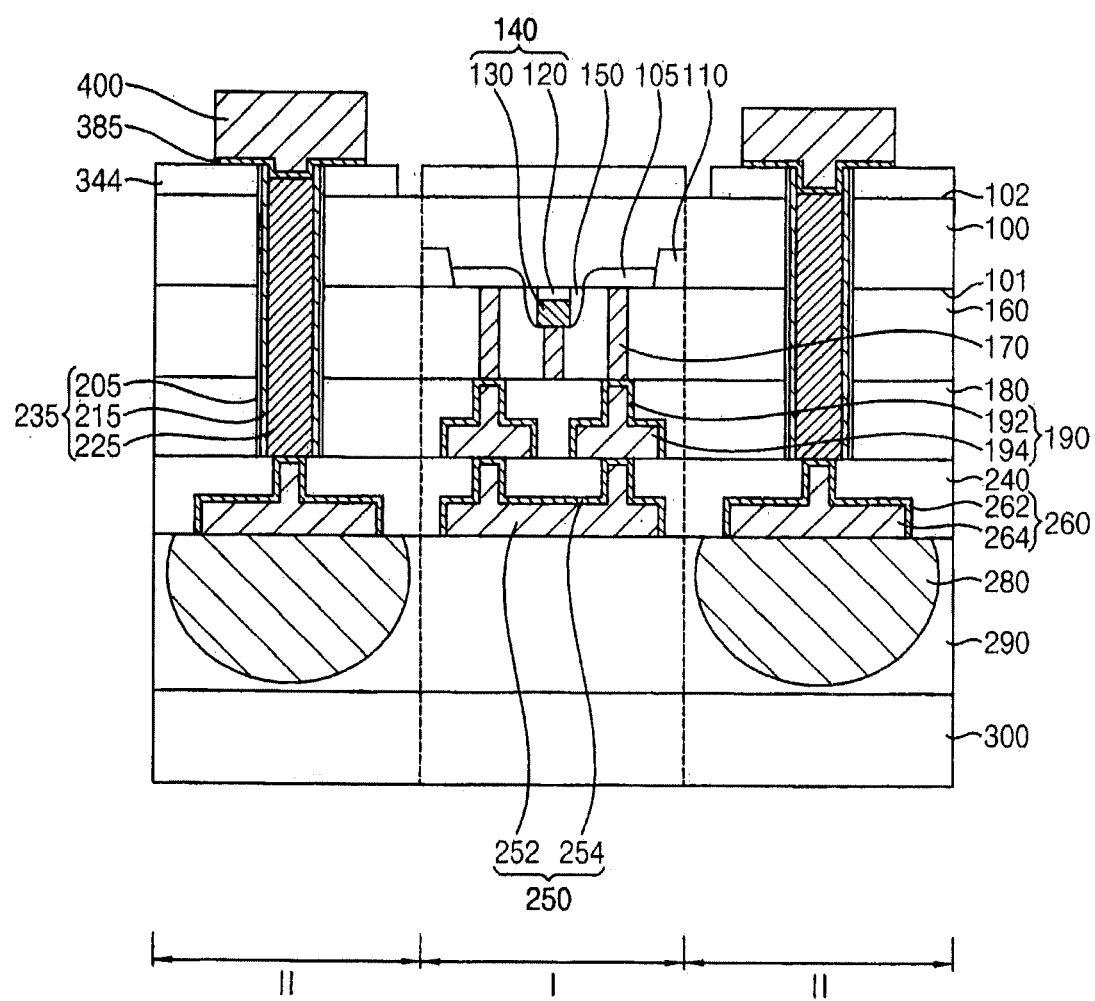
FIGS. 38B, 39B, 40B, 41B, 42B and 43B are cross-sectional views illustrating semiconductor devices in accordance with example embodiments.
Figure 39A:
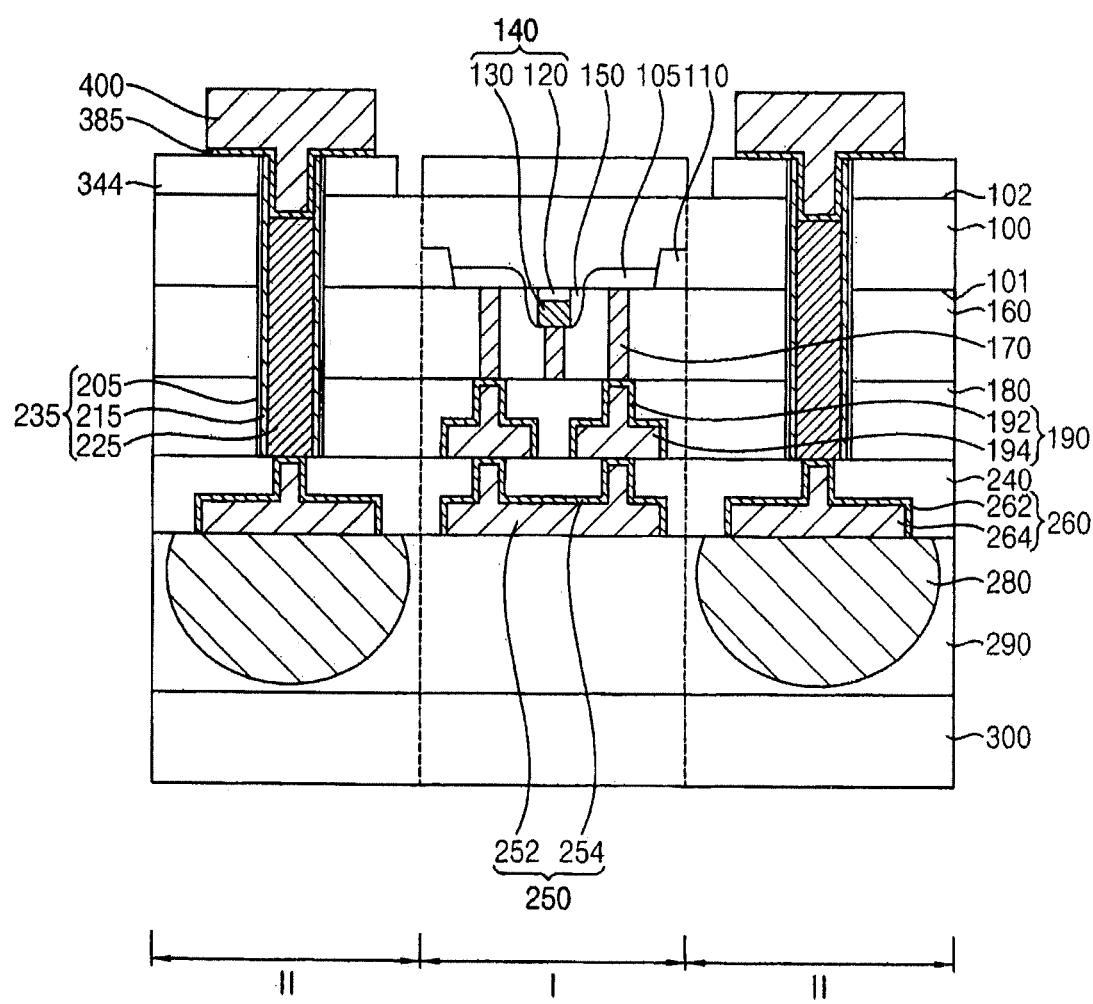
Figure 39B:
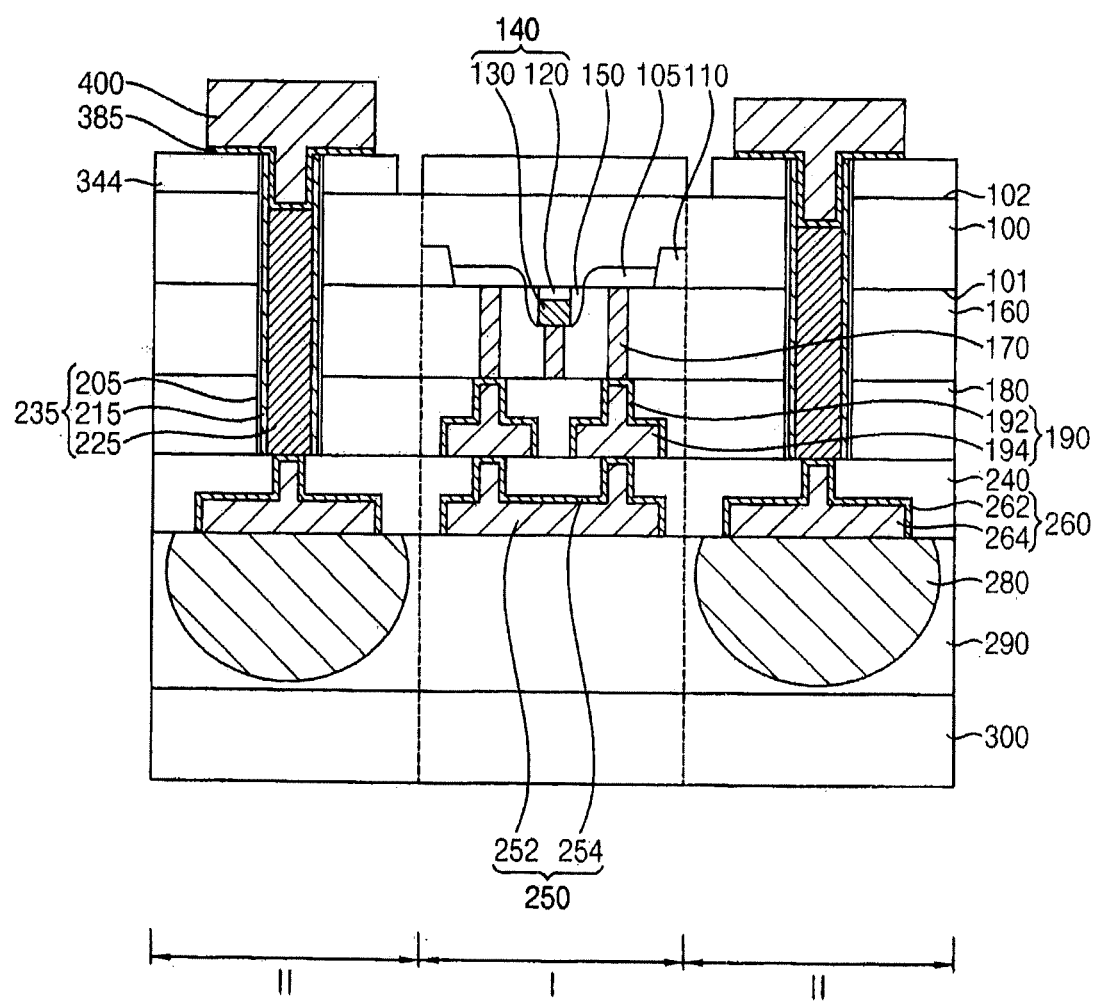
Figure 40A:
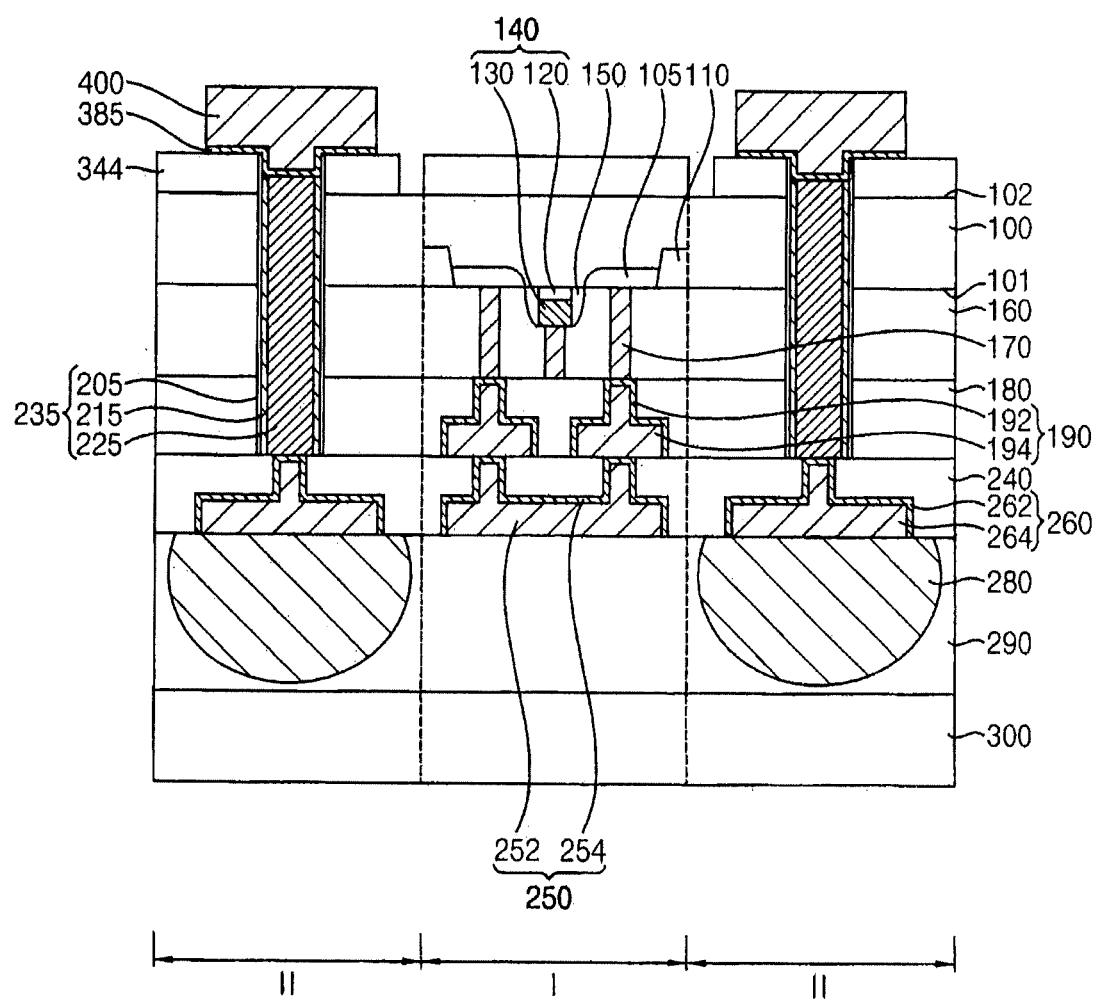
Figure 40B:
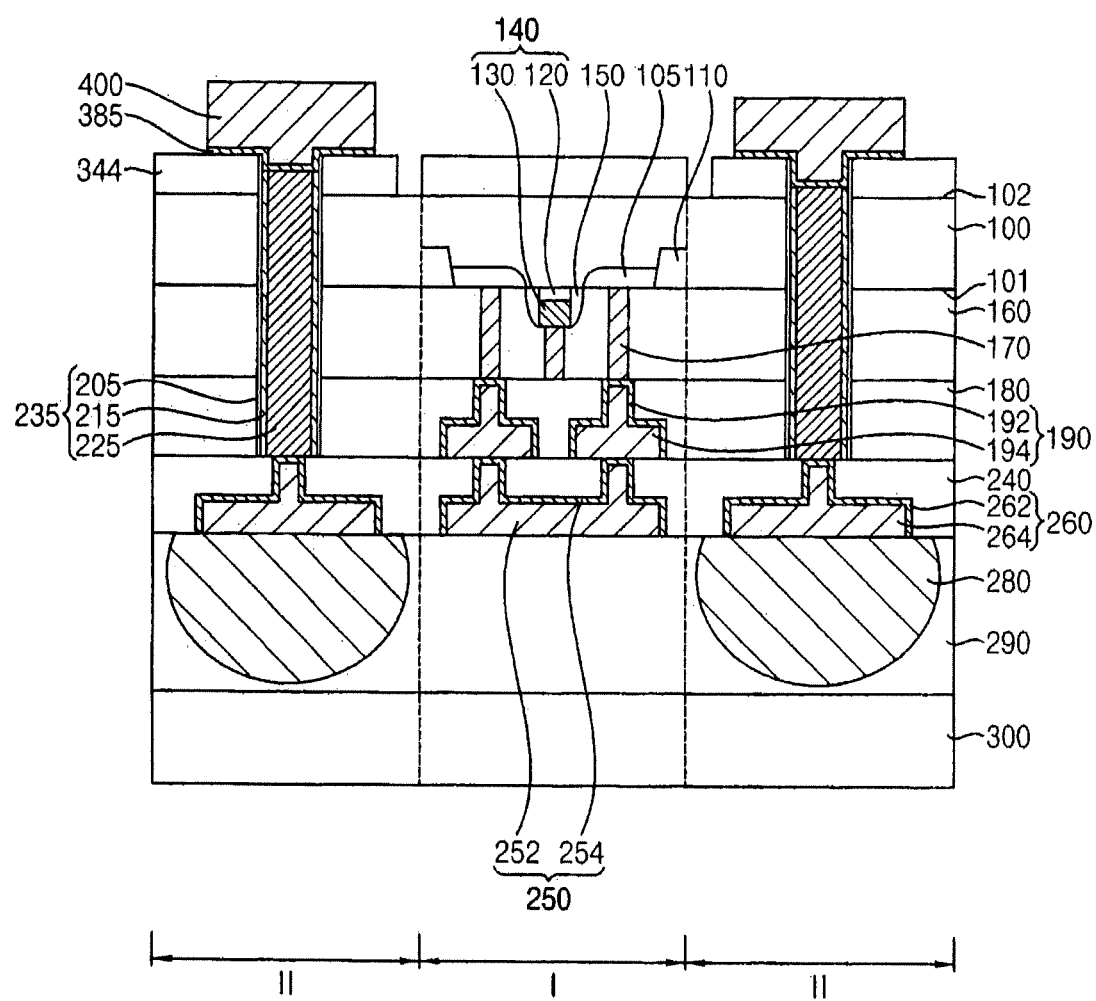
Figure 41A:
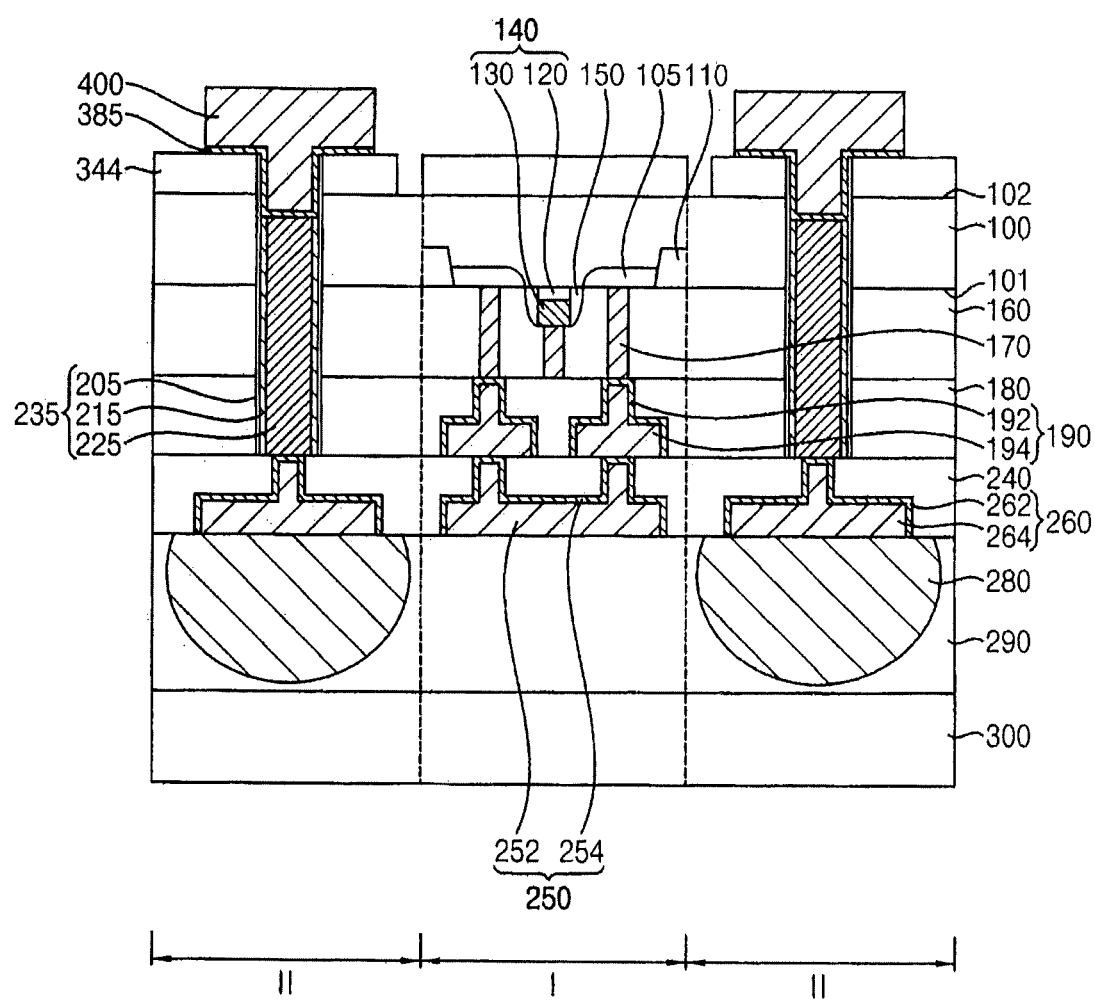
Figure 41B:
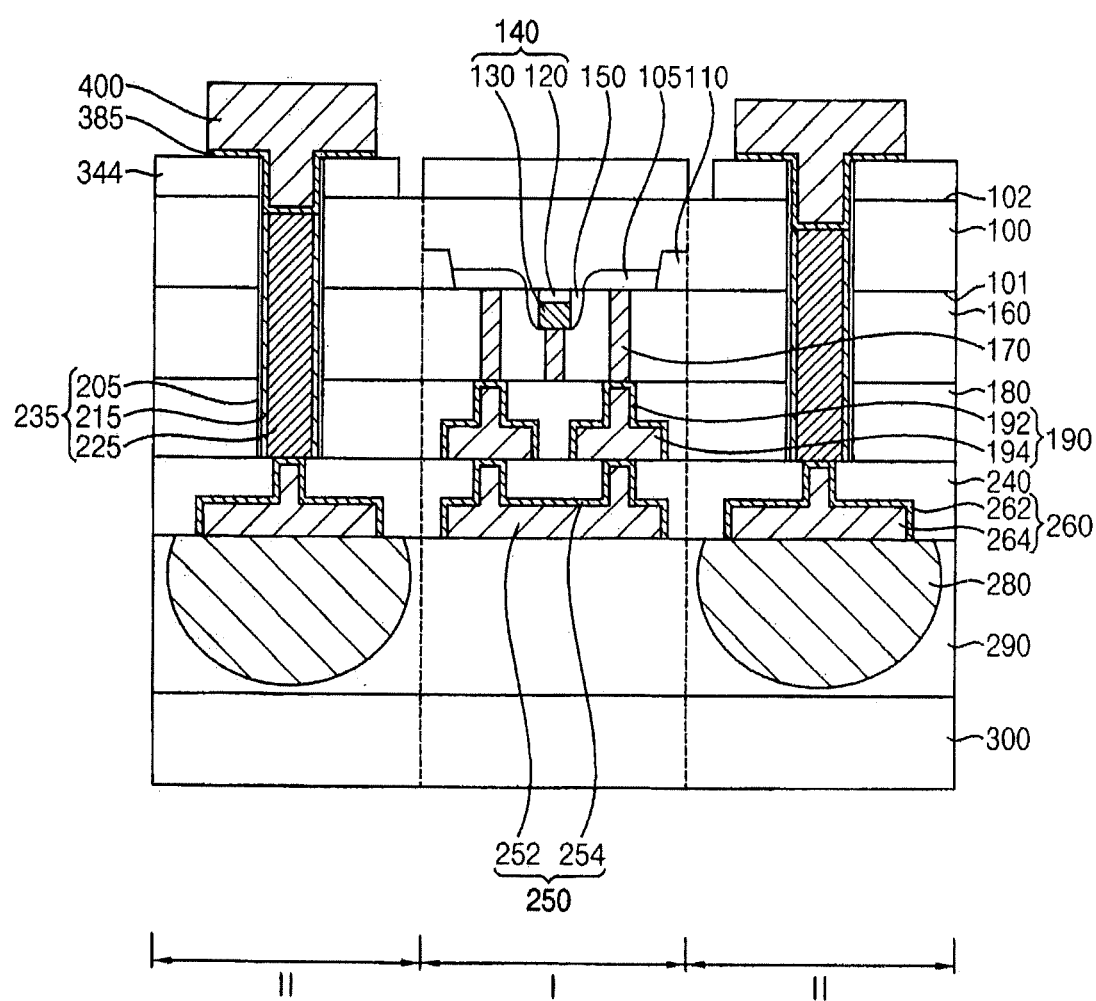
Figure 42A:
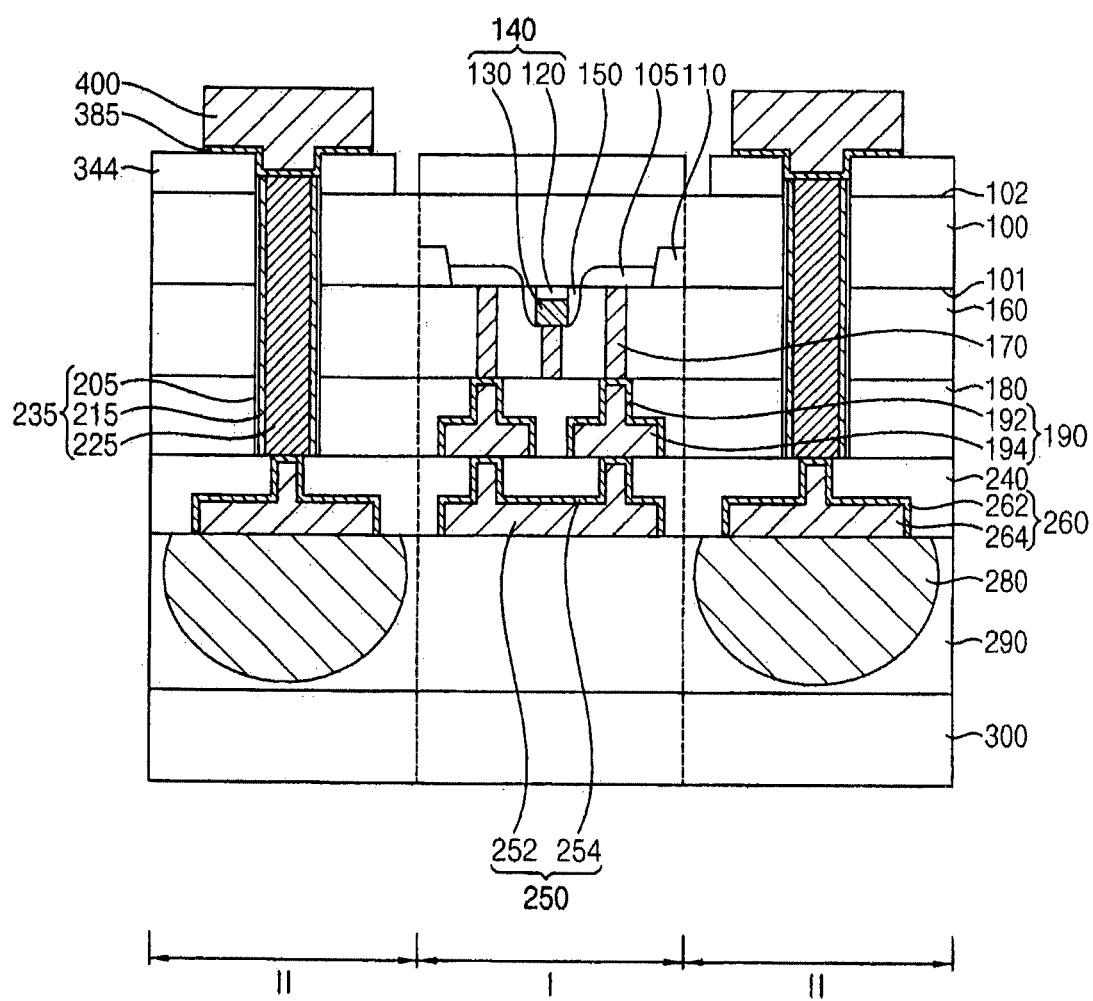
Figure 42B:
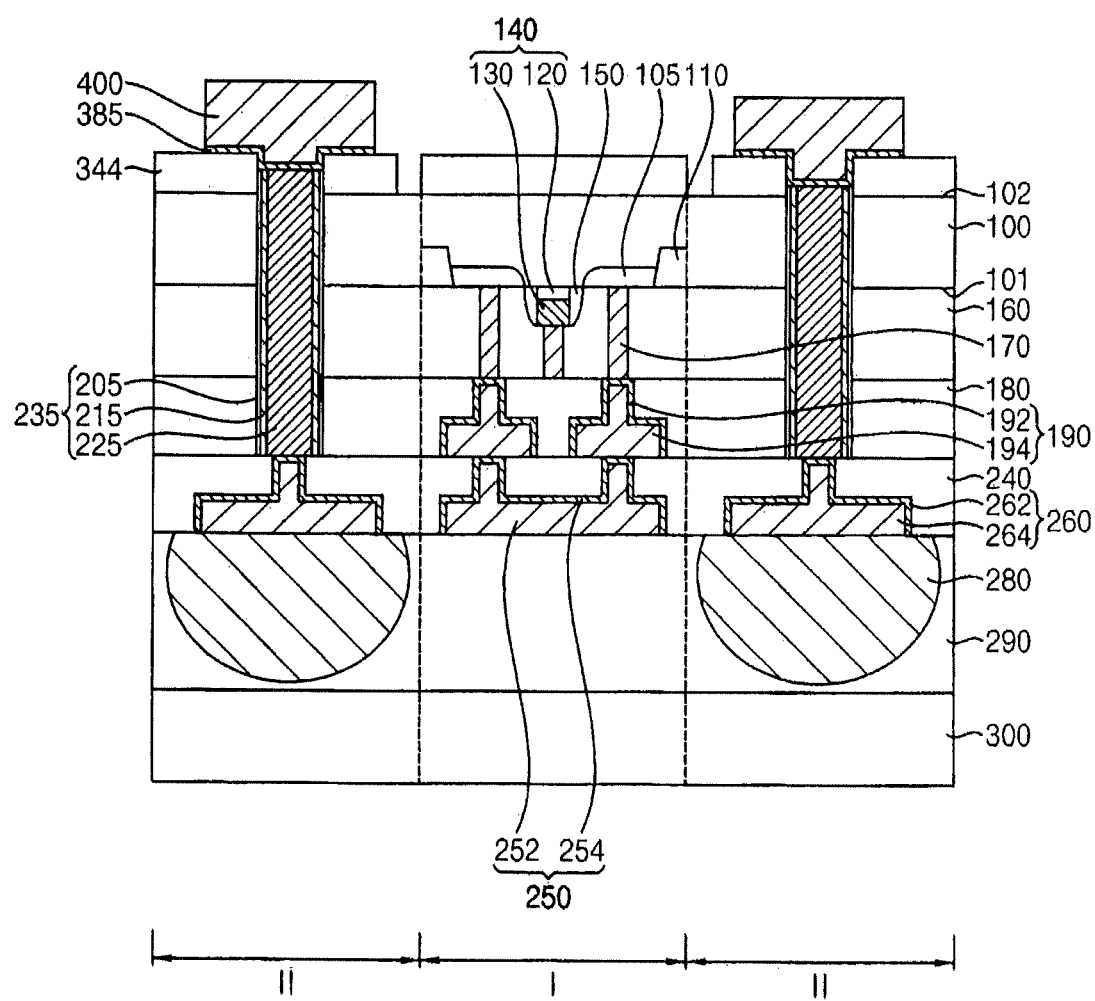
Figure 43A:
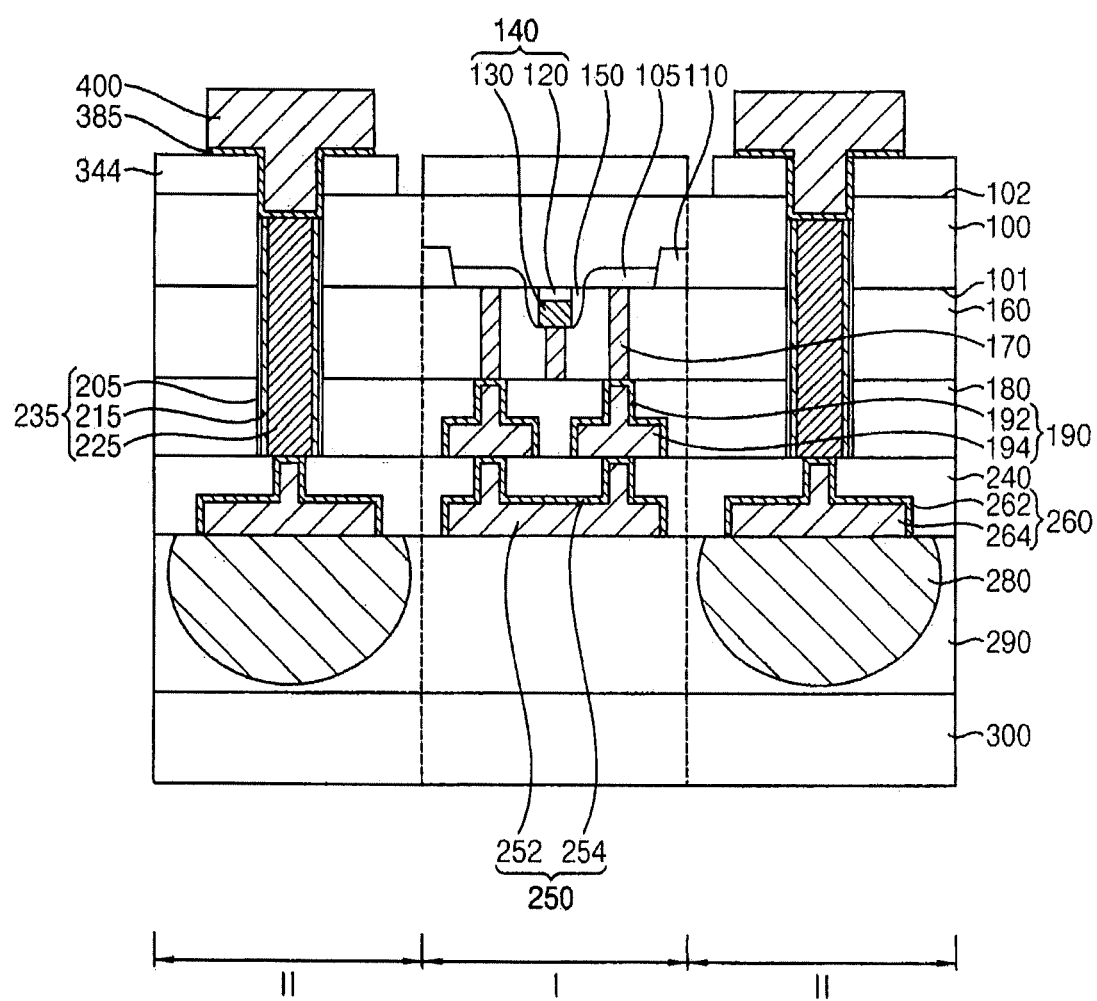
Figure 43B:
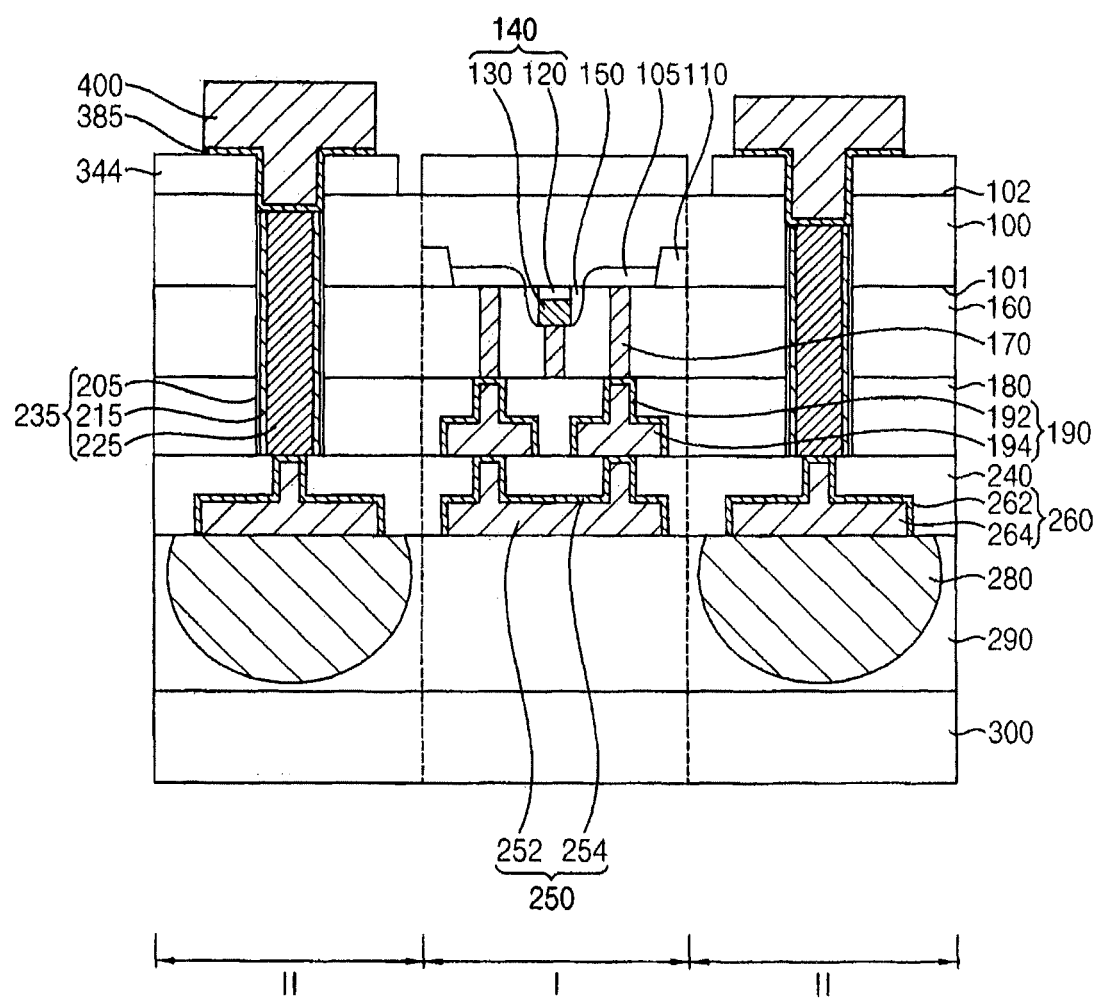

Referring to FIG. 38A, the semiconductor device may include a via structure 235, a protection layer pattern structure 344 and a pad structure.

The via structure 235 may be formed through the first and second insulating interlayers 160 and 180 and a substrate 100, and a portion of the via structure 235 may be exposed above a second surface 102 of the substrate 100. The via structure 235 may have a top surface of which a central portion may be concave (i.e., stepped toward a central portion).

The protection layer pattern structure 344 may be formed on the second surface 102 of the substrate 100, and may surround a sidewall of the exposed portion of the via structure 235. In example embodiments, a top surface of the protection layer pattern structure 344 may be substantially coplanar with a top surface of a peripheral portion of the via structure 235, and may have a height substantially constant regardless of the position thereof.

In example embodiments, the protection layer pattern structure 344 may include a photosensitive organic material. Thus, the protection layer pattern structure 344 may include a thermosetting organic polymer and a photosensitive material. The thermosetting organic polymer may include, e.g., polyimide, novolac, polybenzoxazole, benzocyclobutene, silicon polymer, epoxy polymer, acrylate polymer, etc., and the photosensitive material may include, e.g., a positive photosensitive material.

In example embodiments, as shown in FIG. 38A, the protection layer pattern structure 344 may include a single layer. In other example embodiments, the protection layer pattern structure 344 may include a plurality of layers sequentially stacked, and each layer may include not only the photosensitive organic polymer but also an oxide or a nitride.

The pad structure may have a convex (or protruding) bottom surface corresponding to the concave (or stepped) top surface of the via structure 235, however, may have a flat top surface.

The semiconductor devices of FIGS. 39A, 40A, 41A, 42A and 43A may be substantially the same as those of FIGS. 3A, 26A, 28A, 32A and 34A, respectively, except they may include the protection layer pattern structure 344 shown in FIG. 38A.

FIGS. 38B, 39B, 40B, 41B, 42B and 43B are cross-sectional views illustrating semiconductor devices in accordance with example embodiments. The semiconductor devices may be substantially the same as or similar to those of FIGS. 38A, 39A, 40A, 41A, 42A and 43A, except for the heights of the second conductive pattern and the pad.

Referring to FIGS. 38B, 39B, 40B, 41B, 42B and 43B, each of the semiconductor devices may include a plurality of second conductive patterns 225, and at least some of the second conductive patterns 225 may have top surfaces at different heights, and correspondingly, at least some of the pads 400 may have top surfaces at different heights.

FIGS. 44 to 48 are cross-sectional views illustrating stages of a method of manufacturing a semiconductor device in accordance with example embodiments. This method may include processes substantially the same as or similar to those of the method illustrated with reference to FIGS. 7 to 25.

First, processes substantially the same as or similar to those illustrated with reference to FIGS. 7 to 16 may be performed.

Figure 44:
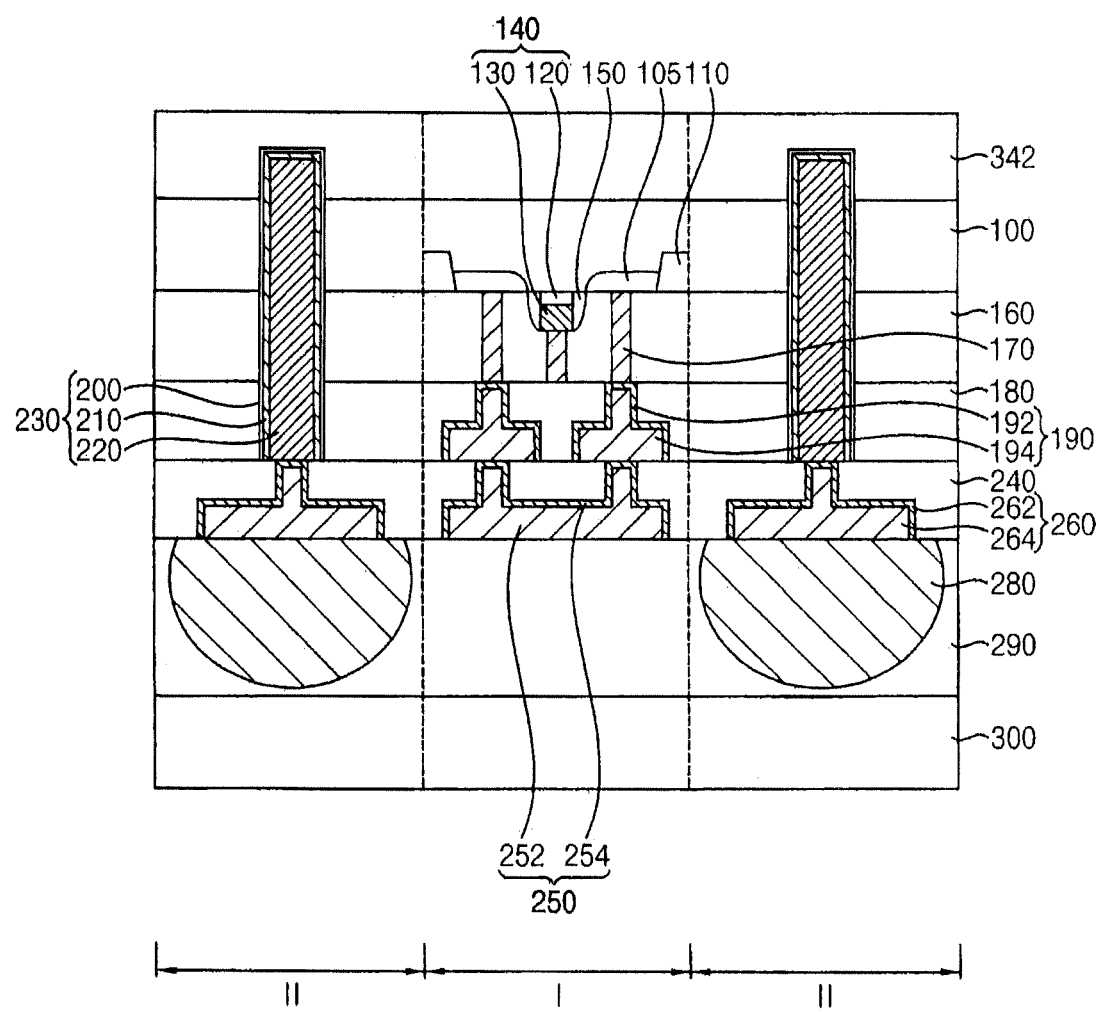

Referring to FIG. 44, a protection layer structure 342 may be formed on the second surface 102 of the substrate 100 and the exposed portion of the preliminary via structure 230.

In example embodiments, the protection layer structure 342 may be formed by dissolving a photosensitive organic insulating material into a solution to form a compound, coating the compound onto the second surface 102 of the substrate 100 by, e.g., a spin-on coating process, and soft-baking the coated compound.

The compound may include a thermosetting organic polymer and a photosensitive material. The thermosetting organic polymer may not be limited to a specific material if it is a thermosetting resin having insulation characteristics. For example, the thermosetting organic polymer may include polyimide, novolac, polybenzoxazole, benzocyclobutene, silicon polymer, epoxy polymer, acrylate polymer, etc. The photosensitive material may include, e.g., a positive photosensitive material.

The compound may further include a cross linking agent, a hardening catalyst, and a photoactid generator (PAG).

Figure 45:
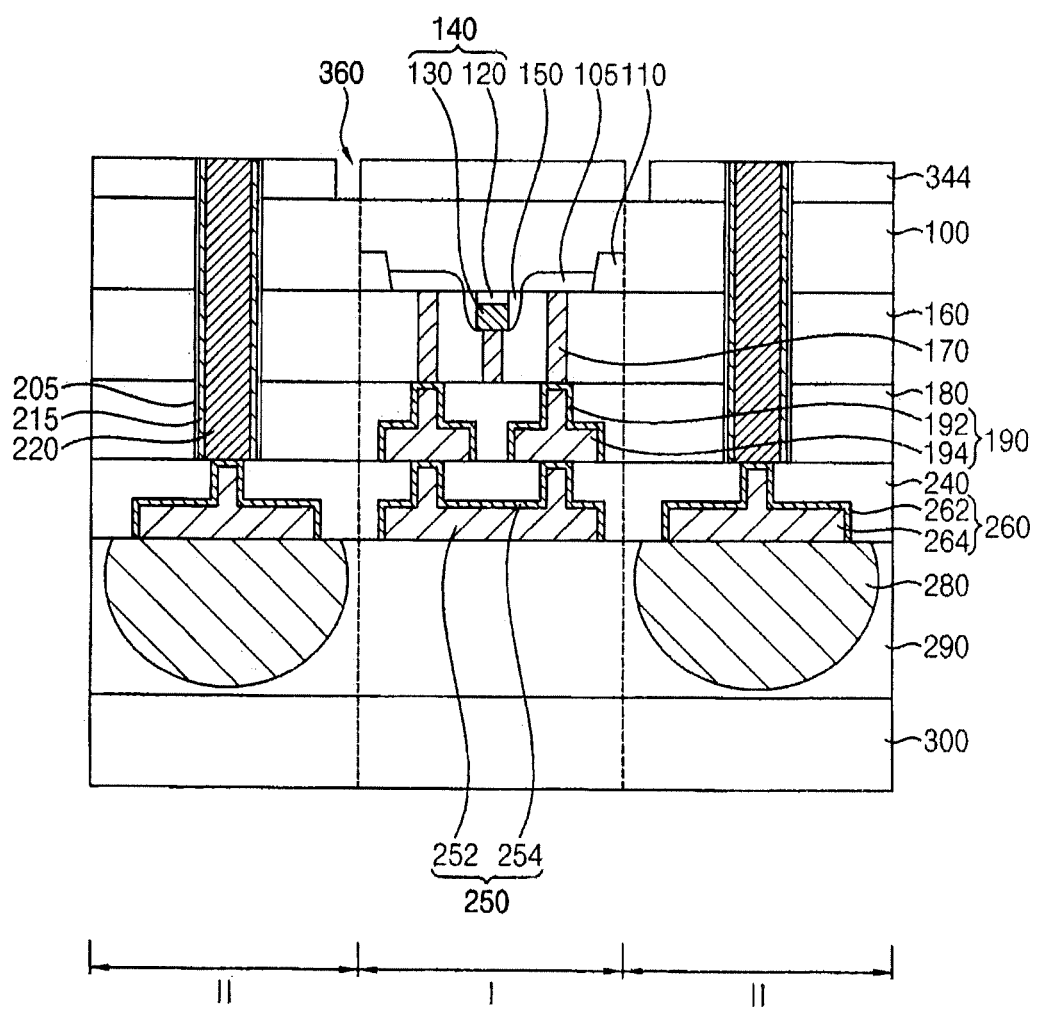

Referring to FIG. 45, an exposure process and a development process may be performed on the protection layer structure 342 to form a first opening 360 for forming an alignment key, and a portion of the protection layer structure 342 on the preliminary via structure 230 may be also etched to expose the preliminary via structure 230.

By the exposure process and the development process, the protection layer structure 342 may be transformed into a protection layer pattern structure 344. After the exposure process and the development process, a portion of the exposed preliminary via structure 230 may be further etched.

In example embodiments, upper portions of the insulation layer 200 and the second barrier layer 210 of the preliminary via structure 230 may be removed to form an insulation layer pattern 205 and a second barrier layer pattern 215, respectively.

In example embodiments, top surfaces of the insulation layer pattern 205, the second barrier layer pattern 215, and the second conductive layer 220 exposed above the second surface 102 of the substrate 100 may be substantially the same as one another, and the protection layer pattern structure 344 may surround sidewalls thereof.

Figure 46:
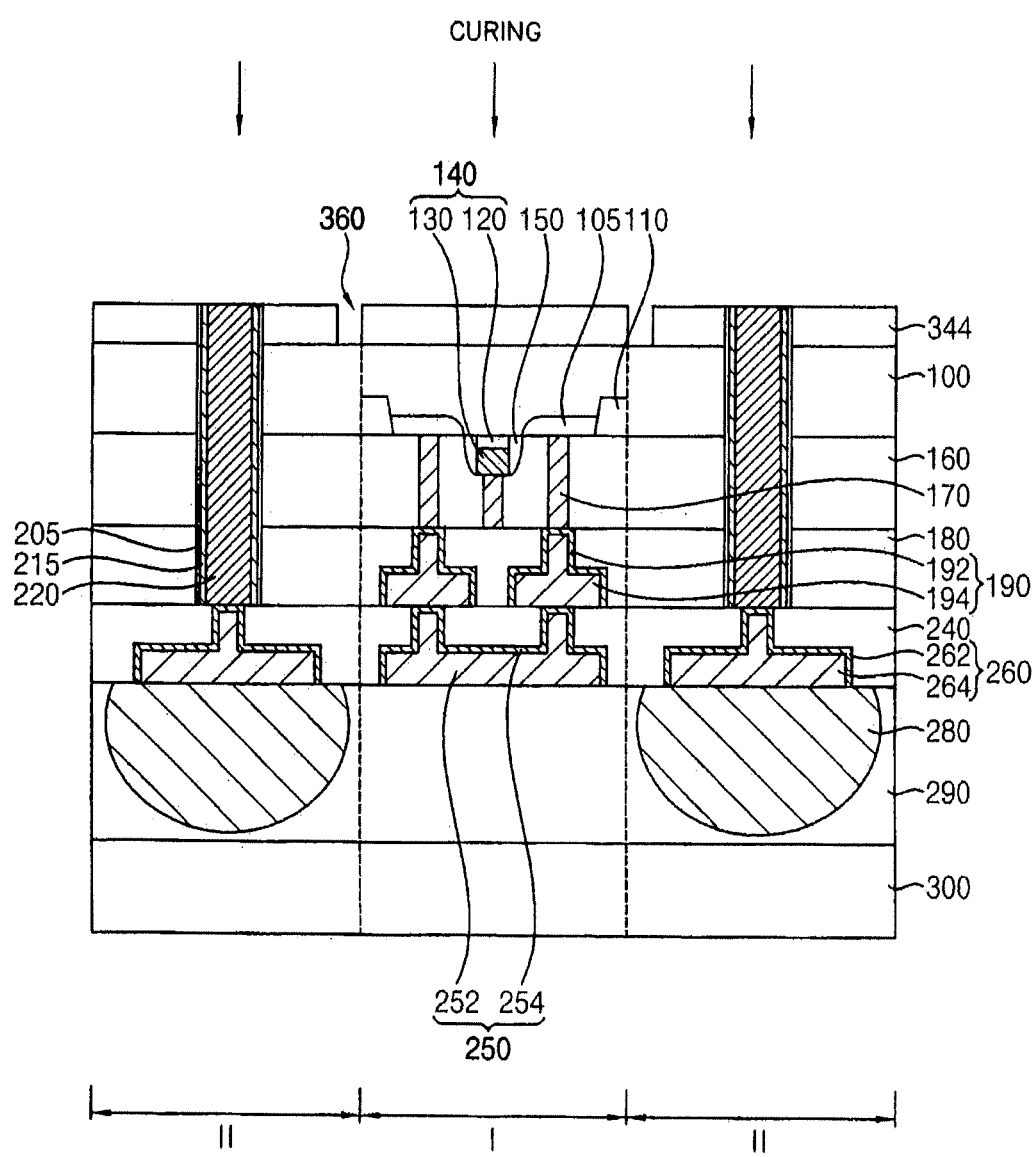

Referring to FIG. 46, the substrate 100 may be heated to harden or cure the protection layer pattern structure 344.

In example embodiments, the protection layer pattern structure 344 may be cured or hardened at a temperature equal to or more than about 100° C. However, the curing temperature may not be limited thereto, and may be changed according to the thermosetting organic polymer of the compound in the protection layer pattern structure 344.

Figure 47:
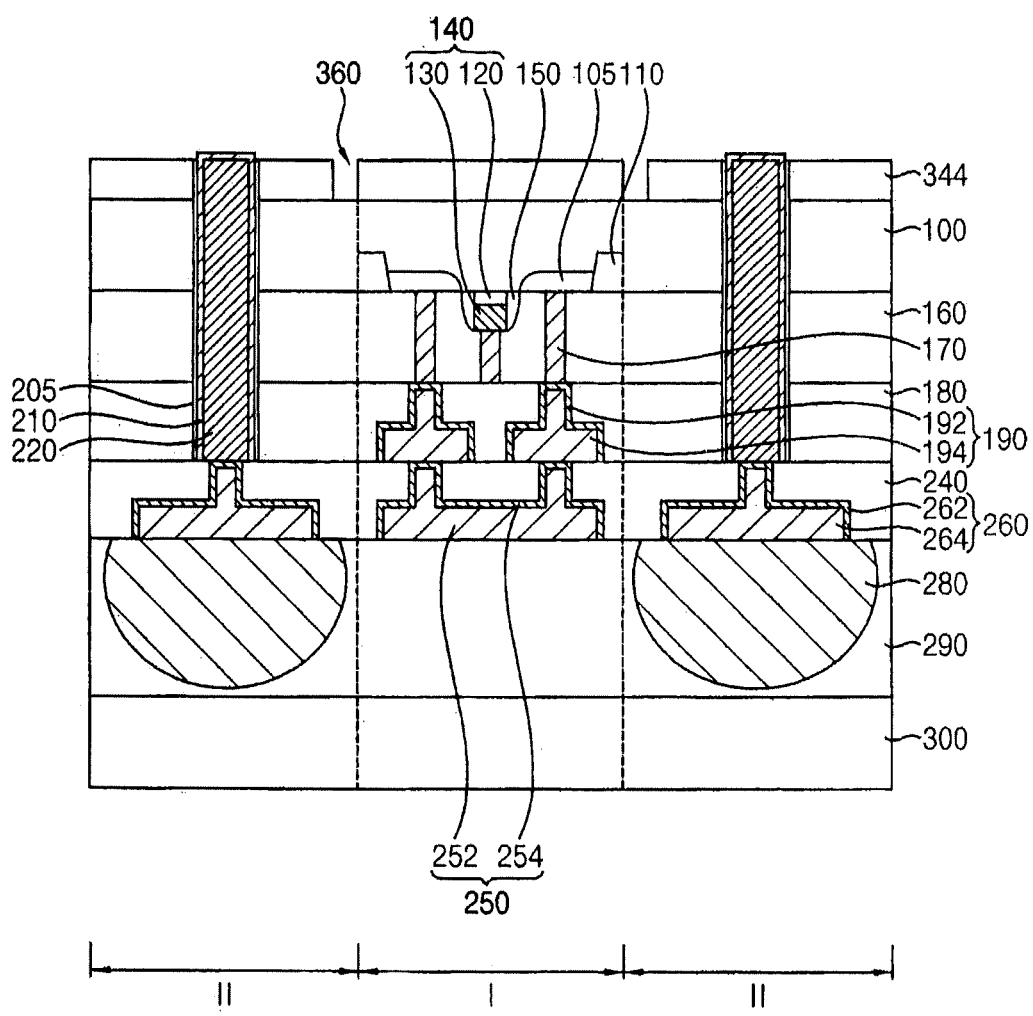
Figure 48:
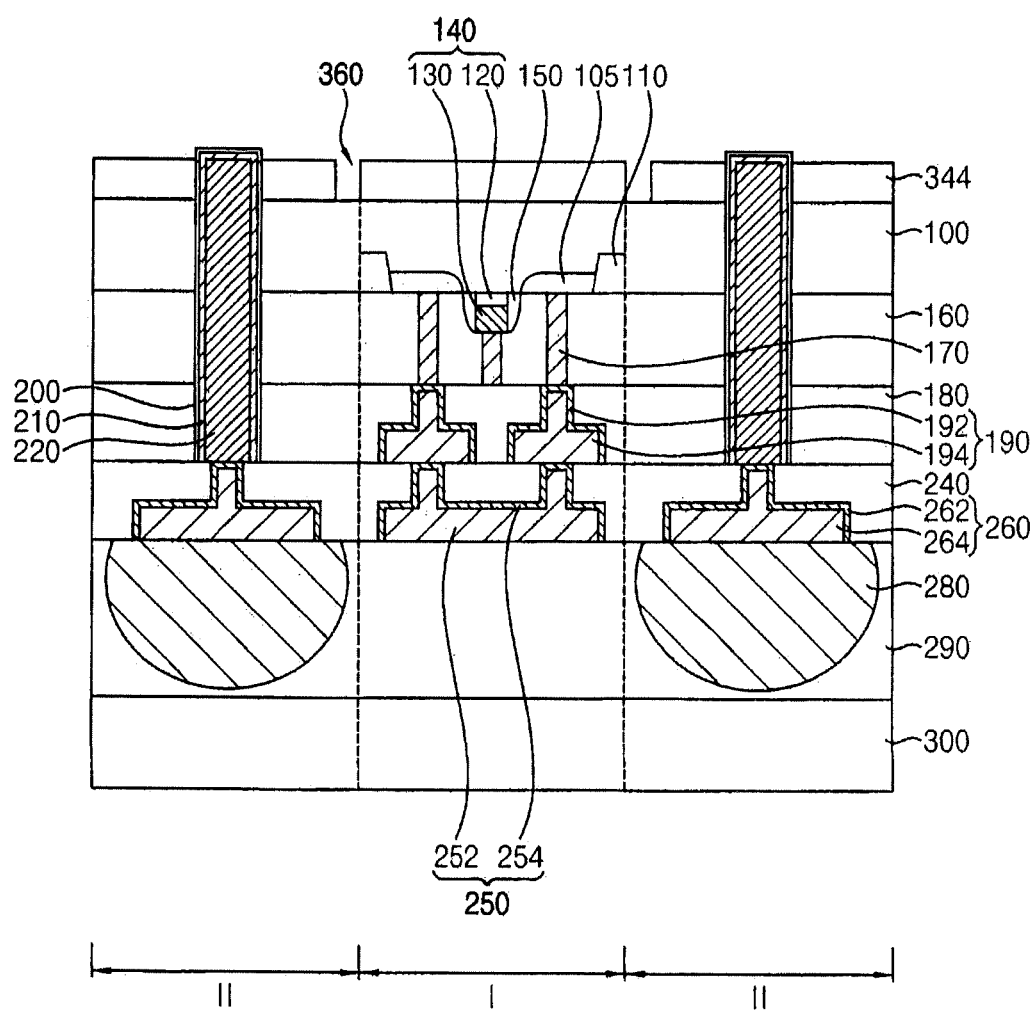

FIG. 47 shows that only an upper portion of the insulation layer 200 of the exposed preliminary via structure 230 may be removed after the exposure process and the development process illustrated with reference to FIG. 45, and FIG. 48 shows that no etching process may be performed on the exposed preliminary via structure 230 after the exposure process and the development process. That is, the exposed preliminary via structure 230 may be partially etched, or may not be etched, after the exposure process and the development process.

Then, processes substantially the same as or similar to those illustrated with reference to FIGS. 18 to 25 may be performed.

Figure 49:
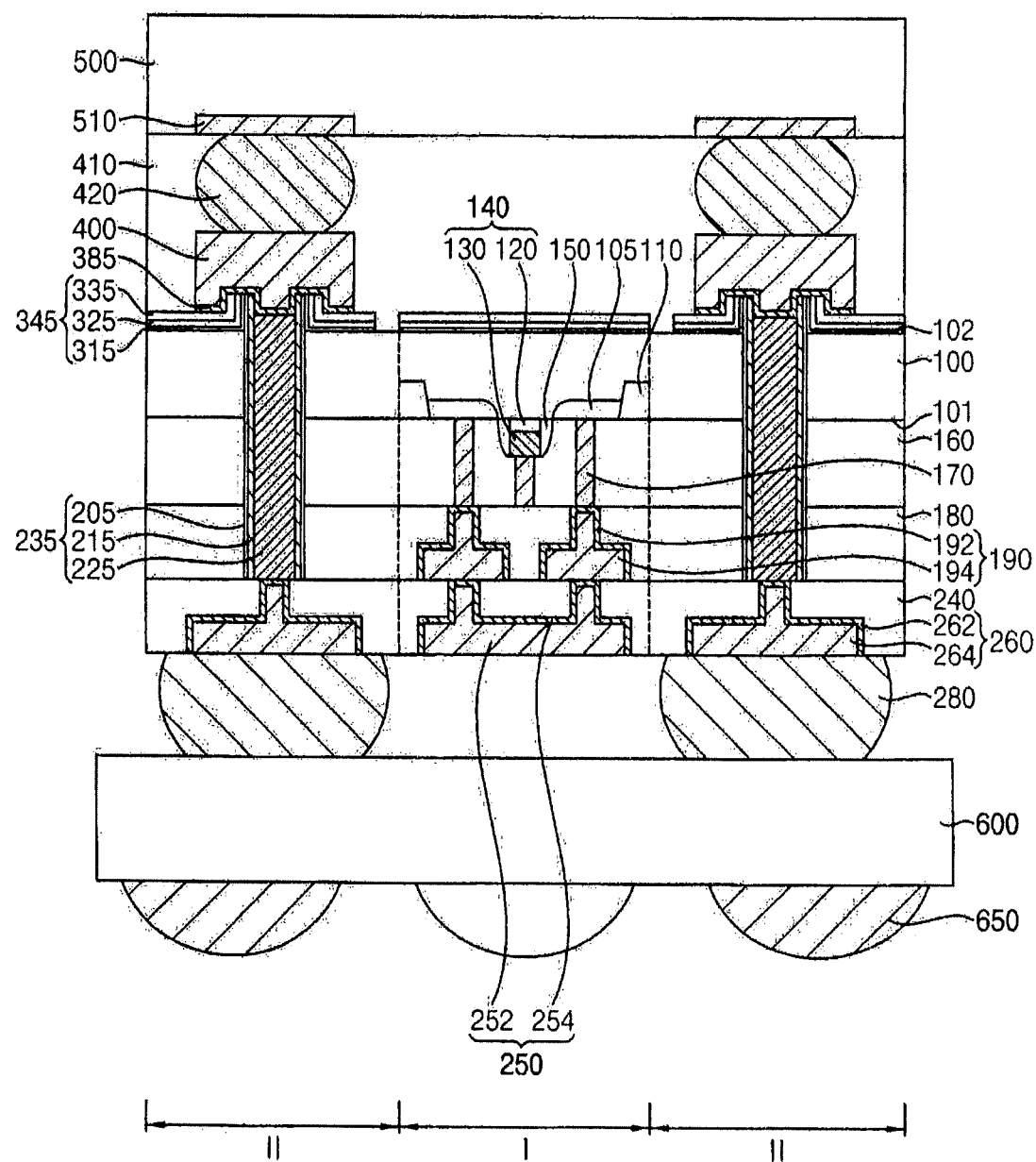
Figure 50:
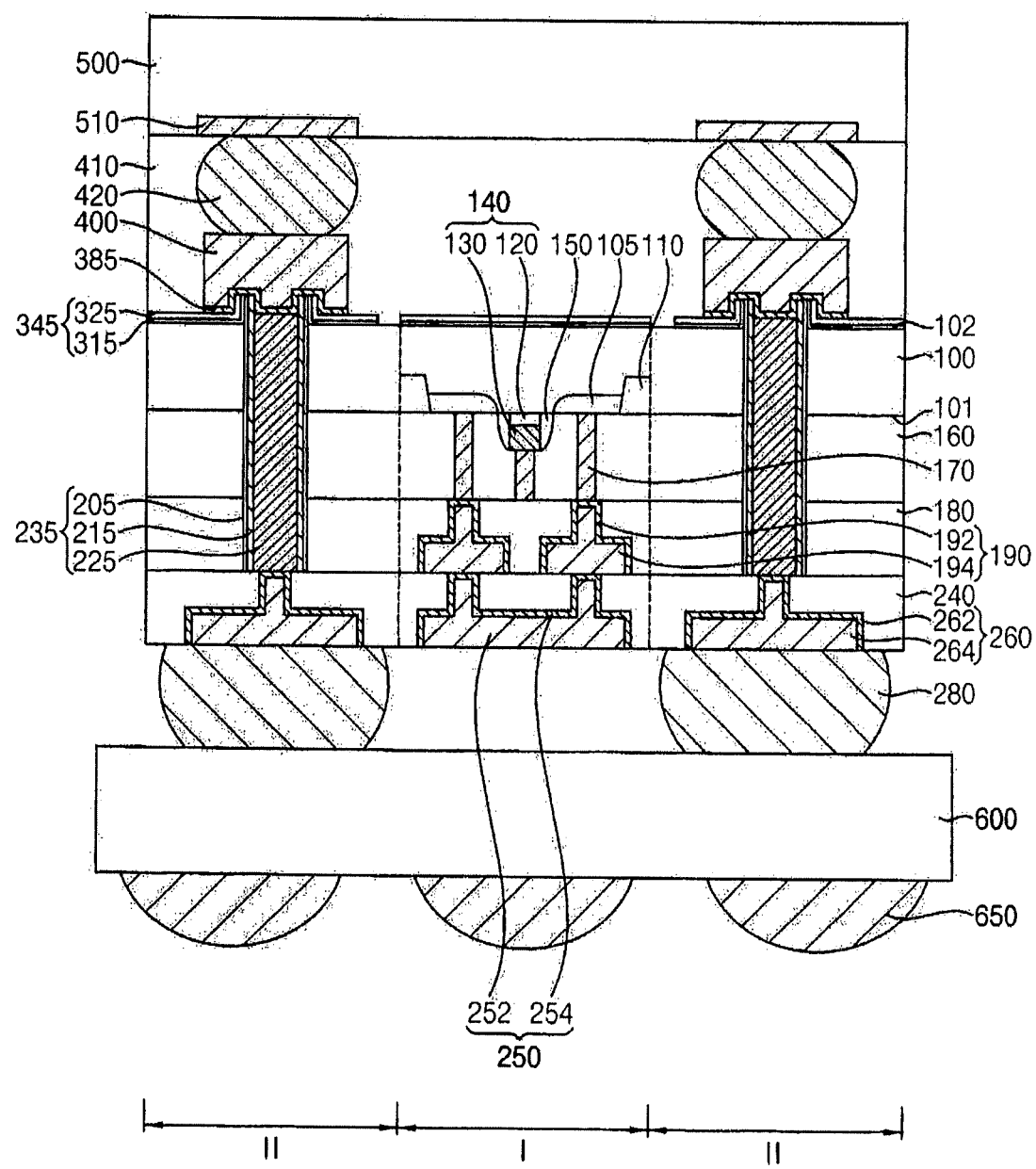
Figure 51:
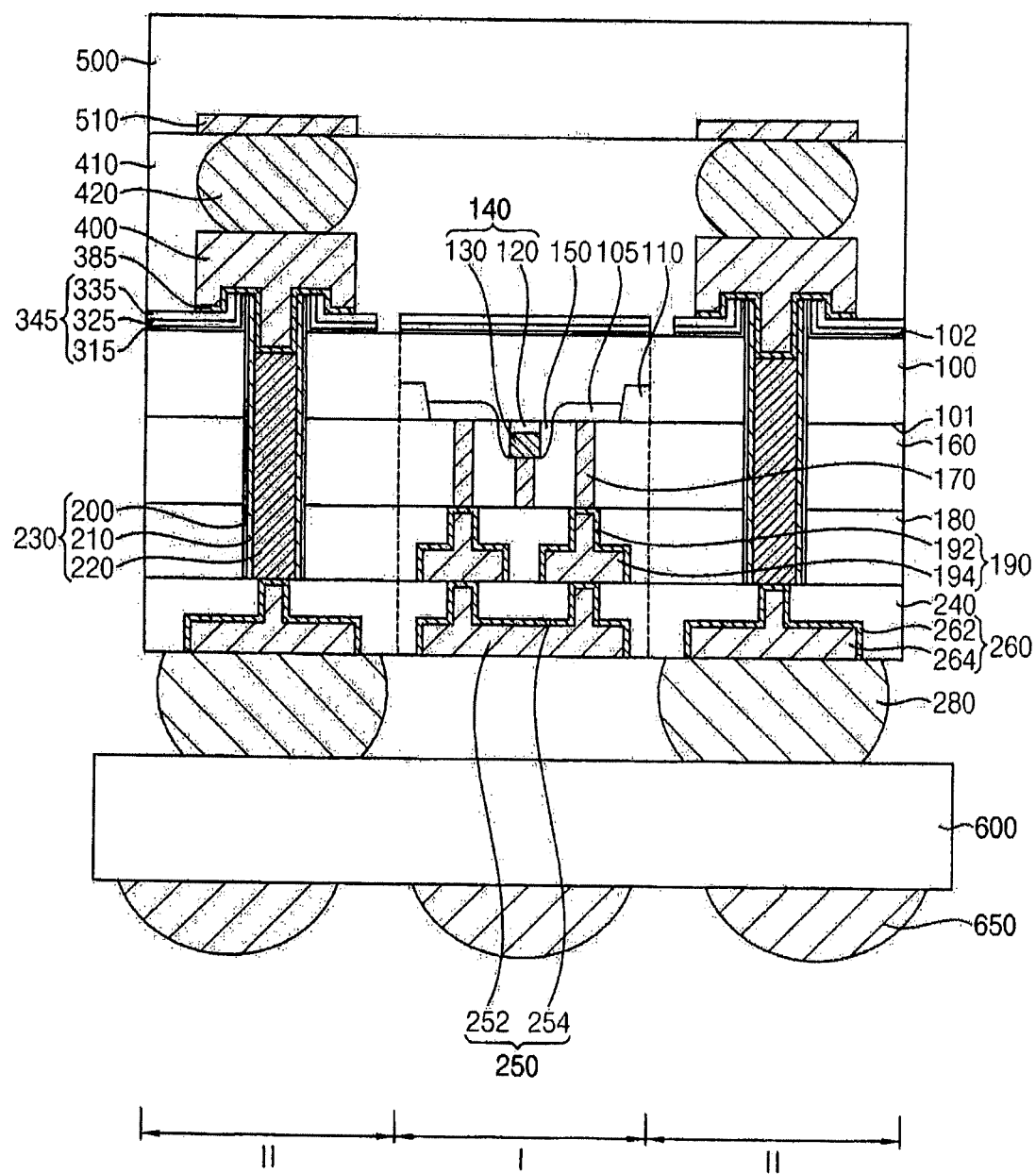

FIGS. 49 to 51 are cross-sectional views illustrating semiconductor packages in accordance with example embodiments. Each of the semiconductor packages may include semiconductor devices illustrated with reference to FIGS. 1 to 6, FIGS. 26 to 28, FIGS. 32 to 34, and FIGS. 38 to 43, however, only the semiconductor packages including the semiconductor devices of FIGS. 1A, 2A and 3A will be illustrated herein. That is, the semiconductor packages of FIGS. 49 to 51 may include first semiconductor chips containing the semiconductor devices of FIGS. 1A, 2A and 3A, respectively.

Referring to FIG. 49, the semiconductor package may include first and second semiconductor chips sequentially stacked on a package substrate 600. The semiconductor package may further include first and second conductive bumps 280 and 420, a molding member 410, and an external connection terminal 650.

The package substrate 600 may be an insulation substrate on which circuit patterns may be formed, e.g., a printed circuit board (PCB). The external connection terminal 650 may be formed beneath the package substrate 600, and thus the semiconductor package may be configured to mount on a module substrate via the external connection terminal 650.

The first semiconductor chip may be mounted on the package substrate 600 via the first conductive bump 280, and may have a structure substantially the same as or similar to that of the semiconductor device of FIG. 1A.

In an example embodiment, the first semiconductor chip may be a chip having logic devices, e.g., a central processing unit (CPU), an application processor (AP), etc.

The second semiconductor chip may include an upper substrate 500 having a conductive pad 510 at a lower portion thereof, and various types of circuit elements may be formed on the upper substrate 500. In an example embodiment, the second semiconductor chip may be a chip having a dynamic random access memory (DRAM) device, a static random access memory (SRAM) device, a flash memory device, etc.

The first and second semiconductor chips may be electrically connected to each other via a pad structure, the second conductive bump 420, and the conductive pad 510, and the molding member 410 may be formed between the first and second semiconductor chips. The molding member 410 may include, e.g., epoxy molding compound (EMC).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures.

What is claimed is:

1. A semiconductor device, comprising:
   a via structure through a substrate, a portion of the via structure exposed above a top surface of the substrate, and the via structure having a top surface of which a central portion is concave and including:
      a via electrode including a conductive pattern and a barrier layer pattern surrounding a sidewall of the conductive pattern; and
      an insulation layer pattern surrounding a sidewall of the via electrode,
   wherein a top surface of the conductive pattern is lower than that of the insulation layer pattern and is flat,
   a protection layer pattern structure on the top surface of the substrate, the protection layer pattern structure surrounding a sidewall of the portion of the via structure that is exposed; and
   a pad structure contacting a top surface of the portion of the via structure that is exposed, the pad structure having a flat top surface,
   wherein the top surface of the conductive pattern is lower than those of both of the barrier layer pattern and the insulation layer pattern,
   wherein upper portions of each of the barrier layer pattern and the insulation layer pattern above the conductive pattern have a width that decreases from a bottom toward a top thereof, and
   wherein the top surface of the conductive pattern is lower than that of the substrate.

2. A semiconductor device, comprising:
   a via structure through a substrate, a portion of the via structure exposed above a top surface of the substrate, and the via structure having a top surface of which a central portion is concave and including:
      a via electrode including a conductive pattern and a barrier layer pattern surrounding a sidewall of the conductive pattern; and
      an insulation layer pattern surrounding a sidewall of the via electrode,
   wherein a top surface of the conductive pattern is lower than that of the insulation layer pattern and is flat,
   a protection layer pattern structure on the top surface of the substrate, the protection layer pattern structure surrounding a sidewall of the portion of the via structure that is exposed; and
   a pad structure contacting a top surface of the portion of the via structure that is exposed, the pad structure having a flat top surface,
   wherein the top surface of the conductive pattern is lower than those of both of the barrier layer pattern and the insulation layer pattern,
   wherein upper portions of each of the barrier layer pattern and the insulation layer pattern above the conductive pattern have a width that decreases from a bottom toward a top thereof, and
   wherein the semiconductor device includes a plurality of via structures and a plurality of pad structures, and wherein some conductive patterns in the via structures have respective top surfaces at different heights.

3. The semiconductor device of claim 2, wherein some pad structures have respective top surfaces at different heights.

4. A semiconductor device, comprising:
   a via structure through a substrate, a portion of the via structure exposed above a top surface of the substrate, and the via structure having a top surface of which a central portion is concave and including:
      a via electrode including a conductive pattern and a barrier layer pattern surrounding a sidewall of the conductive pattern; and
      an insulation layer pattern surrounding a sidewall of the via electrode,
   wherein a top surface of the conductive pattern is lower than that of the insulation layer pattern and is flat,
   a protection layer pattern structure on the top surface of the substrate, the protection layer pattern structure surrounding a sidewall of the portion of the via structure that is exposed; and
   a pad structure contacting a top surface of the portion of the via structure that is exposed, the pad structure having a flat top surface,
   wherein the top surface of the conductive pattern is lower than those of both of the barrier layer pattern and the insulation layer pattern, and
   wherein upper portions of each of the barrier layer pattern and the insulation layer pattern above the conductive pattern have a width that decreases from a bottom toward a top thereof, and
   wherein the pad structure has a bottom surface of which a central portion is convex, and conforms to a contour of the top surface of the via structure.

5. The semiconductor device of claim 4, wherein a top surface of the barrier layer pattern is lower than that of the insulation layer pattern.

6. The semiconductor device of claim 4, wherein the top surface of the conductive pattern is lower than that of the substrate.

7. The semiconductor device of claim 4, wherein the conductive pattern includes a metal, the barrier layer pattern includes a metal nitride, and the insulation layer pattern includes silicon nitride.

8. The semiconductor device of claim 4, wherein the protection layer pattern structure includes a thermosetting organic polymer.

9. The semiconductor device of claim 8, wherein the thermosetting organic polymer comprises any one selected from the group consisting of polyimide, novolac, polybenzoxazole, benzocyclobutene, silicon polymer, epoxy polymer and acrylate polymer.

10. The semiconductor device of claim 4, wherein the pad structure includes a seed pattern thereon.

11. The semiconductor device of claim 10, wherein the pad structure includes nickel.

12. The semiconductor device of claim 4, wherein the pad structure contacts the via structure and the protection layer pattern structure.

13. The semiconductor device of claim 12, wherein the contour is defined by variation in respective heights of the top surface of the via structure and a top surface of the protection layer pattern structure.

14. The semiconductor device of claim 4, wherein the semiconductor device includes a plurality of via structures and a plurality of pad structures, and wherein some conductive patterns in the via structures have respective top surfaces at different heights.

15. The semiconductor device of claim 14, wherein some pad structures have respective top surfaces at different heights.

* * * * *